United States Patent
Lin et al.

(10) Patent No.: US 12,051,753 B2
(45) Date of Patent: Jul. 30, 2024

(54) FIN FIELD-EFFECT TRANSISTOR DEVICE HAVING HYBRID WORK FUNCTION LAYER STACK

(71) Applicant: Taiwan Semiconductor Manufacturing Co., Ltd., Hsinchu (TW)

(72) Inventors: Chun-Neng Lin, Hsinchu County (TW); Ming-Hsi Yeh, Hsinchu (TW); Hung-Chin Chung, Pingzhen (TW); Hsin-Yun Hsu, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/852,755

(22) Filed: Jun. 29, 2022

(65) Prior Publication Data

US 2022/0328683 A1 Oct. 13, 2022

Related U.S. Application Data

(62) Division of application No. 16/528,031, filed on Jul. 31, 2019, now Pat. No. 11,380,793.

(51) Int. Cl.
*H01L 29/78* (2006.01)
*H01L 21/8238* (2006.01)
*H01L 27/092* (2006.01)
*H01L 29/66* (2006.01)

(52) U.S. Cl.
CPC .... *H01L 29/785* (2013.01); *H01L 21/823821* (2013.01); *H01L 27/0924* (2013.01); *H01L 29/66545* (2013.01); *H01L 29/66795* (2013.01)

(58) Field of Classification Search
CPC ............ H01L 29/785; H01L 29/66545; H01L 29/66795; H01L 21/823821; H01L 27/0924
USPC ......................................................... 257/288
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |

(Continued)

FOREIGN PATENT DOCUMENTS

| KR | 20160098195 A | 8/2016 |
|---|---|---|
| KR | 20180062331 A | 6/2018 |

*Primary Examiner* — Matthew E. Gordon
(74) *Attorney, Agent, or Firm* — Slater Matsil, LLP

(57) ABSTRACT

A semiconductor device includes a first fin, a second fin, and a third fin protruding above a substrate, where the third fin is between the first fin and the second fin; a gate dielectric layer over the first fin, the second fin, and the third fin; a first work function layer over and contacting the gate dielectric layer, where the first work function layer extends along first sidewalls and a first upper surface of the first fin; a second work function layer over and contacting the gate dielectric layer, where the second work function layer extends along second sidewalls and a second upper surface of the second fin, where the first work function layer and the second work function layer comprise different materials; and a first gate electrode over the first fin, a second gate electrode over the second fin, and a third gate electrode over the third fin.

20 Claims, 58 Drawing Sheets

(56) References Cited

U.S. PATENT DOCUMENTS

| | | |
|---|---|---|
| 2011/0291166 A1 | 12/2011 | Booth, Jr. et al. |
| 2013/0241003 A1 | 9/2013 | Lin et al. |
| 2014/0282326 A1 | 9/2014 | Chen et al. |
| 2015/0008533 A1* | 1/2015 | Liaw .................. H10B 10/12 |
| | | 257/392 |
| 2015/0126023 A1* | 5/2015 | Choi .................. H01L 29/512 |
| | | 438/591 |
| 2016/0181429 A1 | 6/2016 | Colinge et al. |
| 2016/0351568 A1 | 12/2016 | Chang et al. |
| 2017/0365602 A1* | 12/2017 | Zhou ................ H01L 29/66681 |
| 2018/0151562 A1 | 5/2018 | Kundu et al. |
| 2018/0226300 A1 | 8/2018 | Song et al. |
| 2018/0261514 A1 | 9/2018 | Xie et al. |
| 2018/0286760 A1 | 10/2018 | Guo et al. |
| 2019/0189767 A1 | 6/2019 | Song et al. |
| 2020/0118888 A1* | 4/2020 | Bao .................. H01L 21/28088 |

* cited by examiner

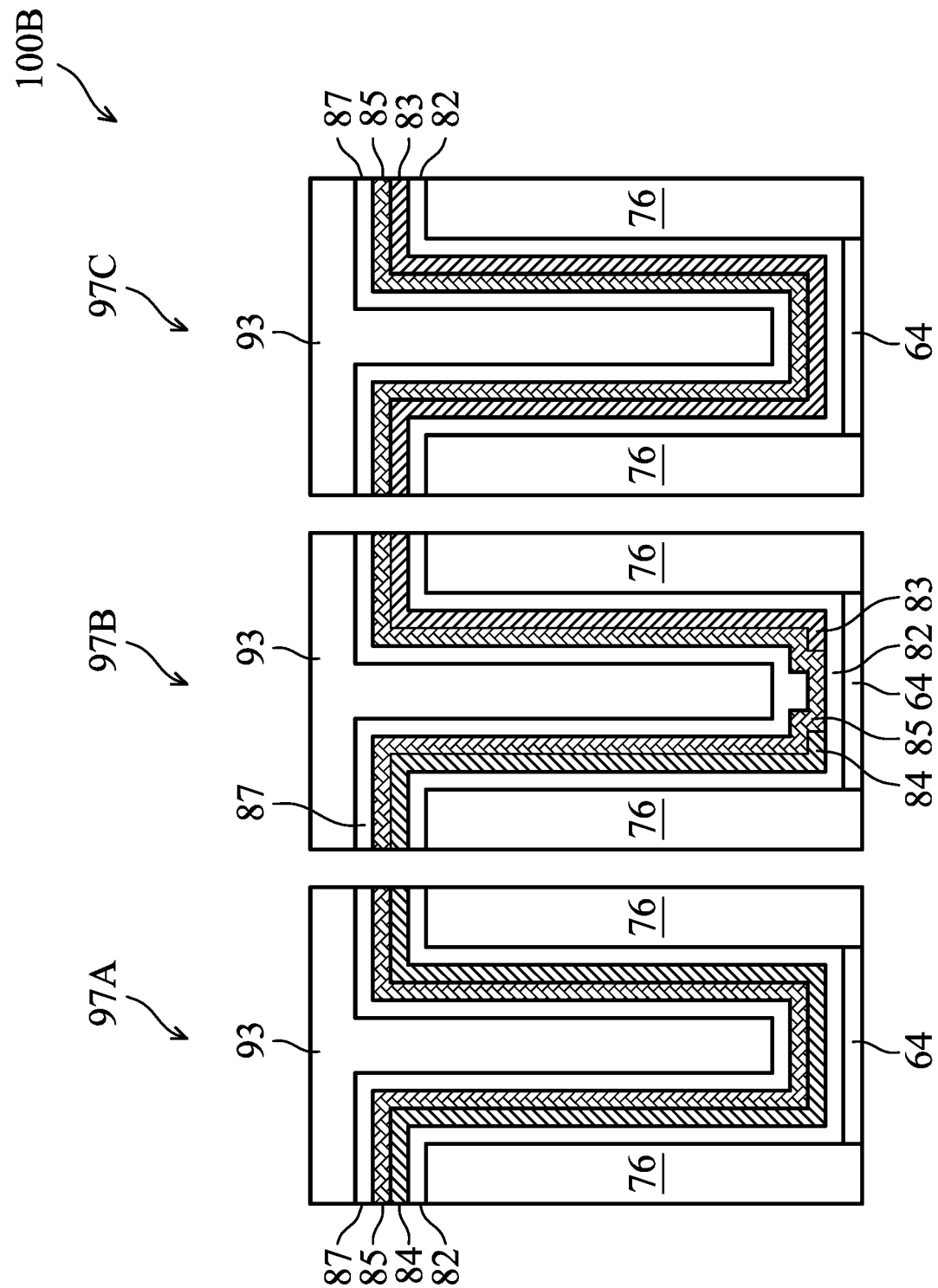

FIN FIELD-EFFECT TRANSISTOR DEVICE HAVING HYBRID WORK FUNCTION LAYER STACK

PRIORITY CLAIM AND CROSS-REFERENCE

This application is a divisional of U.S. patent application Ser. No. 16/528,031, entitled "Fin Field-Effect Transistor Device Having Hybrid Work Function Layer Stack," filed on Jul. 31, 2019, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 26A and 26B illustrate cross-sectional views of a semiconductor device at a stage of fabrication, in an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference number in different figures refers to the same or similar component formed by a same or similar formation method(s) using a same or similar material(s).

Embodiments of the present disclosure are discussed in the context of forming a FinFET device, and in particular, in the context of forming work function layers of a FinFET device. Although the disclosed embodiments are discussed using FinFET devices as examples, the disclosed method may also be used in other types of devices, such as planar devices.

Embodiments of the present disclosure include methods to form different work function layer stacks in different transistors of a FinFET device. Selective wet etch processes are used to remove target materials (e.g., work function metals) without attacking other materials. The selective wet etch processes and the disclosed deposition processes allow for great flexibility in forming and tuning the work function layers of each individual transistor in a FinFET device. In addition, the hybrid work function layer stack allows for increased flexibility in the structure of the work function layers of the transistors. For example, the disclosed methods allow the formation of three different work function layers using two different work function materials.

Figure 1:
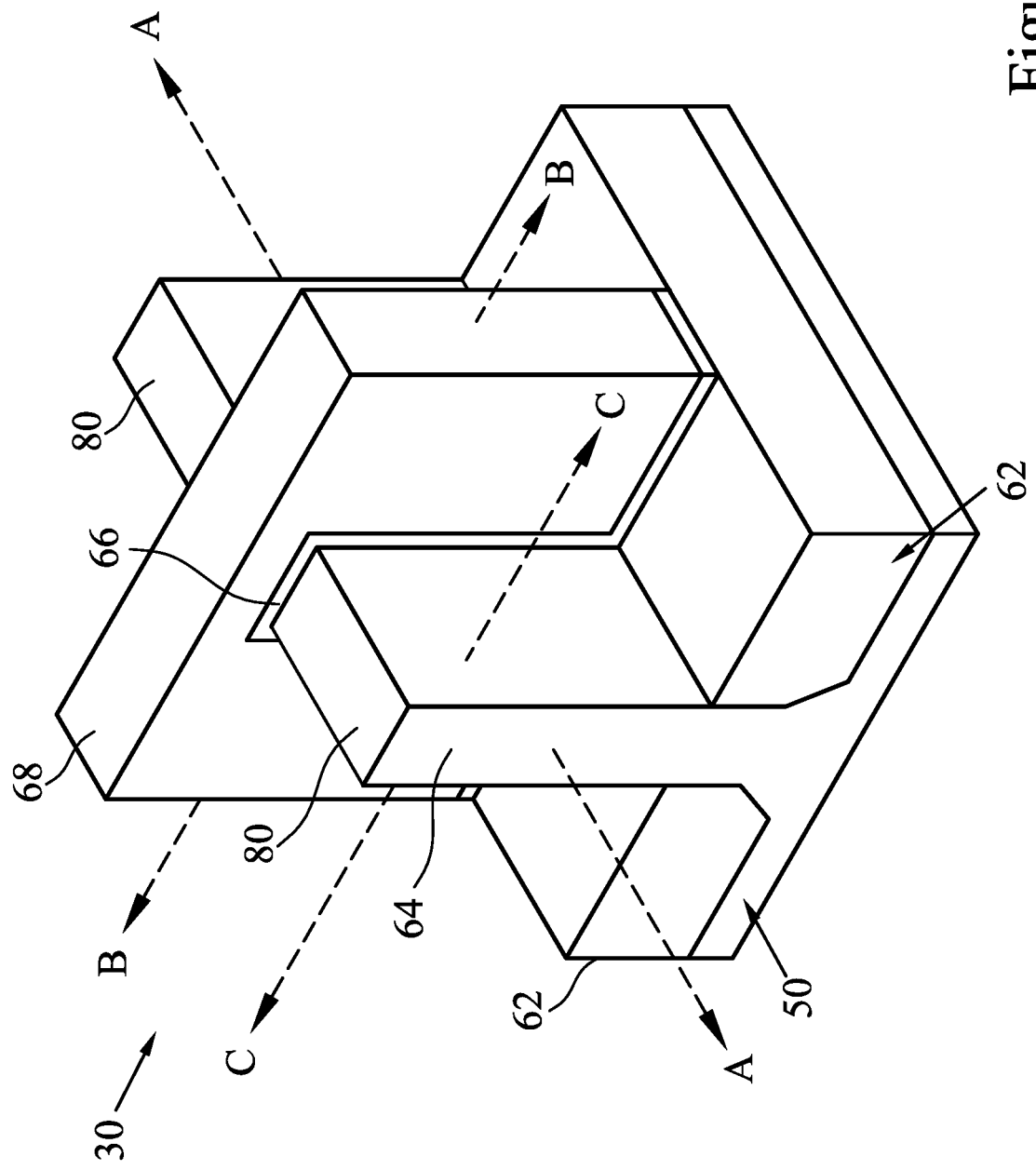
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

Figure 5:
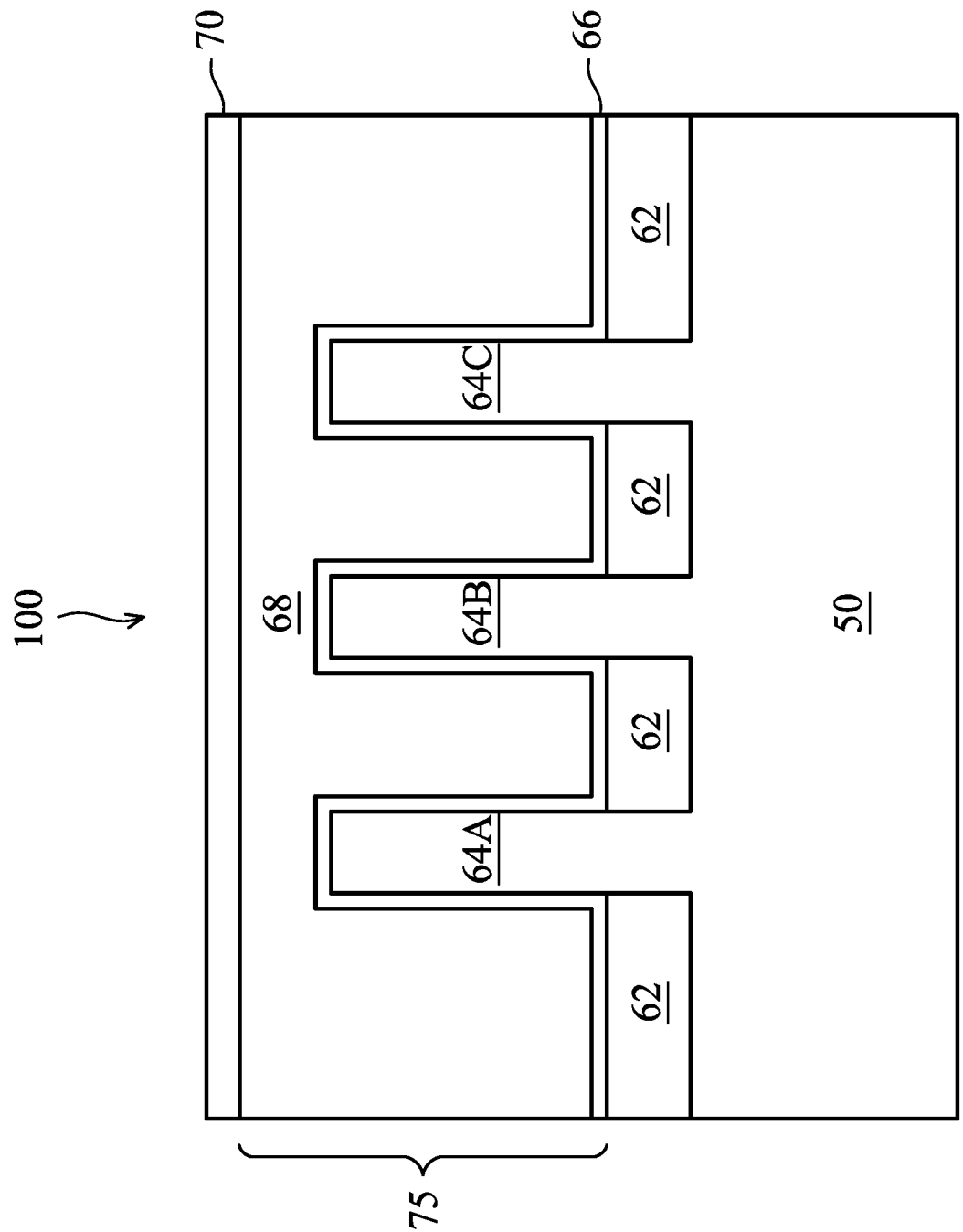
Figure 6:
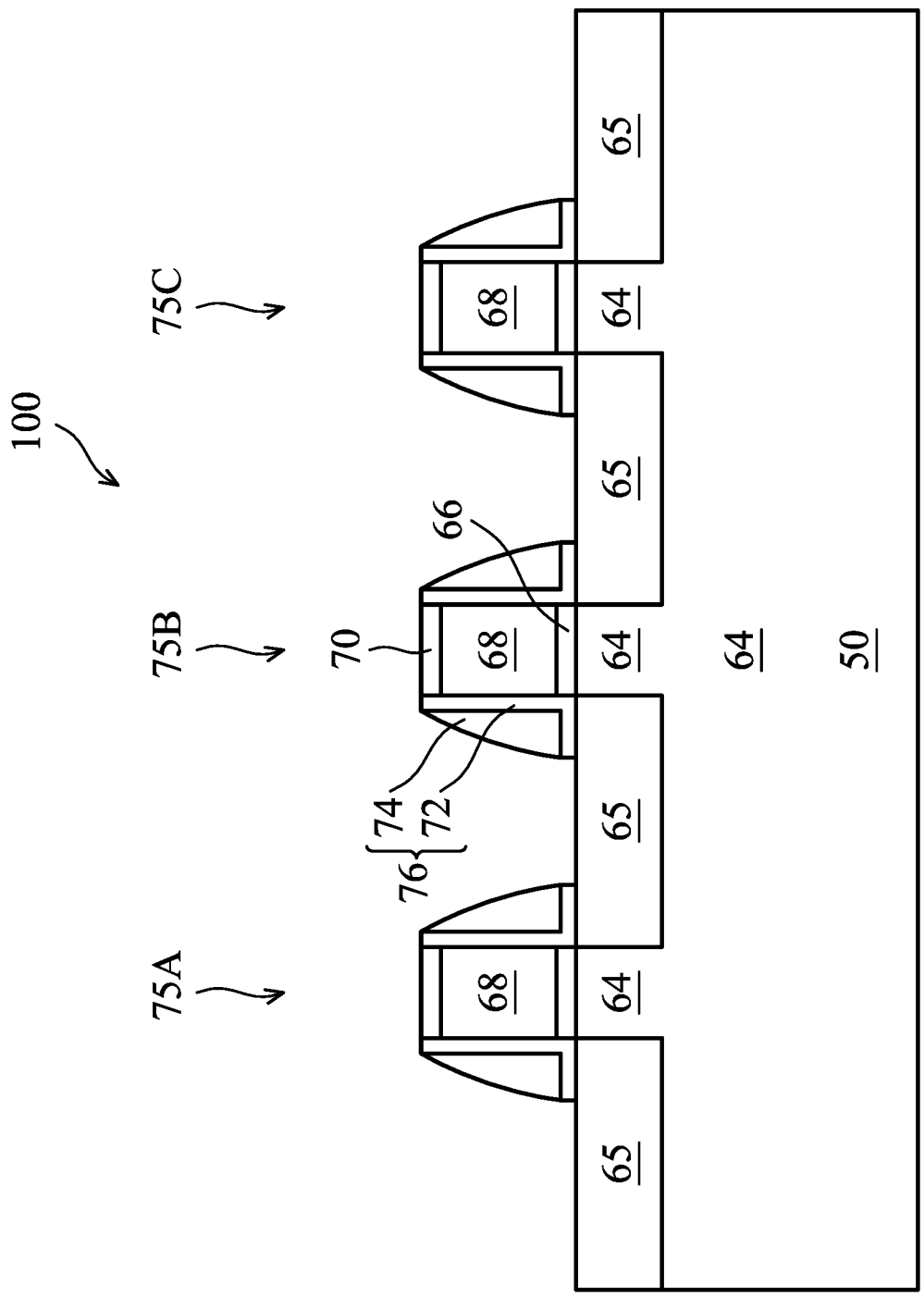
Figure 7A:
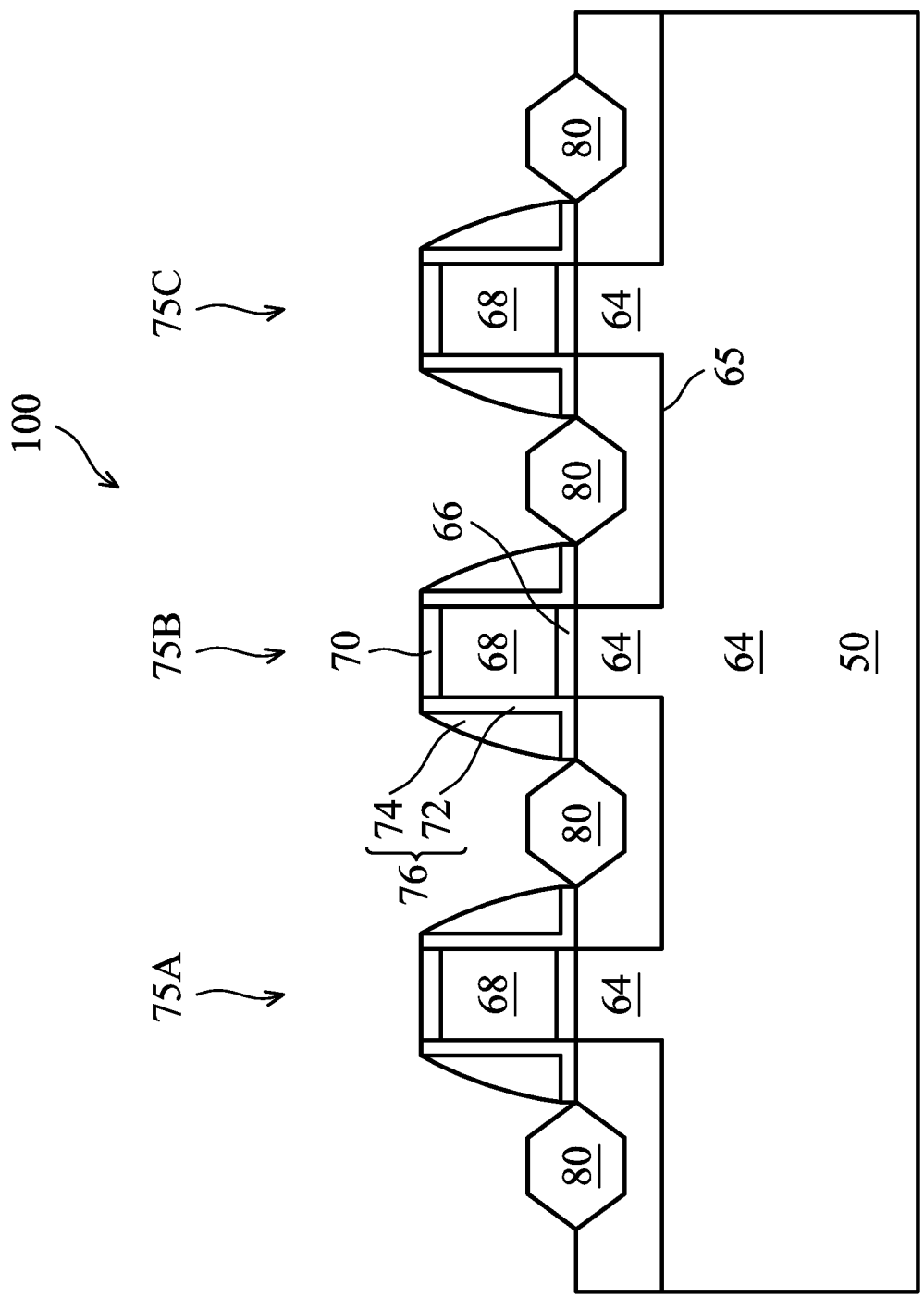
Figure 7B:
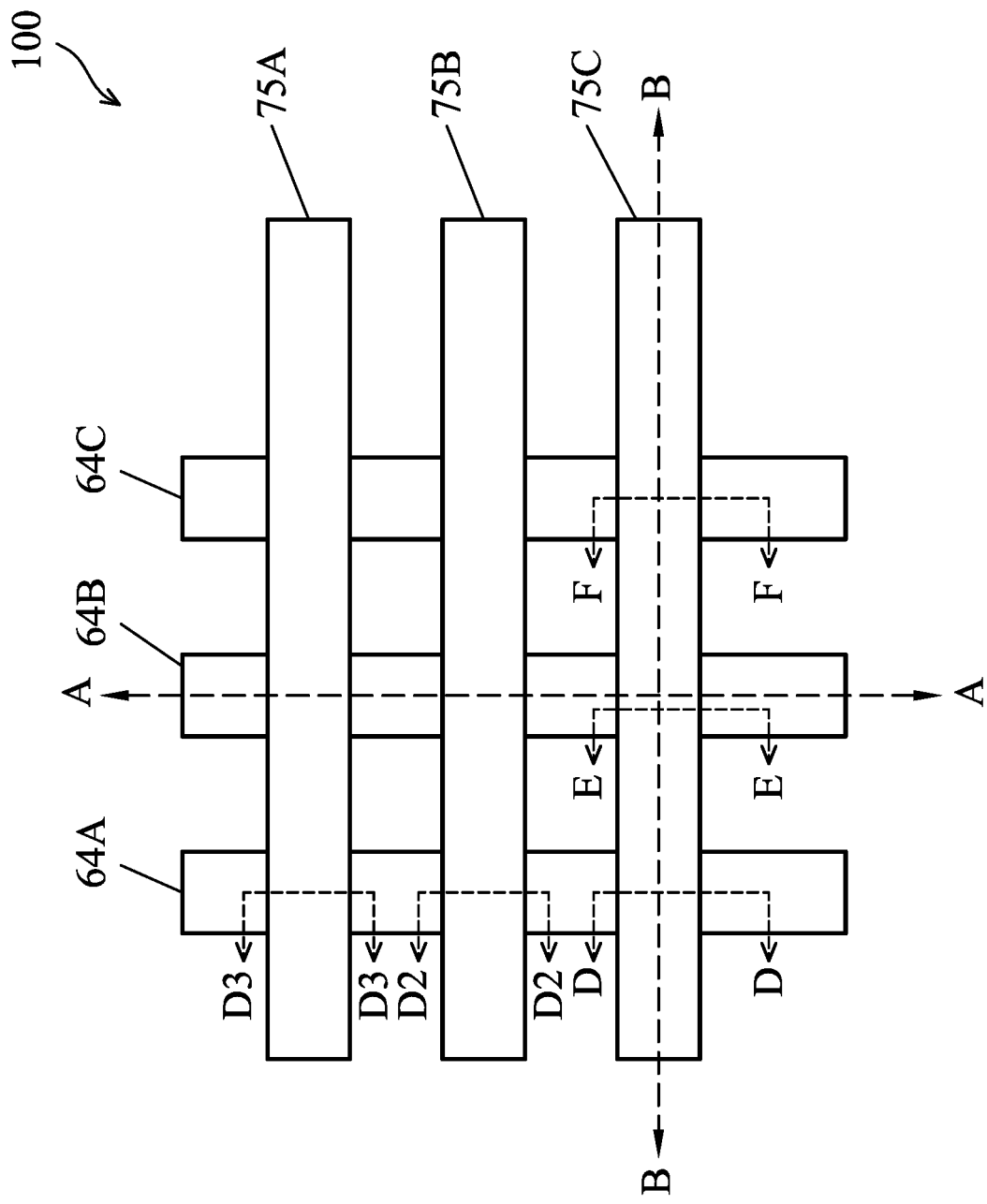
Figure 7C:
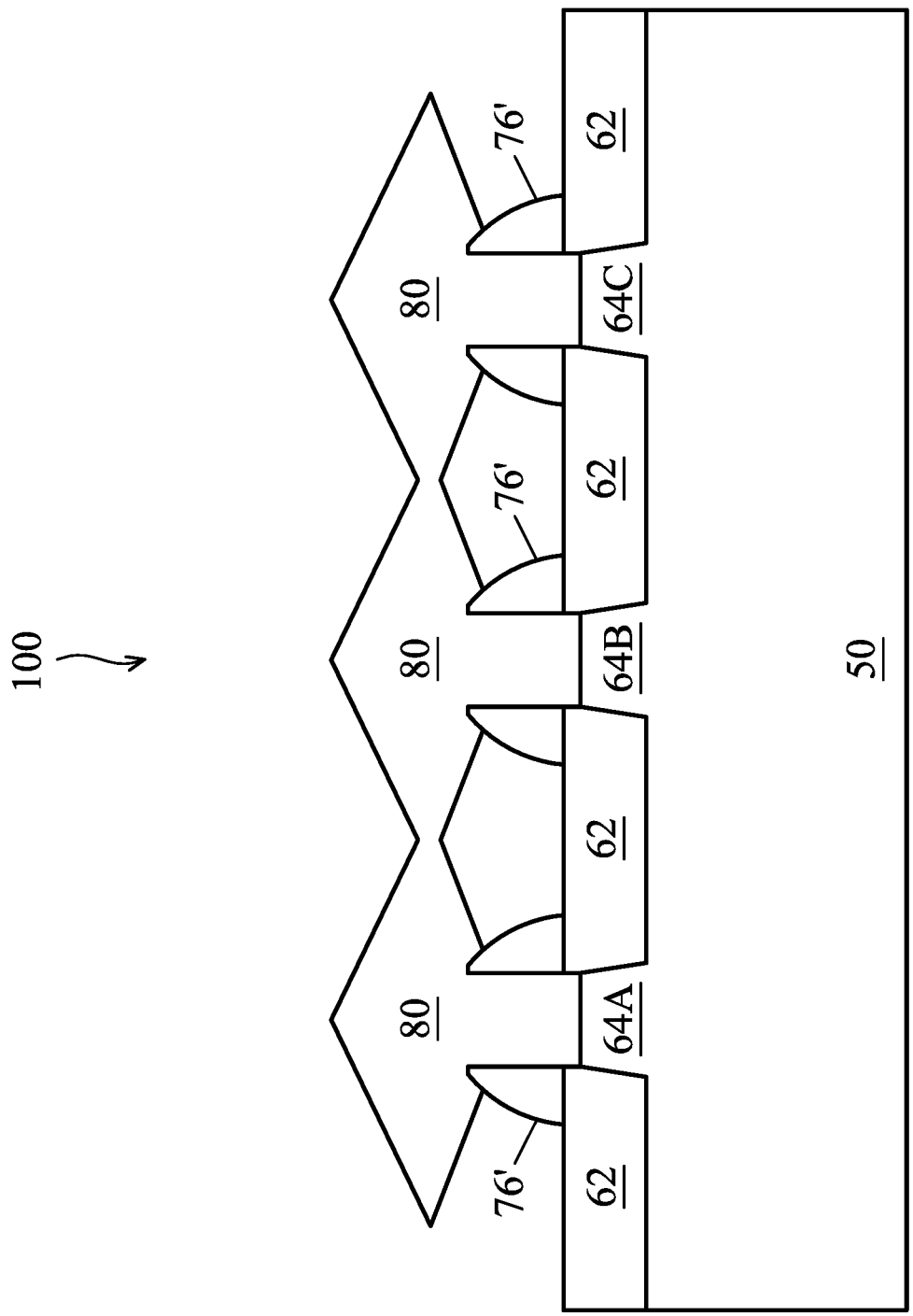
FIGS. 7C and 7D illustrate various cross-sectional views of the FinFET device illustrated in FIG. 7A, in some embodiments.
Figure 7D:
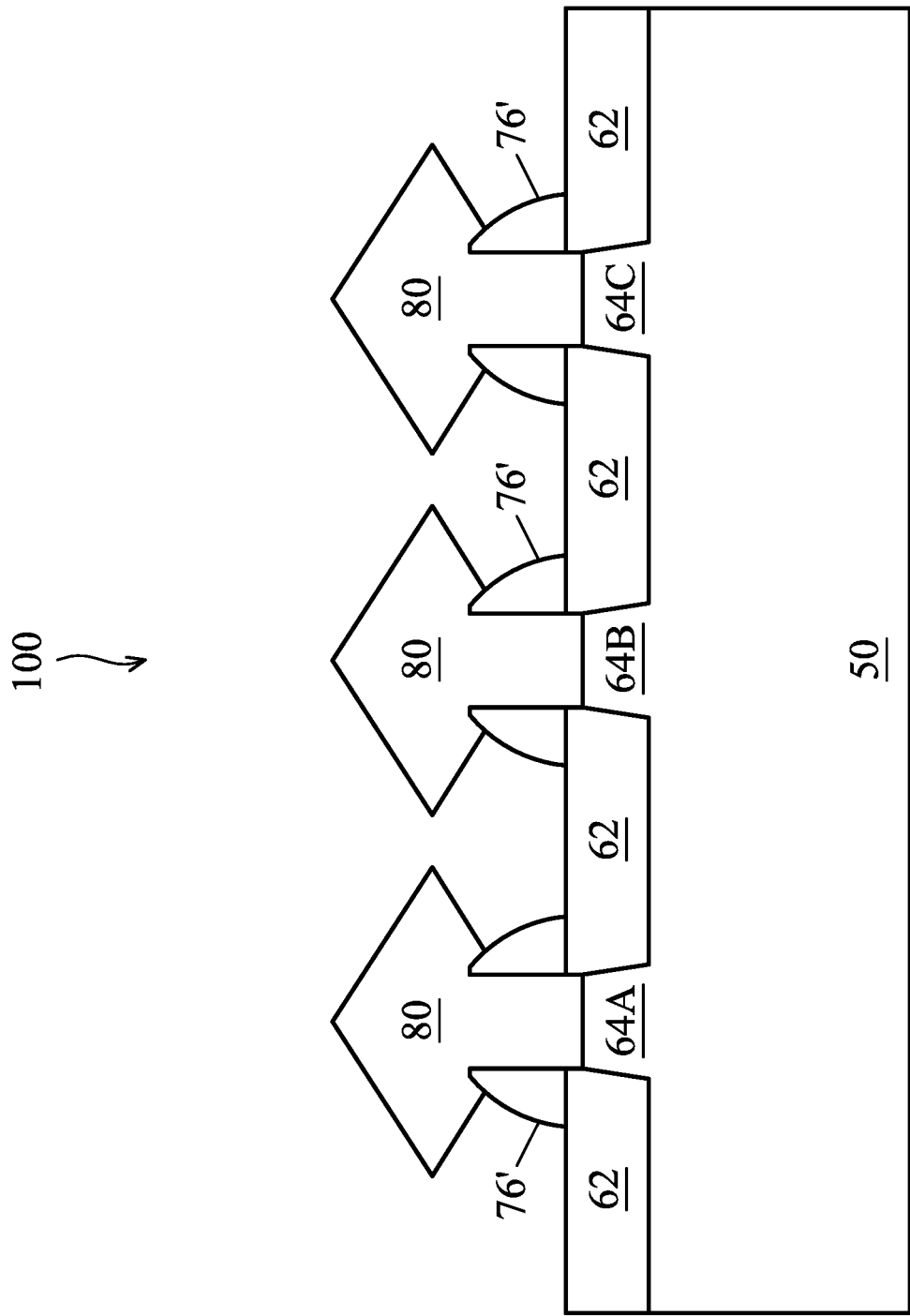
Figure 19:
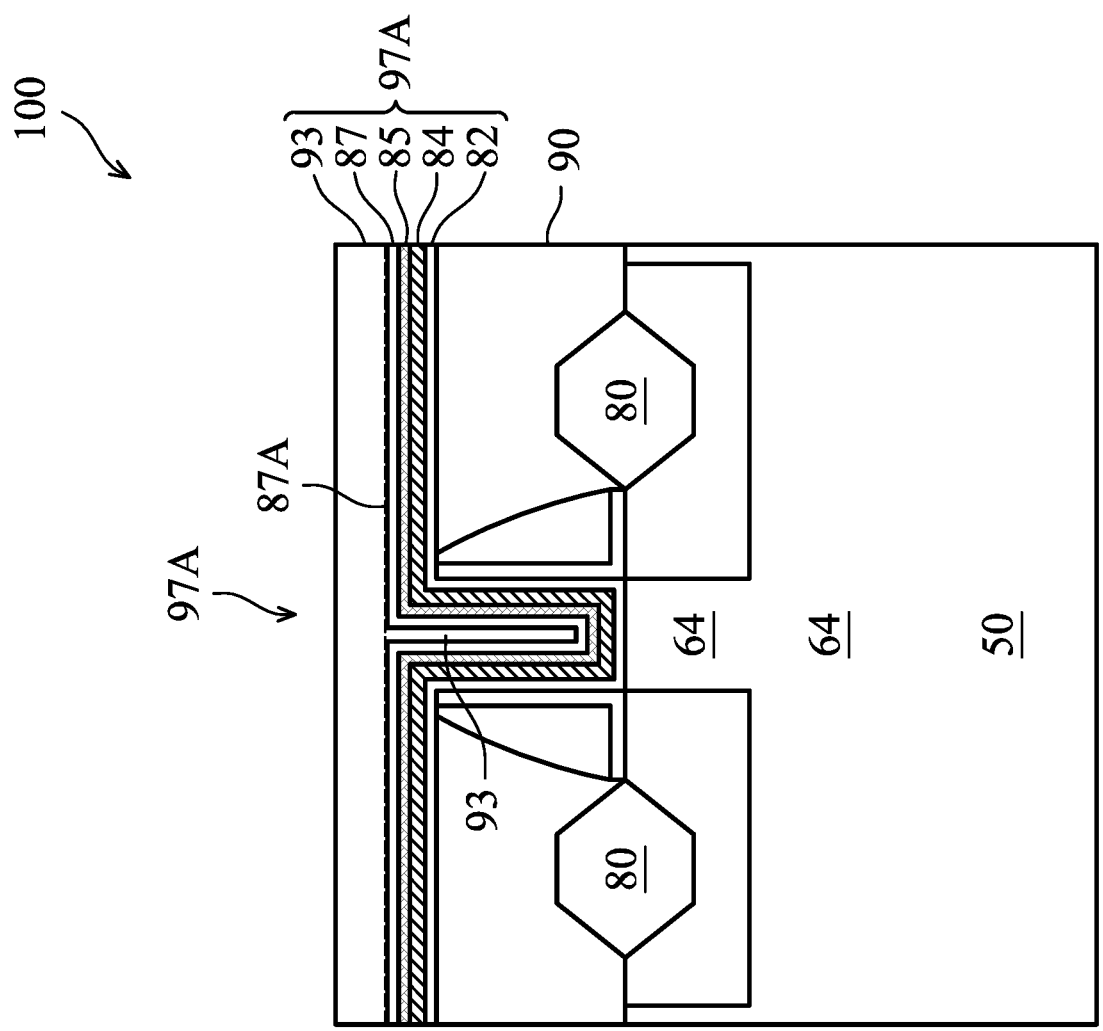
Figure 20:
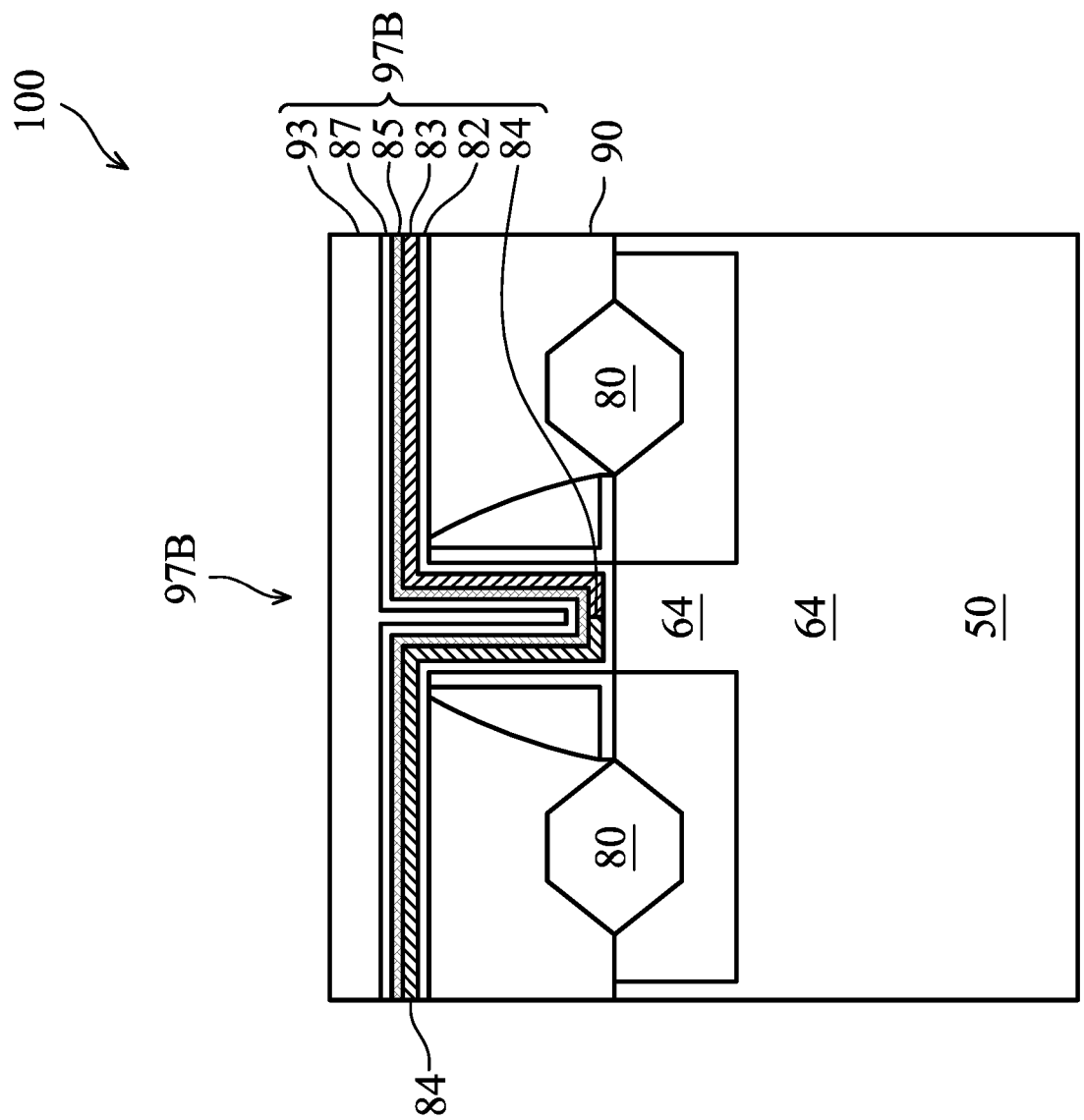
Figure 21:
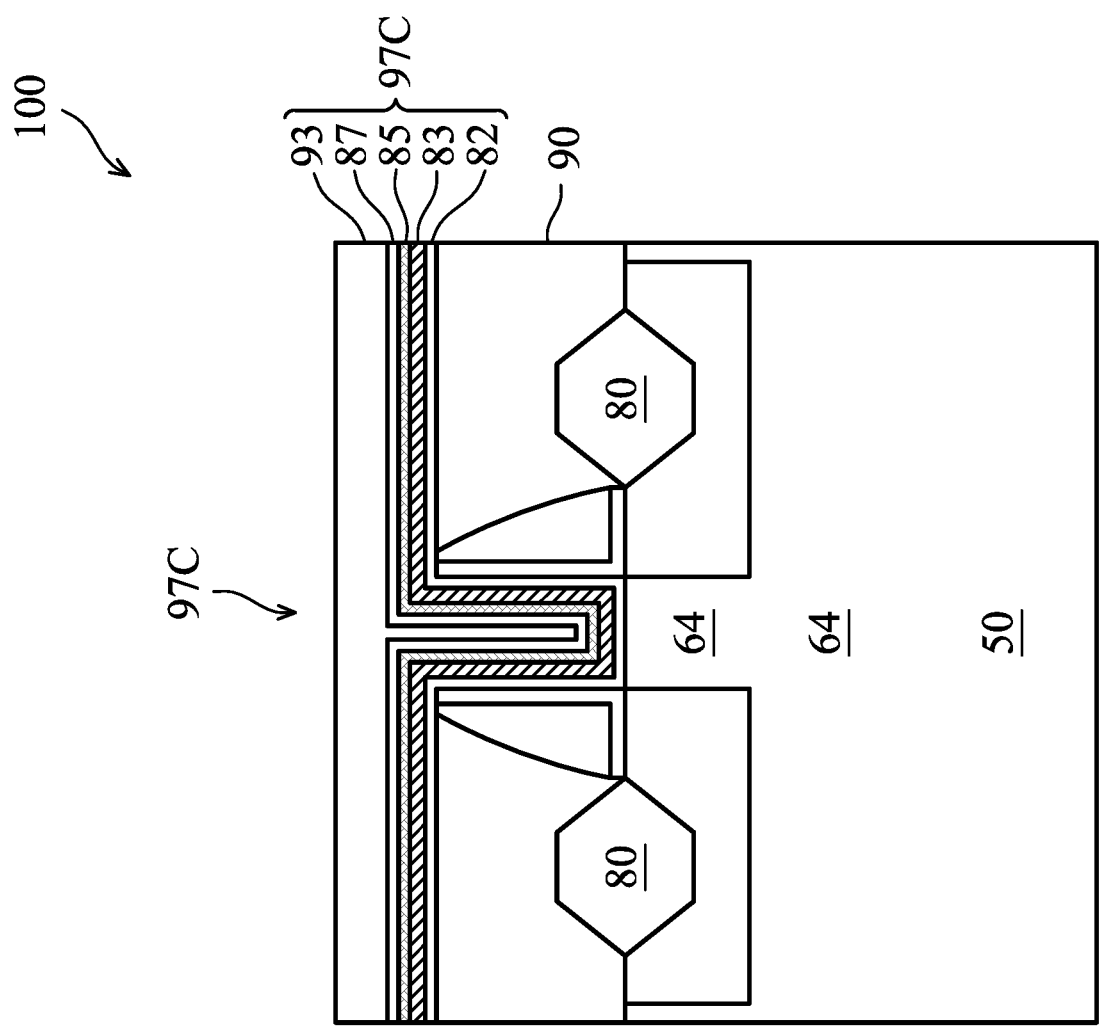
Figure 22:
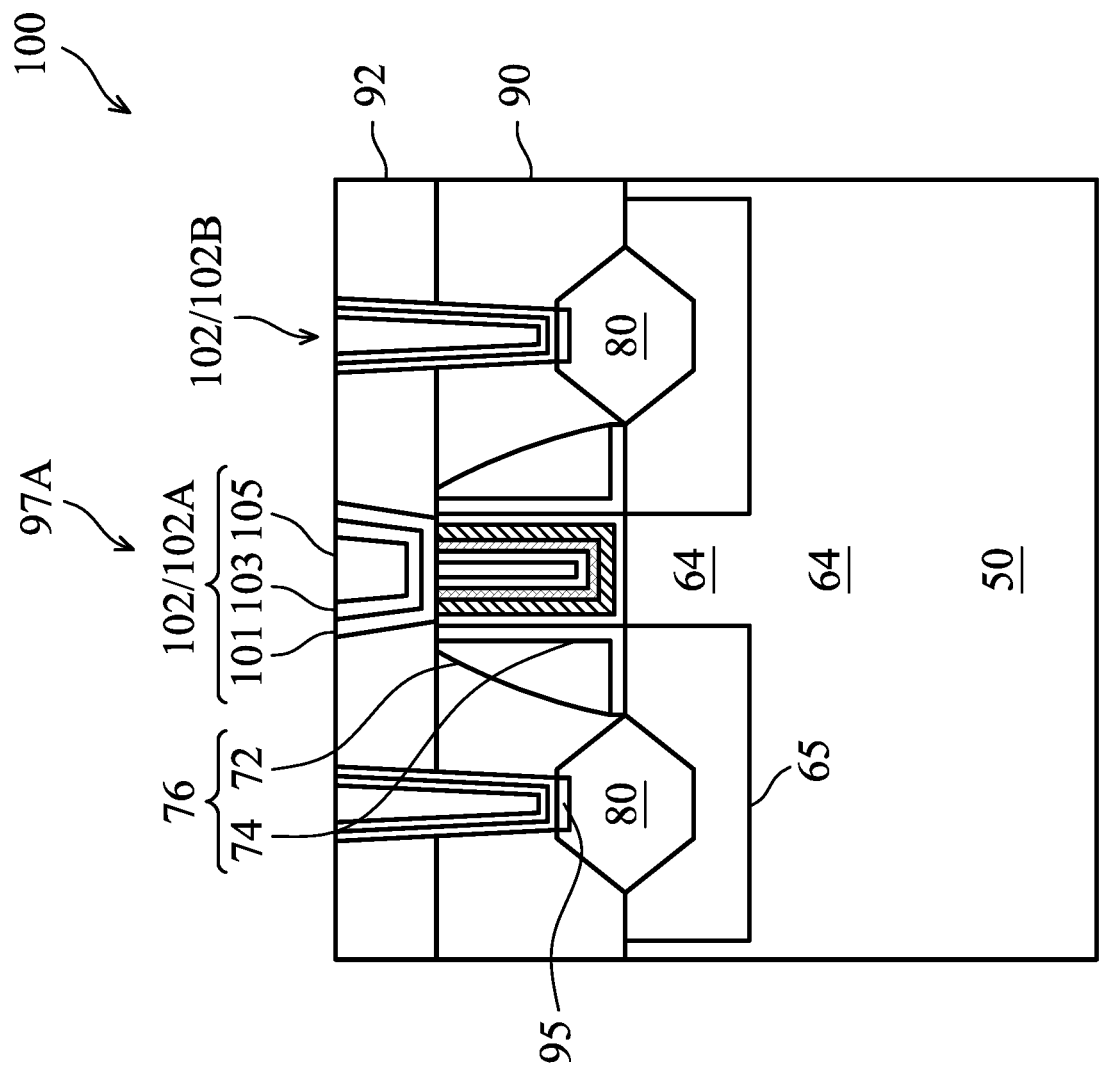
Figure 23:
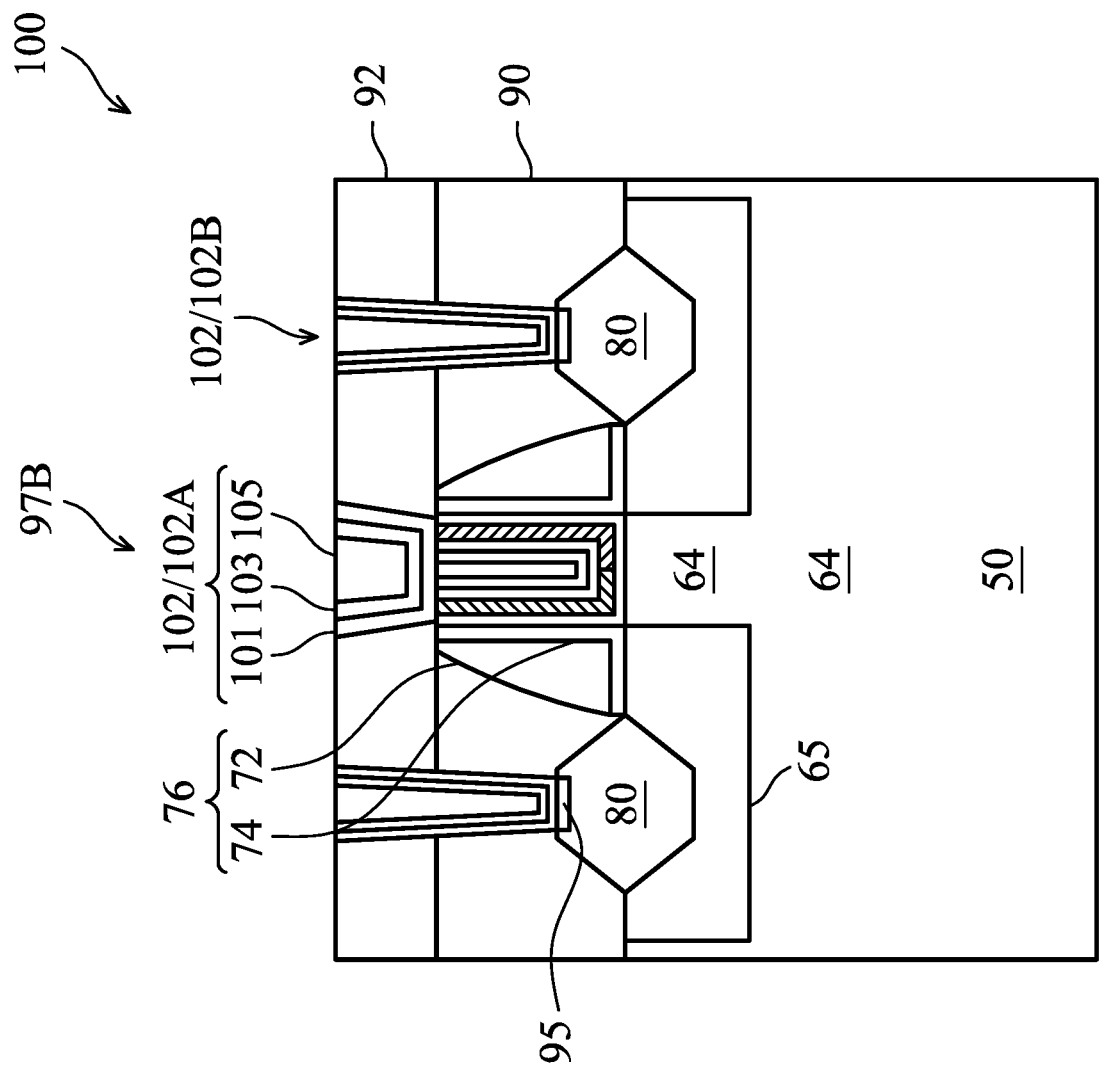
Figure 24:
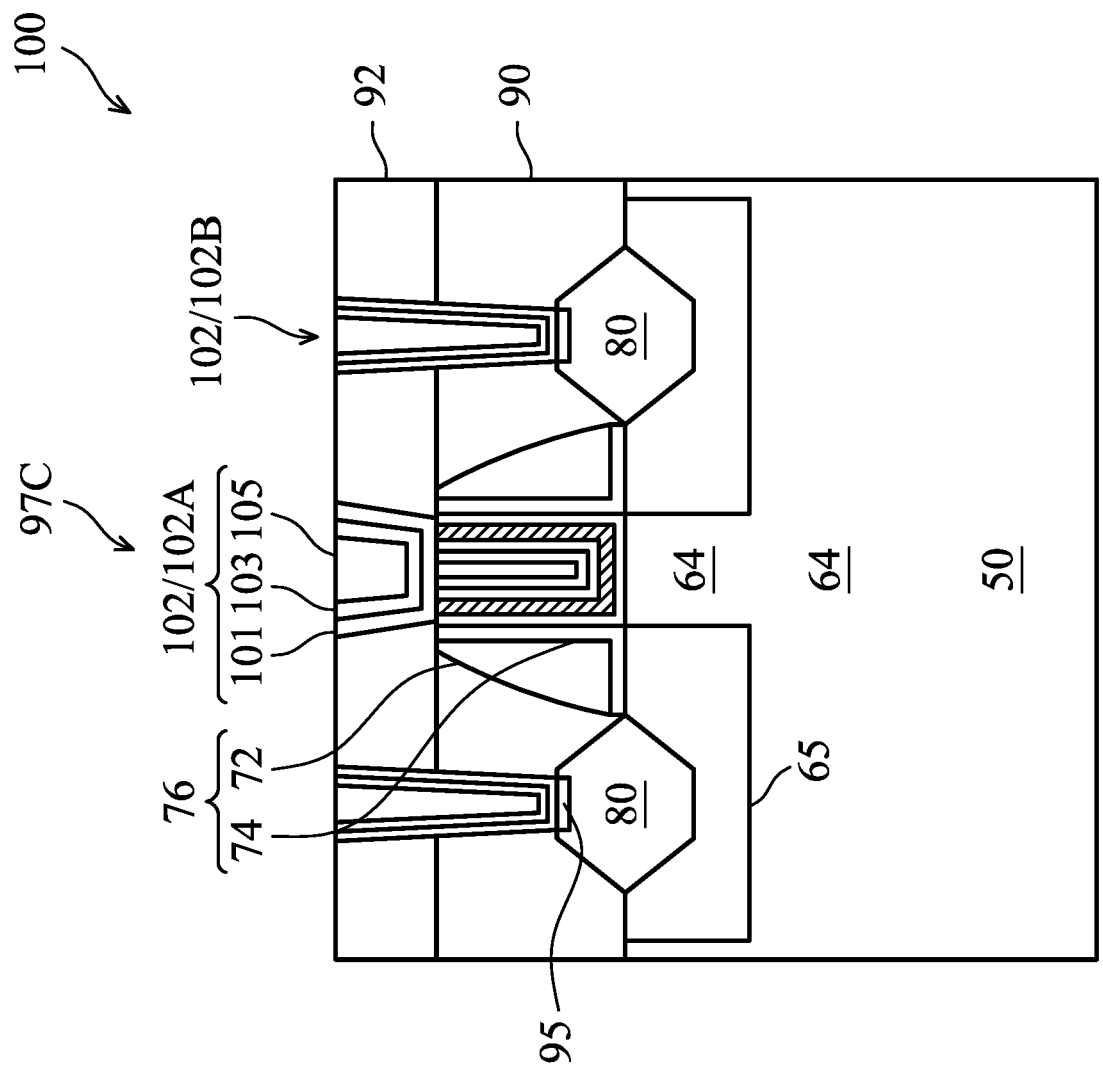

FIGS. 2-6, 7A, and 7B illustrate various views (e.g., cross-sectional views, top views) of a FinFET device 100 at various stages of fabrication in accordance with an embodiment. The FinFET device 100 is similar to the FinFET 30 in FIG. 1, but with multiple fins and multiple gate structures. FIGS. 2-5 illustrate cross-sectional views of the FinFET device 100 along cross-section B-B. FIGS. 6, 7A, 8, and 9 illustrate cross-sectional views of the FinFET device 100 along cross-section A-A. FIG. 7B illustrates a top view of the FinFET device 100 of FIG. 7A, and FIGS. 7C and 7D illustrate various embodiment cross-sectional views of the FinFET device 100 of FIG. 7A, but along cross-section C-C. FIGS. 10-18 illustrate cross-sectional views of the FinFET device 100 along cross-section B-B (see FIG. 7B). FIGS. 19, 20, and 21 illustrate cross-sectional views of the FinFET device 100 along cross-sections D-D, E-E, and F-F (see FIG. 7B), respectively. FIGS. 22, 23, and 24 illustrate cross-sectional views of the FinFET device 100 along cross-sections D-D, E-E, and F-F, respectively.

Figure 2:
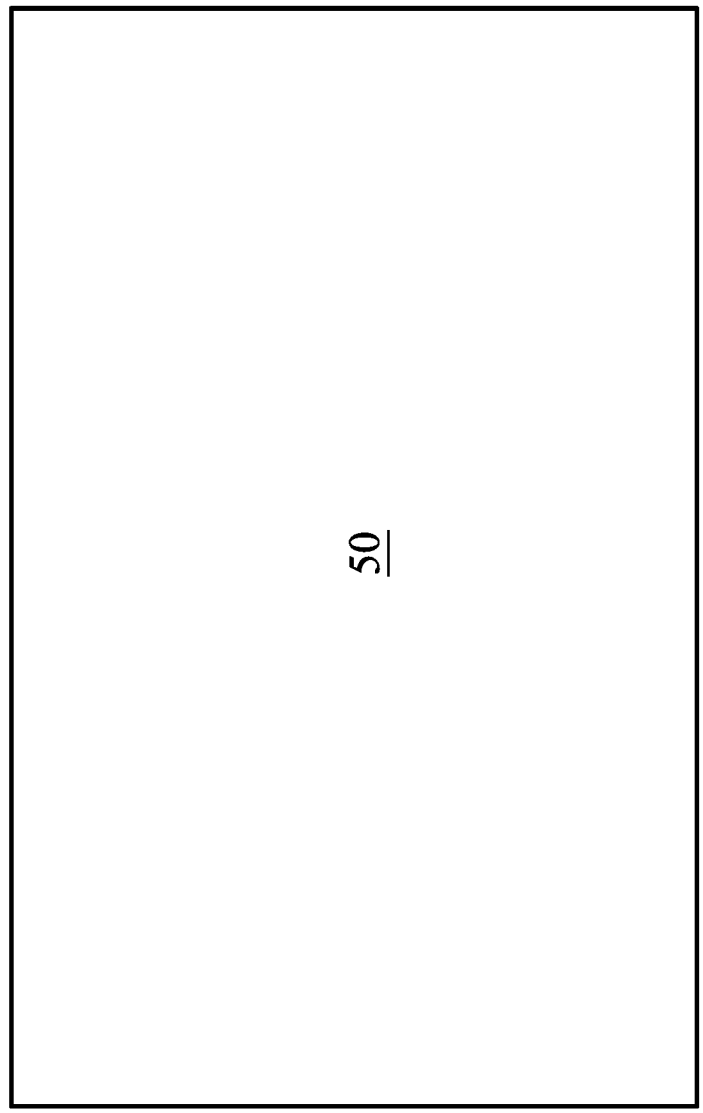
FIGS. 2-6, 7A, and 7B illustrate various views of a FinFET device at various stages of fabrication, in accordance with an embodiment.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a P-type or an N-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
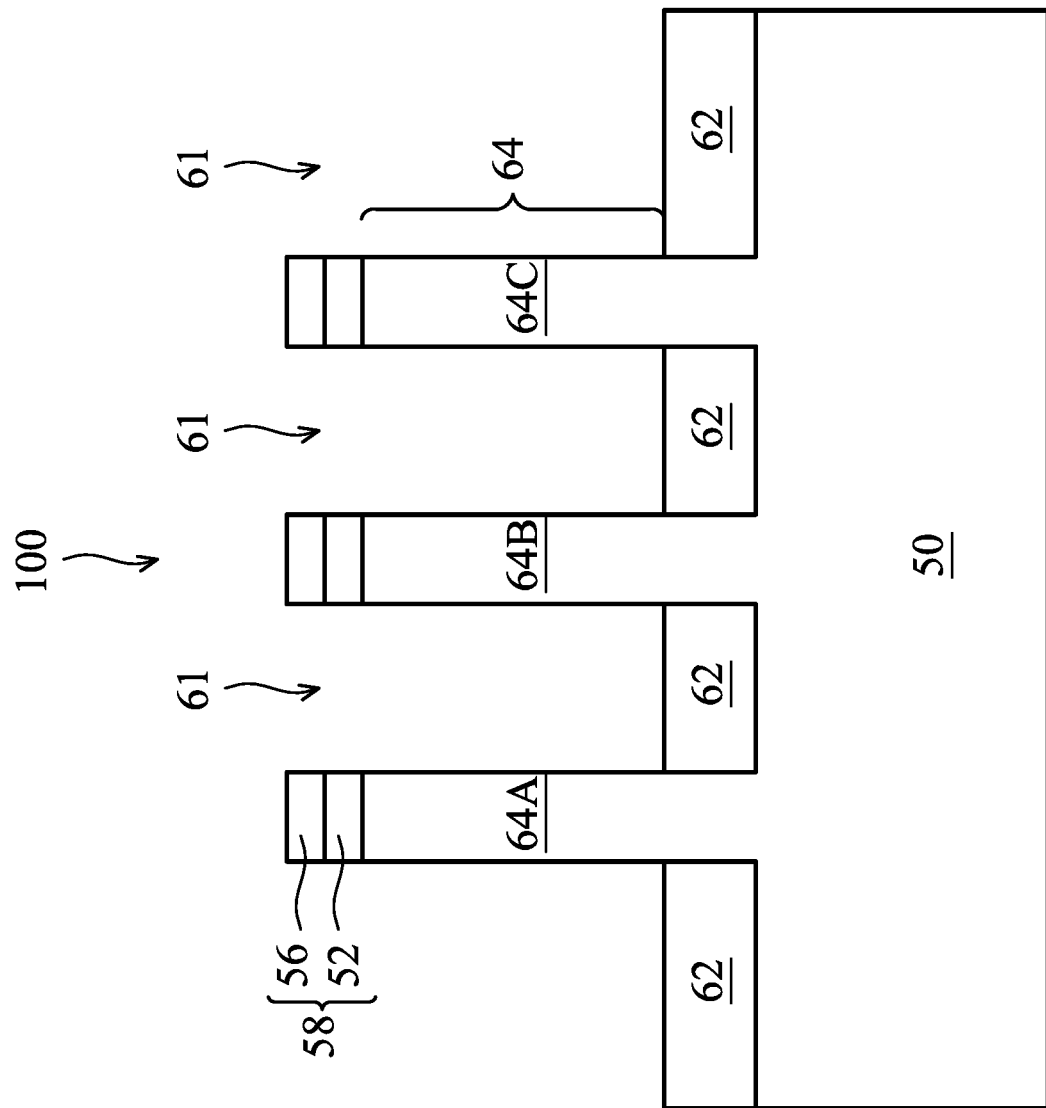

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A, 64B, and 64C) between adjacent trenches 61 as illustrated in FIG. 3. For simplicity, the semiconductor fins 64A, 64B, and 64C may be collectively referred to as semiconductor fins 64, and each of the semiconductor fins 64A, 64B, and 64C may be referred to as a semiconductor fin 64. In some embodiments, the semiconductor fins 64 are formed by etching trenches in the substrate 50 using, for example, reactive ion etch (RIE), neutral beam etch (NBE), the like, or a combination thereof. The etching may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
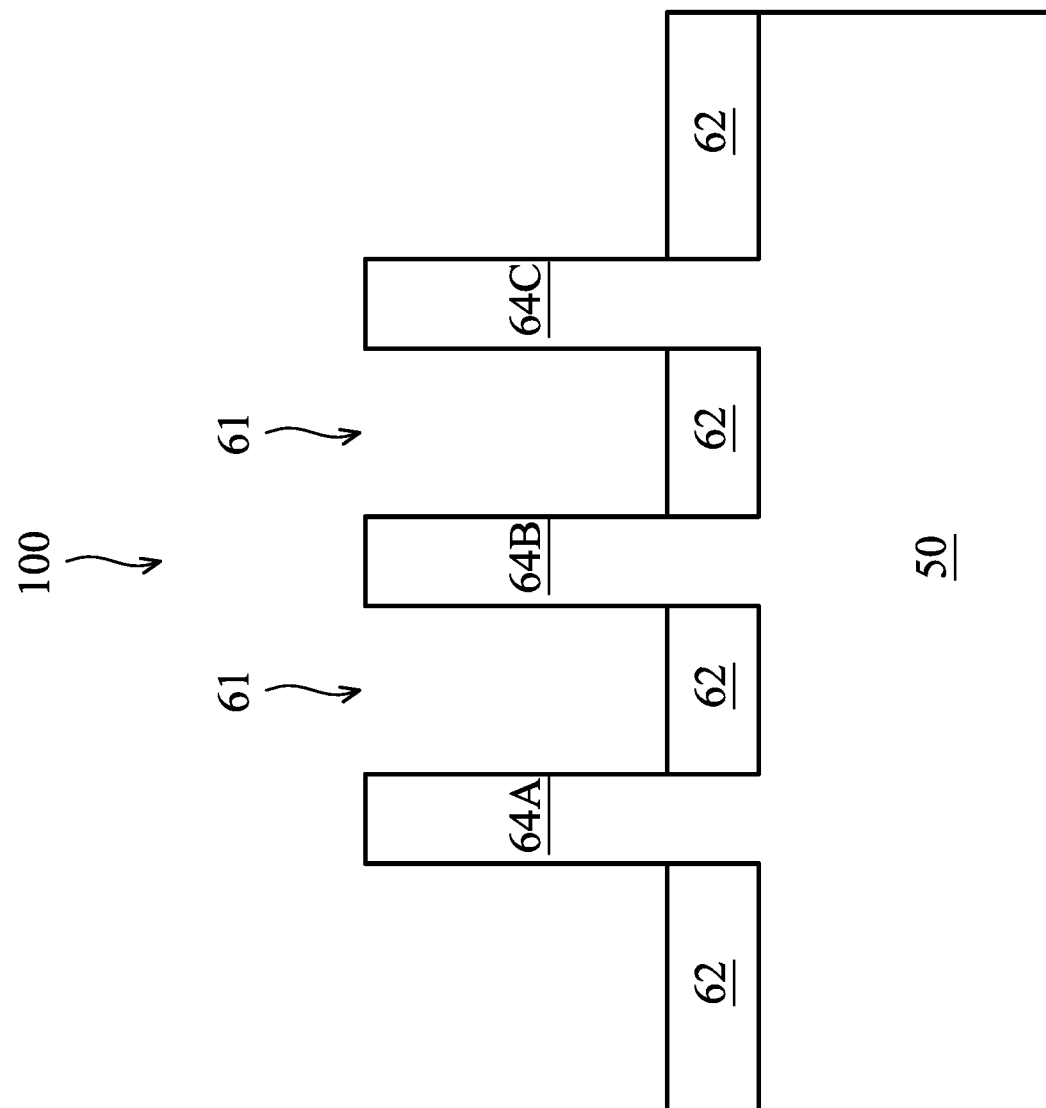

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

FIG. 5 illustrates the formation of dummy gate structure 75 over the semiconductor fins 64. Dummy gate structure 75 includes gate dielectric 66 and gate 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

FIGS. 6, 7A, 8, and 9 illustrate the cross-sectional views of further processing of the FinFET device 100 along cross-section A-A (along a longitudinal axis of the fin 64). FIG. 7B shows a top view of the FinFET device 100 of FIG. 7A. FIGS. 7C and 7D illustrate various embodiment cross-sectional views of the FinFET device 100 of FIG. 7A, but along cross-section C-C. Note that in FIGS. 6, 7A, 7B, and 8, three dummy gate structures 75 (e.g., 75A, 75B, and 75C) are formed over the fin 64. One skilled in the art will appreciate that more or less than three dummy gate structures may be formed over the fin 64, these and other variations are fully intended to be included within the scope of the present disclosure.

As illustrated in FIG. 6, lightly doped drain (LDD) regions 65 are formed in the fins 64. The LDD regions 65 may be formed by a plasma doping process. The plasma doping process may include forming and patterning masks such as a photoresist to cover the regions of the FinFET that are to be protected from the plasma doping process. The plasma doping process may implant N-type or P-type impurities in the fins 64 to form the LDD regions 65. For example, P-type impurities, such as boron, may be implanted in the fin 64 to form the LDD regions 65 for a P-type device. As another example, N-type impurities, such as phosphorus, may be implanted in the fin 64 to form the LDD regions 65 for an N-type device. In some embodiments, the LDD regions 65 abut the channel region of the FinFET device 100. Portions of the LDD regions 65 may extend under gate 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 76 are formed. In some embodiments, the LDD regions 65 are omitted.

Still referring to FIG. 6, after the LDD regions 65 are formed, a gate spacer 76 is formed on the gate structure. The gate spacer 76 may include a first gate spacer 72 and a second gate spacer 74. For example, the first gate spacer 72 may be a gate seal spacer and is formed on opposing sidewalls of the gate 68 and on opposing sidewalls of the gate dielectric 66. The second gate spacer 74 is formed on the first gate spacer 72. The first gate spacer 72 may be formed of silicon nitride, silicon oxynitride, silicon carbide, silicon carbonitride, the like, or a combination thereof, and may be formed using, e.g., a thermal oxidation, chemical vapor deposition (CVD), or other suitable deposition process. The second gate spacer 74 may be formed of silicon nitride, silicon carbonitride, a combination thereof, or the like using a suitable deposition method.

In an example embodiment, the gate spacer 76 is formed by first conformally depositing a first gate spacer layer over the FinFET device 100, then conformally depositing a second gate spacer layer over the deposited first gate spacer layer. Next, an anisotropic etch process, such as a dry etch process, is performed to remove a first portion of the second gate spacer layer disposed on upper surfaces of the FinFET device 100 (e.g., the upper surface of the mask 70) while keeping a second portion of the second gate spacer layer disposed along sidewalls of the dummy gate structures 75. The second portion of the second gate spacer layer remaining after the anisotropic etch process forms the second gate spacer 74. The anisotropic etch process also removes a portion of the first gate spacer layer disposed outside of the sidewalls of the second gate spacer 74, and the remaining portion of the first gate spacer layer forms the first gate spacer 72.

The shapes and formation methods of the gate spacer 76 as illustrated in FIG. 6 are merely non-limiting examples, and other shapes and formation methods are possible. These and other variations are fully intended to be included within the scope of the present disclosure.

Next, as illustrated in FIG. 7A, source/drain regions 80 are formed. The source/drain regions 80 are formed by etching the fins 64 (e.g., in the LDD region 65) to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 7C). In some embodiments, the source/drain regions 80 for adjacent fins 64 do not merge together and remain separate source/drain regions 80 (see FIG. 7D). FIGS. 7C and 7D also illustrate spacers 76' along opposing sidewalls of the fins 64, which spacers 76' may have a same or similar structure as the gate spacers 76, and may be formed in a same processing step(s) as the gate spacers 76.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about $1E19$ cm$^{-3}$ to about $1E21$ cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

FIG. 7B illustrates a top view of the FinFET device 100 of FIG. 7A. Three fins 64 (e.g., 64A, 64B, and 64C) are illustrated in FIG. 7B, with three dummy gate structures 75 (e.g., 75A, 75B, and 75C) formed over the fins 64. For simplicity, not all features of the FinFET device 100 are shown in FIG. 7B. For example, the gate spacers 76 and the source/drain regions 80 are not shown. FIG. 7B also illustrates cross-sections D-D, E-E, and F-F, which are parallel to the cross-section A-A, and cut the dummy gate structure 75C along the fins 64A, 64B, and 64C, respectively. FIG. 7B further illustrates cross-sections D2-D2, and D3-D3, which are parallel to the cross-section A-A, and cut the dummy gate structures 75B and 75A, respectively, along the fin 64A.

Figure 8:
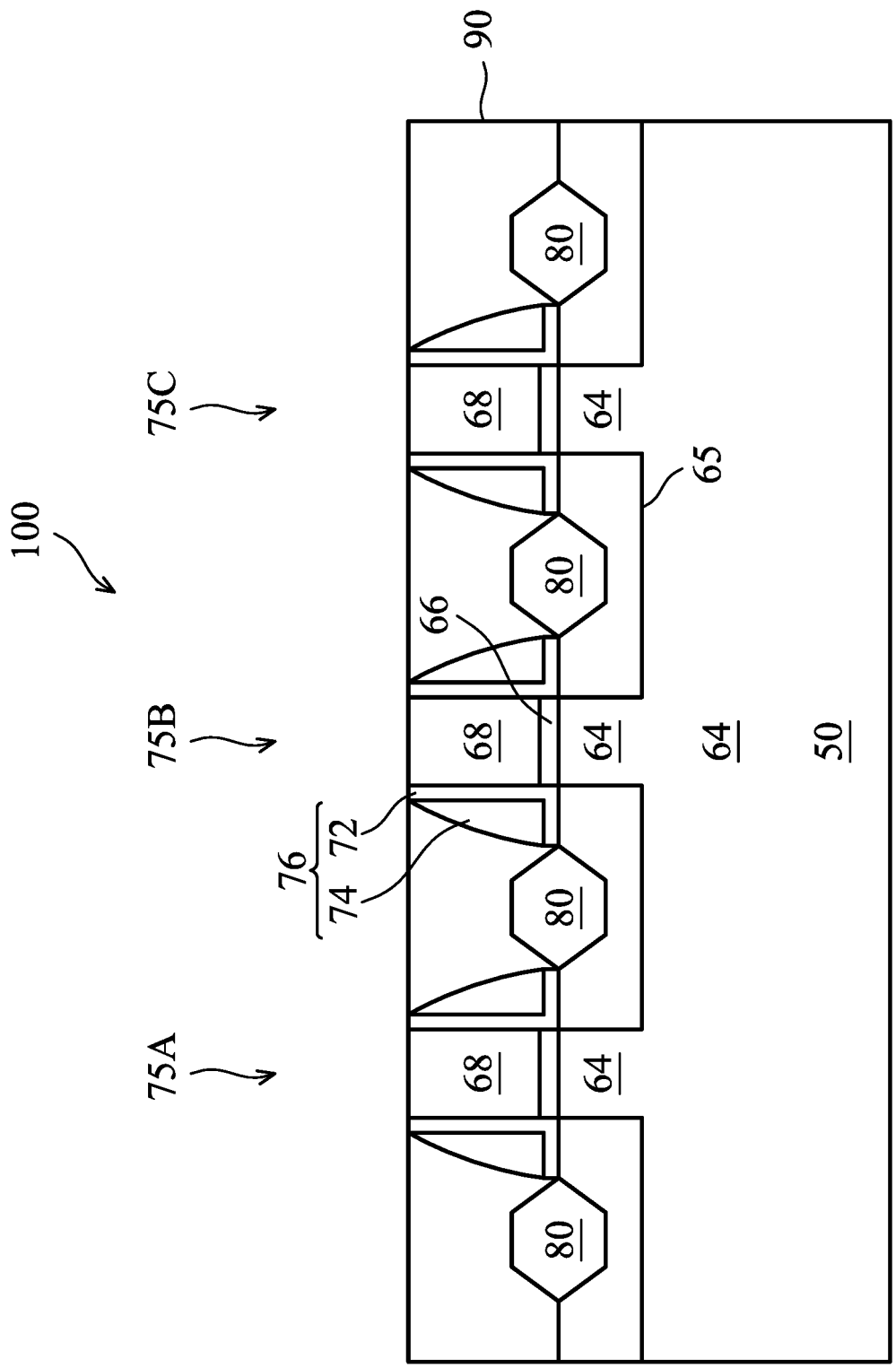
FIGS. 8-24 illustrate various cross-sectional views of the FinFET device of FIG. 7A at additional stages of fabrication, in accordance with an embodiment.

Next, in FIG. 8, a first interlayer dielectric (ILD) 90 is formed over the substrate 50 and over the dummy gate structures 75 (e.g., 75A, 75B, 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 (see FIG. 7A). After the planarization process, the top surface of the first ILD 90 is level with the top surface of the gate 68, as illustrated in FIG. 8.

An embodiment gate-last process (sometimes referred to as replacement gate process) is performed subsequently to replace each of the dummy gate structures 75 with an active gate structure (may also be referred to as a replacement gate or a metal gate). Therefore, the gate 68 and the gate dielectric 66 are considered dummy gate structures in a gate-last process.

Figure 9:
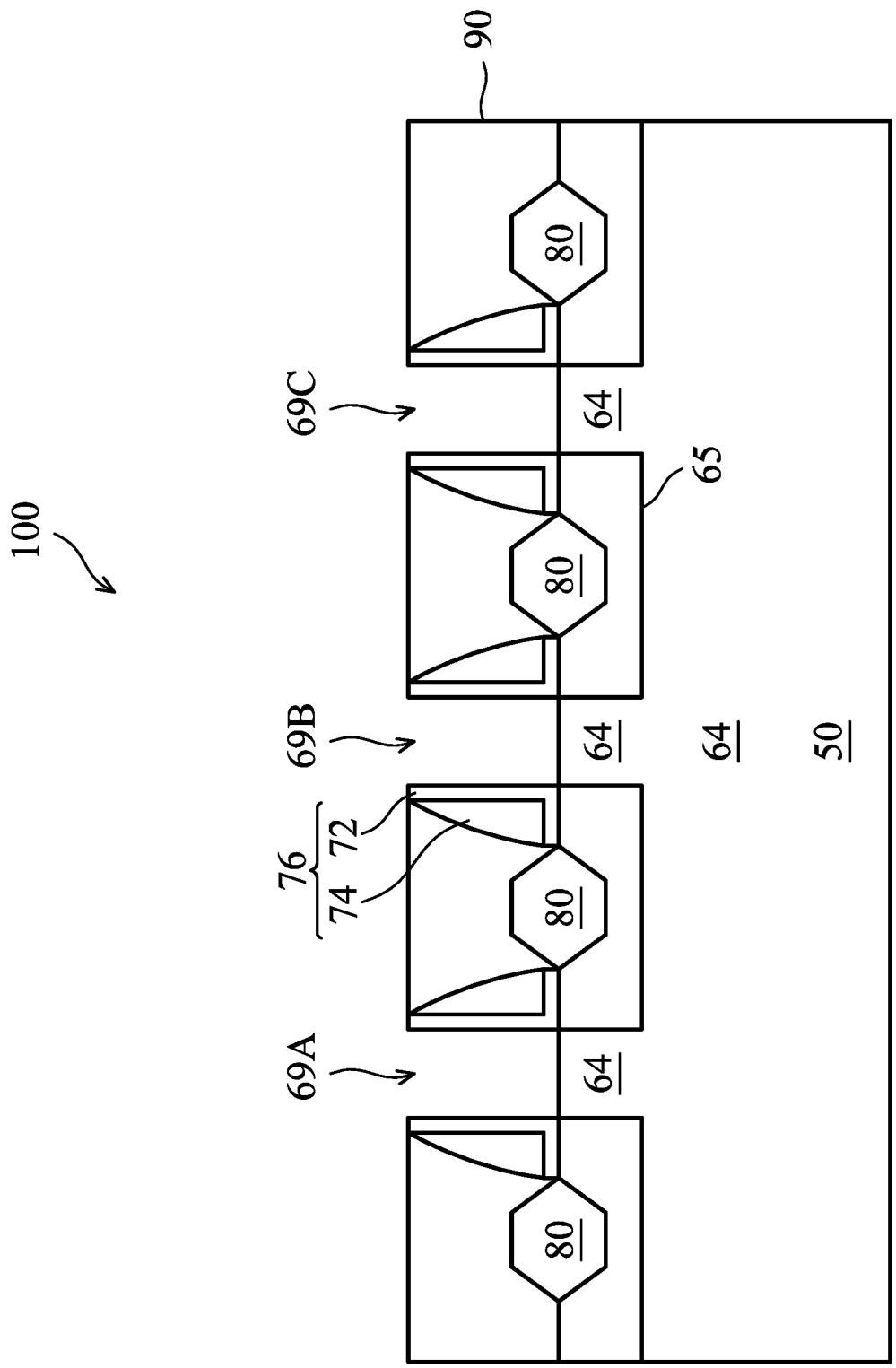

Referring to FIG. 9, the dummy gate structures 75A, 75B, and 75C are removed to form recesses 69A, 69B, and 69C, respectively, in the first ILD 90. For simplicity, the recesses 69A, 69B, and 69C may be collectively referred to as recesses 69, and each of the recesses 69A, 69B, and 69C may be referred to as a recess 69. In accordance with some embodiments, the gates 68 and the gate dielectric 66 directly under the gates 68 are removed in an etching step(s), so that the recesses 69 (e. g., 69A, 69B, and 69C) are formed between the gate spacers 76. Each recess 69 exposes the channel region of a respective fin 64. During the dummy gate removal, the dummy gate dielectric 66 may be used as an etch stop layer when the dummy gate 68 is etched. The dummy gate dielectric 66 may then be removed after the removal of the dummy gate 68. Since the replacement gates are formed subsequently in the recesses 69, the recesses 69 are also referred to as gate trenches 69.

Figure 10:
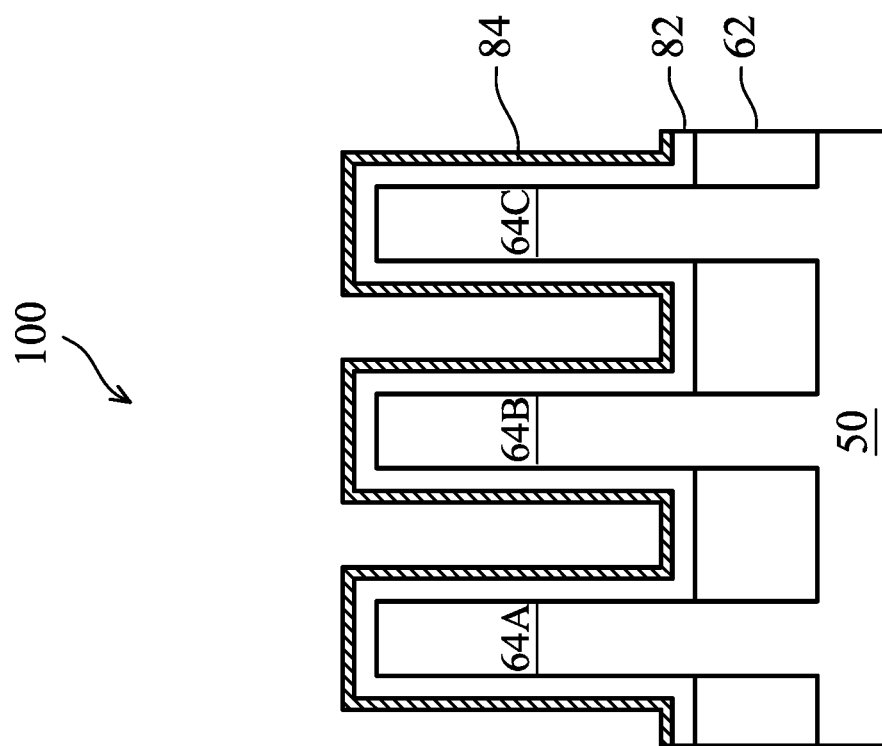

Next, in FIG. 10, a gate dielectric layer 82 is deposited conformally in the recesses 69, such as on top surfaces and sidewalls of the fins 64, and on sidewalls of the gate spacers 76. The gate dielectric layer 82 may also be formed on a top surface of the first ILD 90. In accordance with some embodiments, the gate dielectric layer 82 comprises silicon oxide, silicon nitride, or multilayers thereof. In other embodiments, the gate dielectric layer 82 includes a high-k dielectric material, and in these embodiments, the gate dielectric layers 82 may have a k value greater than about 7.0, and may include a metal oxide or a silicate of Hf, Al, Zr, La, Mg, Ba, Ti, Pb, and combinations thereof. The formation methods of gate dielectric layer 82 may include molecular beam deposition (MBD), atomic layer deposition (ALD), PECVD, and the like.

After the gate dielectric layer 82 is formed, a P-type work function layer 84 is formed (e.g., conformally) over the gate dielectric layer 82. Example P-type work function metals include TiN, TaN, Ru, Mo, Al, WN, $ZrSi_2$, $MoSi_2$, $TaSi_2$, $NiSi_2$, WN, other suitable P-type work function materials, or combinations thereof. In the illustrated embodiment, the P-type work function layer 84 is formed of a titanium-containing material such as titanium nitride (TiN) or titanium (Ti). A thickness of the P-type work function layer 84 is between about 10 angstroms and about 30 angstroms. A work function value is associated with the material composition of the work function layer, and thus, the material of the work function layer is chosen to tune its work function value so that a target threshold voltage Vt is achieved in the device that is to be formed. The work function layer may be deposited by CVD, physical vapor deposition (PVD), ALD, or other suitable process.

Figure 11:
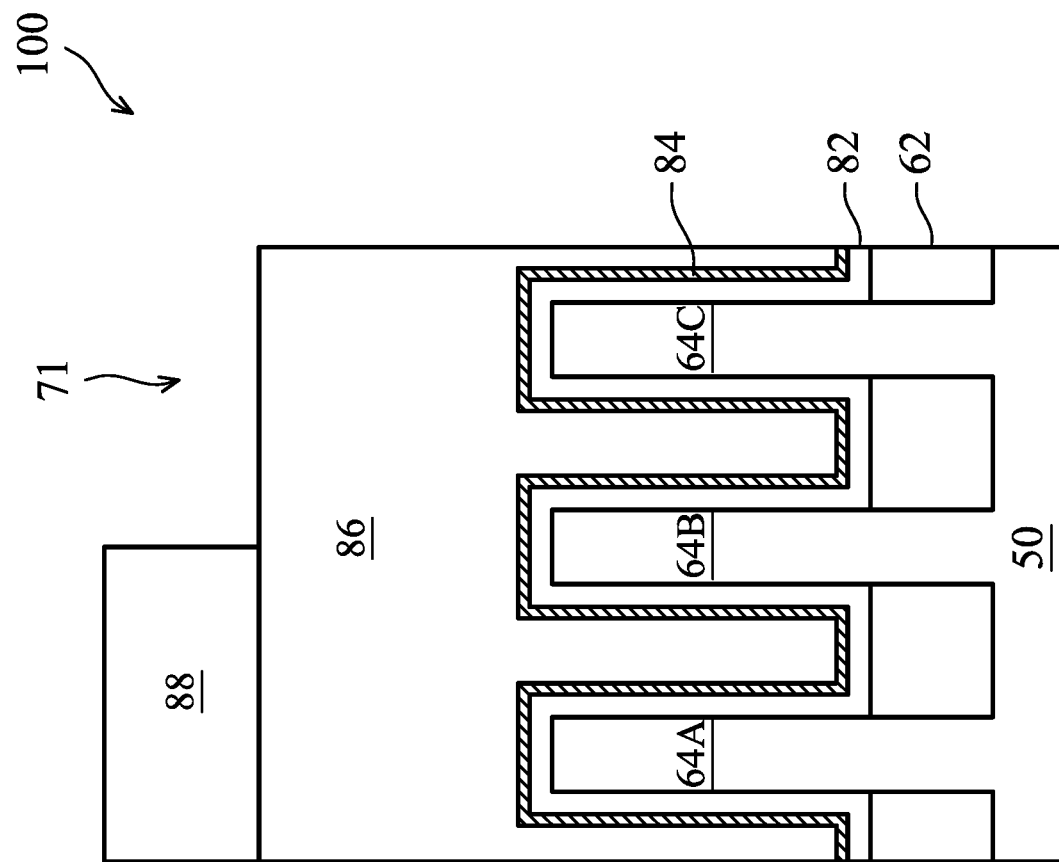

Next, in FIG. 11, a photoresist, which includes a bottom anti-reflective coating (BARC) layer 86 and a top photoresist 88, is formed over the FinFET device 100 of FIG. 10. The photoresist may additionally include a middle layer (not shown). After being formed, the photoresist fills the spaces between the fins 64, as illustrated in FIG. 11. The top photoresist 88 is next patterned to form an opening 71, which opening 71 is over (e.g., directly over) portions (e.g., the right portions) of the fin 64B and over the fin 64C. In an embodiment, the top photoresist 88 is patterned by exposing the top photoresist 88 to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the top photoresist 88 are different from the physical properties of the unexposed portions of the top photoresist 88. The top photoresist 88 may then be developed with, e.g., a developer, in order to separate the exposed portion of the top photoresist 88 from the unexposed portion of the top photoresist 88.

Figure 12:
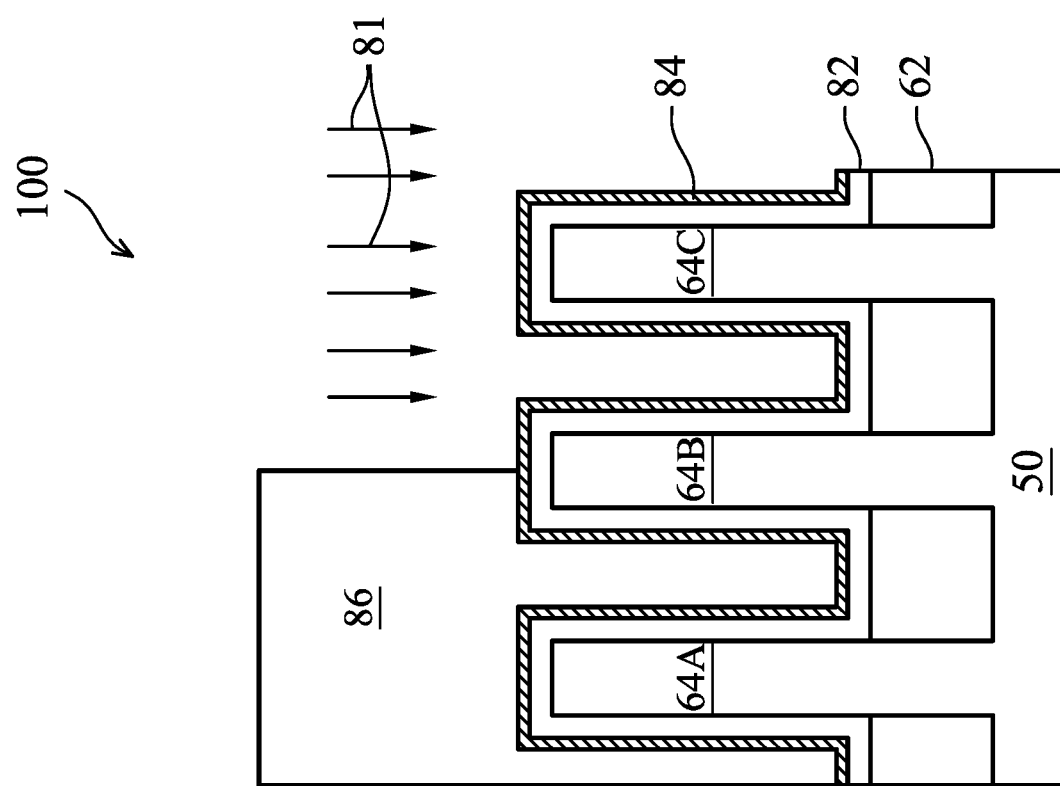

Next, in FIG. 12, the pattern of the top photoresist 88 is extended toward the substrate 50 and is transferred to the BARC layer 86 using, e.g., an isotropic etching process such as a plasma etch process, such that portions of the P-type work function layer 84 underlying the opening 71 are exposed. The top photoresist 88 may also be removed by the anisotropic etching process.

Next, a wet etch process 81 is performed to selectively remove the exposed portions of the P-type work function layer 84. The wet etch process 81 uses a first etching chemical W1 that is selective to (e.g., having a higher etching rate for) the P-type work function layer 84. In some embodiments, the first etching chemical W1 includes an etchant and an oxidizer. In an embodiment, the etchant is an acid, such as hydrogen chloride (HCl), phosphoric acid ($H_3PO_4$), or the like. In another embodiment, the etchant is a base, such as ammonium hydroxide ($NH_4OH$). The oxidizer used in the first etching chemical W1 may be, e.g., hydrogen peroxide ($H_2O_2$). In some embodiments, the etchant (e.g., a base, or an acid) and the oxidizer are mixed in an aqueous solution, such as in de-ionized water (DIW), to form the first etching chemical W1. A concentration (e.g., volume concentration) of the etchant and the oxidizer in the first etching chemical W1 is higher than about 1%, such as between about 1% and about 10%. The wet etch process 81 may be performed at a temperature between about 40° C. and about 70° C., and for a duration between about 1 minute and about 5 minutes. Due to the etching selectivity of the wet etching process 81, the exposed portions of the P-type work function layer 84 are removed (see FIG. 13) without substantially attacking the underlying gate dielectric layer 82.

Figure 13:
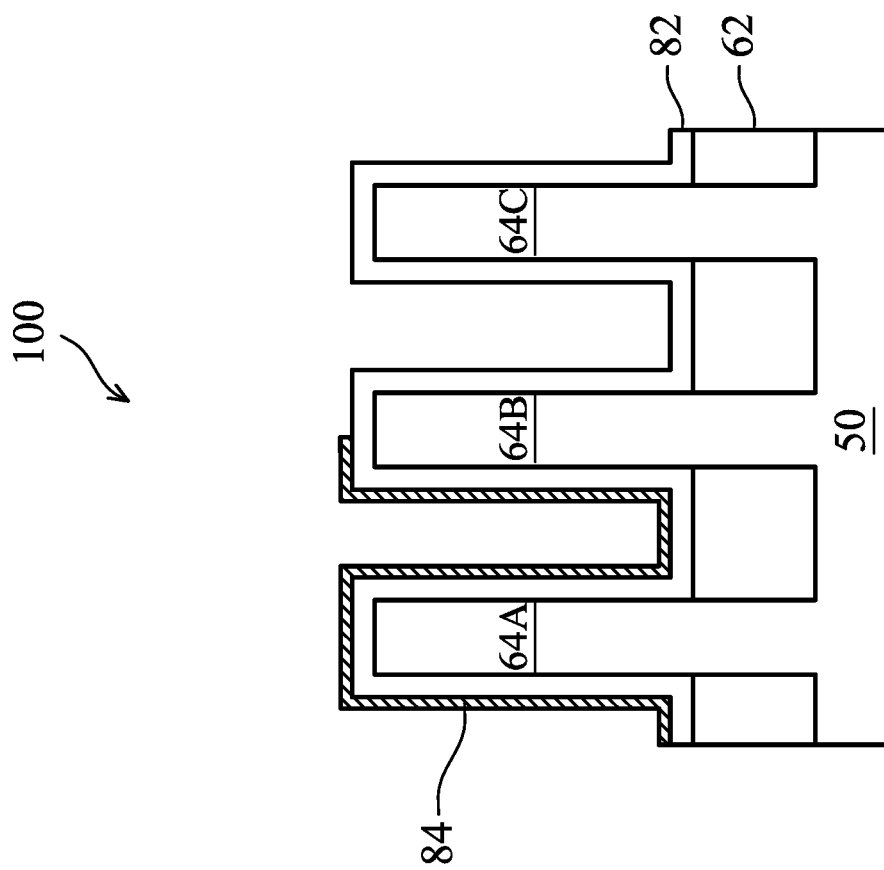

Next, in FIG. 13, the BARC layer 86 is removed using a suitable removal method, such as ashing. The remaining portions of the P-type work function layer 84 are exposed, which remaining portions are disposed over the fin 64A and over portions (e.g., the left portions) of the fin 64B. Portions of the gate dielectric layer 82 over the right portions of the fin 64B and over the fin 64C are also exposed.

Figure 14:
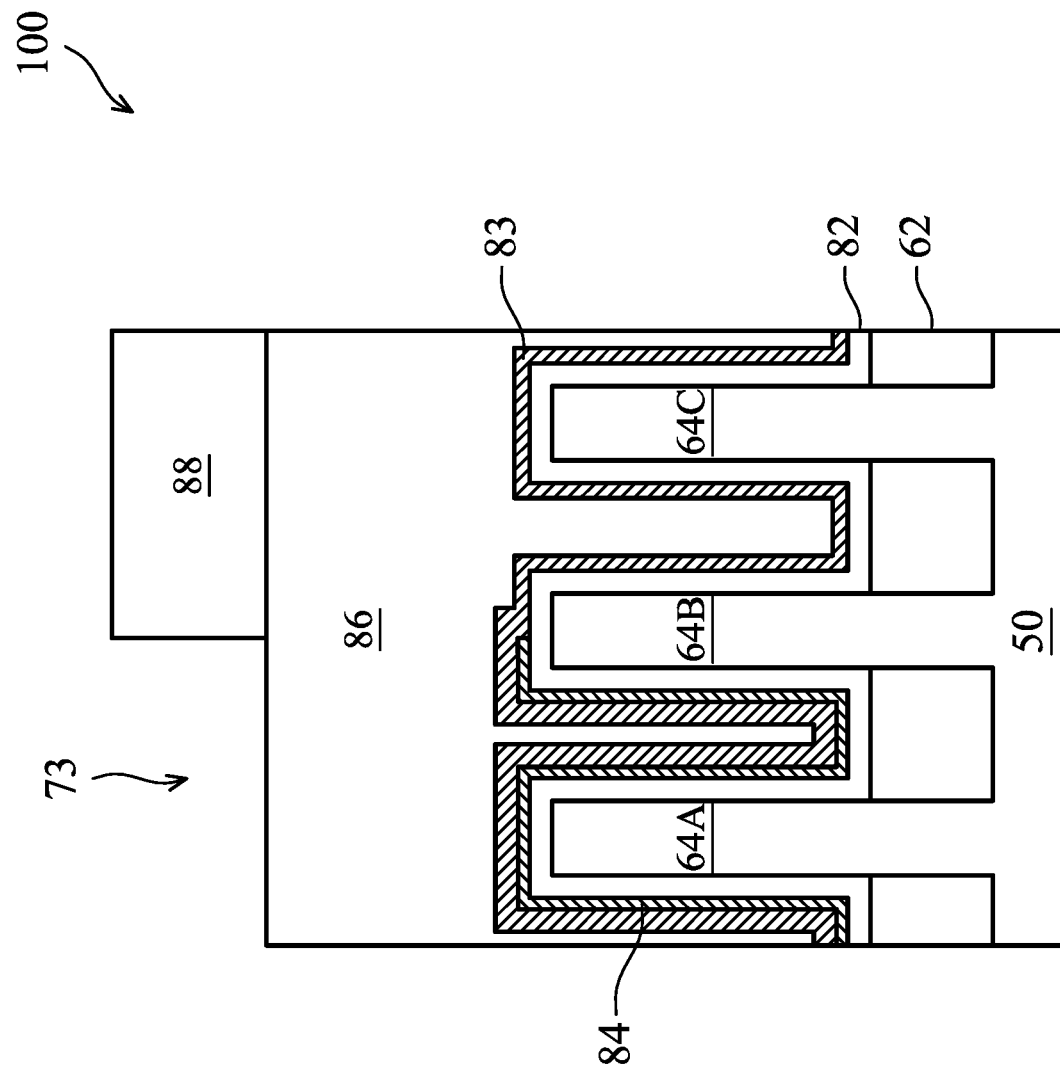

Next, in FIG. 14, a P-type work function layer 83 is conformally formed over the FinFET device 100 of FIG. 13. In the example of FIG. 14, the P-type work function layer 83 is over and contacts (the remaining portions of) the P-type work function layer 84 and the exposed portions of the gate dielectric layer 82. The P-type work function layer 83 is formed of a P-type work function material that is different from the P-type work function material of the P-type work function layer 84. In the illustrated embodiment, the P-type work function layer 83 is formed of a tungsten-containing materials, such as, tungsten, tungsten nitride, tungsten carbide, or tungsten oxide, and may be formed by a suitable deposition method such as CVD, PVD, ALD, or the like. A thickness of the P-type work function layer 83 may be between about 10 angstroms and about 30 angstroms.

Next, a photoresist, which includes the bottom anti-reflective coating (BARC) layer 86 and the top photoresist 88, is formed over the FinFET device 100 of FIG. 13. The photoresist may additionally include a middle layer (not shown). After being formed, the photoresist fills the spaces between the fins 64, as illustrated in FIG. 14. The top photoresist 88 is next patterned to form an opening 73, which opening 73 is over (e.g., directly over) portions (e.g., the left portion) of the fin 64B and over the fin 64A.

Figure 15:
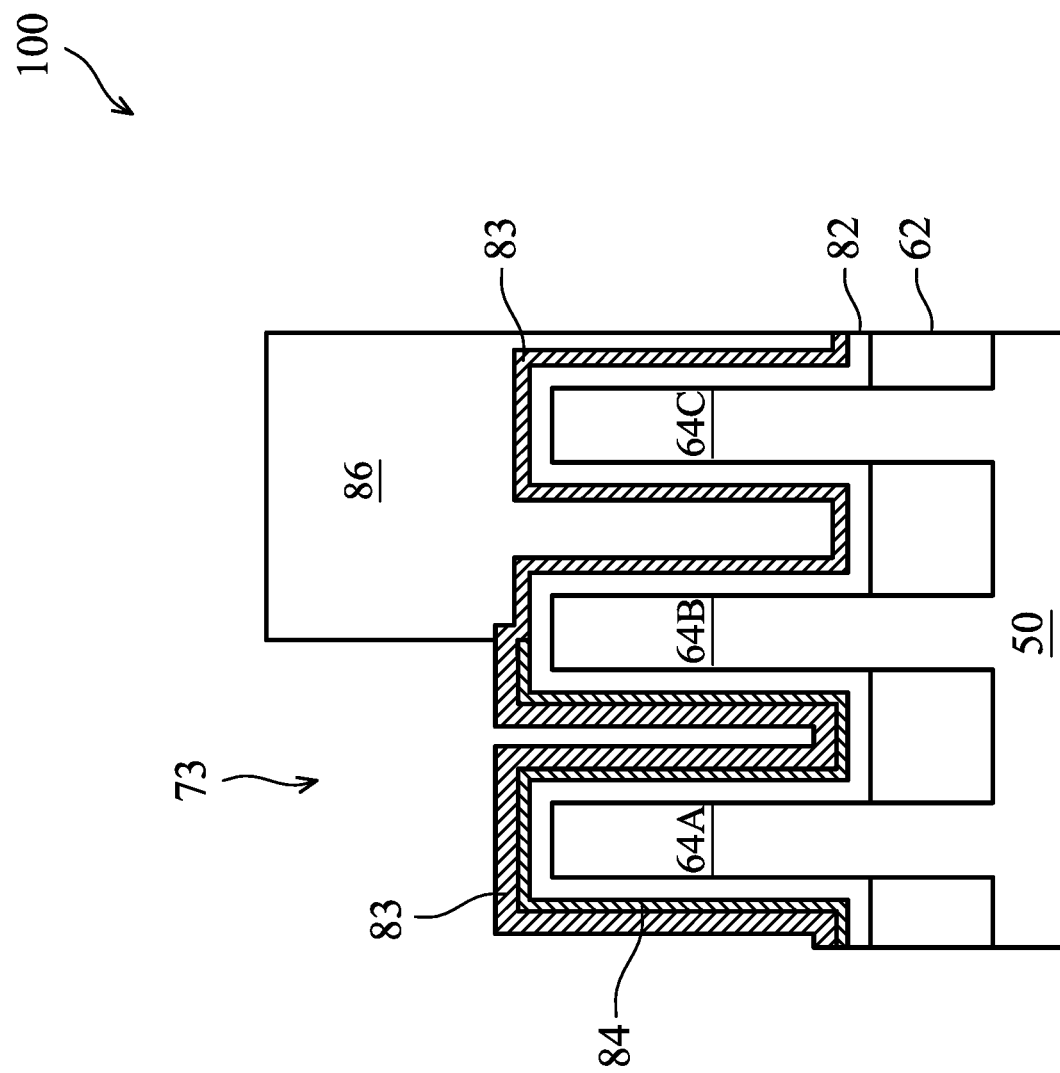

Next, in FIG. 15, the pattern of the top photoresist 88 is extended toward the substrate 50 and is transferred to the BARC layer 86 using, e.g., an isotropic etching process such as a plasma etch process, such that portions of the P-type work function layer 83 underlying the opening 73 are exposed. The top photoresist 88 may also be removed by the anisotropic etching process.

Figure 16:
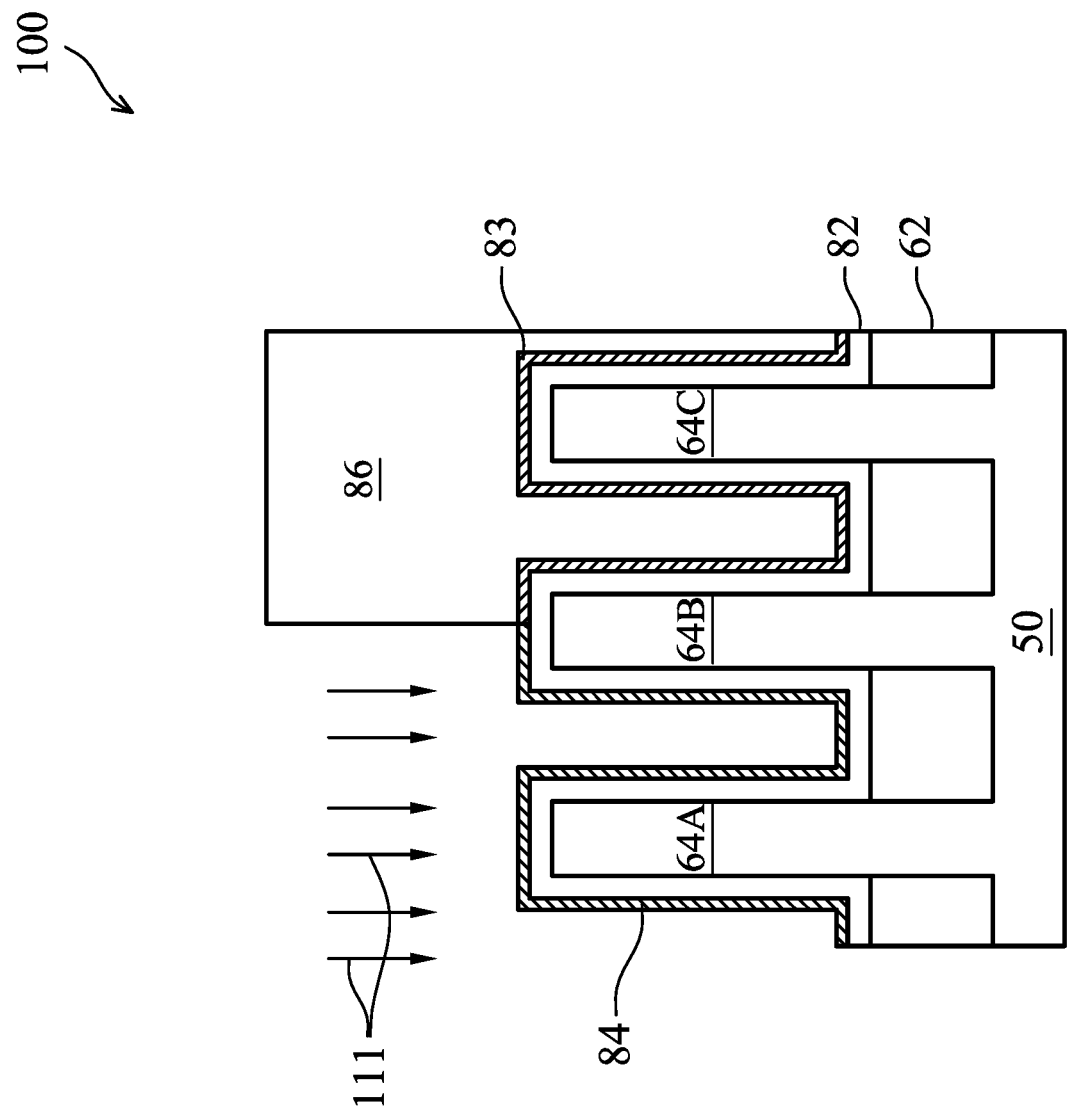

Next, in FIG. 16, a wet etch process 111 is performed to selectively remove the exposed portions of the P-type work function layer 83. The wet etch process uses a second etching chemical W2 that is selective to the P-type work function layer 83. In some embodiments, the second etching chemical W2 includes an etchant and an oxidizer. In an embodiment, the etchant is an acid, such as hydrogen chloride (HCl), phosphoric acid ($H_3PO_4$), hydrogen carbonate, or the like. The oxidizer used in the second etching chemical W2 may be, e.g., ozone ($O_3$). In some embodiments, the etchant (e.g., an acid) and the oxidizer are mixed in an aqueous solution, such as in de-ionized water (DIW), to form the second etching chemical W2. A concentration (e.g., volume concentration) of the etchant and the oxidizer in the second etching chemical W2 is higher than about 1%, such as between about 1% and about 10%. The wet etch process 111 may be performed at a room temperature, and for a duration between about 1 minute and about 5 minutes. Due to the etching selectivity of the wet etch process 111, the exposed portions of the P-type work function layer 83 are removed without substantially attacking the underlying gate dielectric layer 82.

Figure 17:
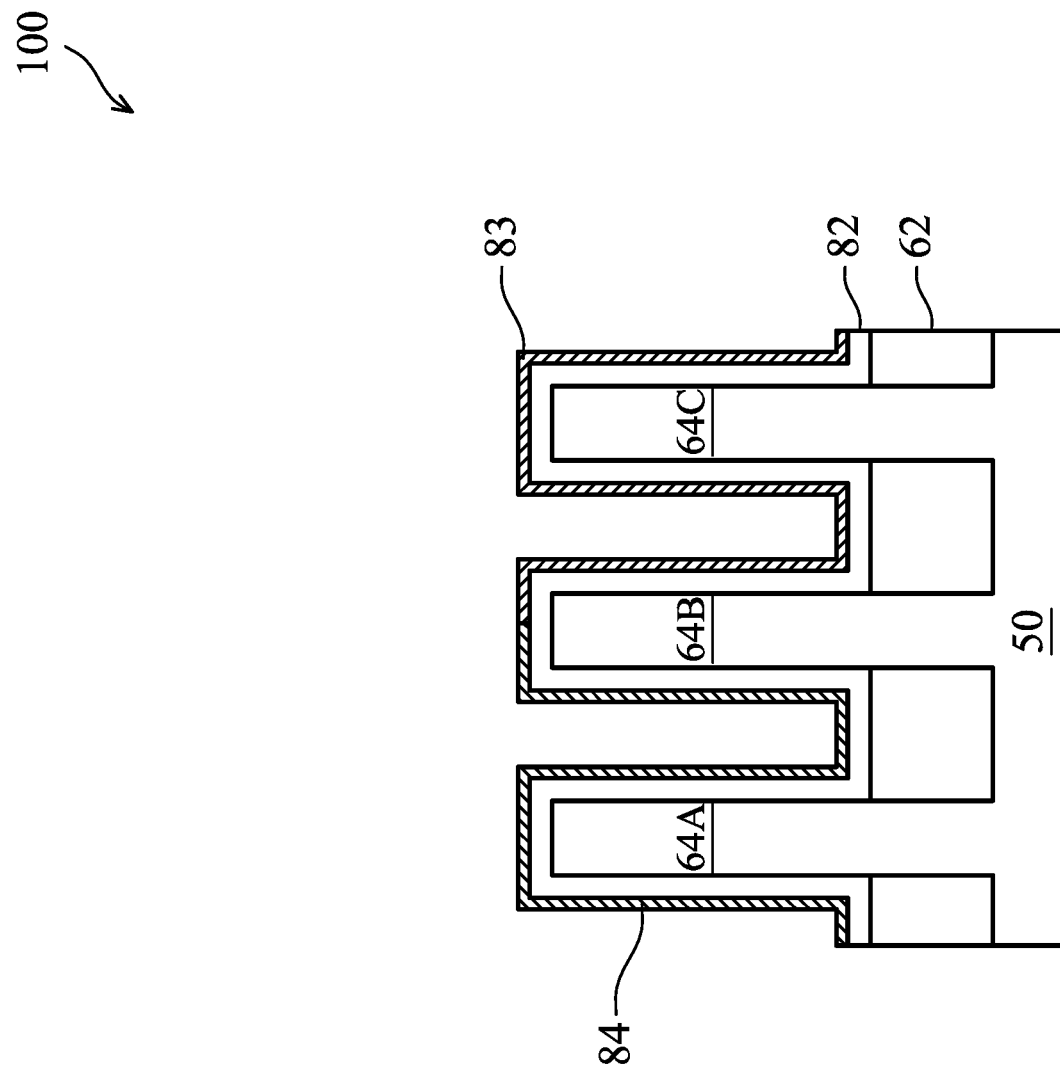

Next, in FIG. 17, the BARC layer 86 is removed using a suitable removal method, such as ashing. The (remaining portions of the) P-type work function layers 84 and 83 extend along and contact the gate dielectric layer 82. In the example of FIG. 17, the P-type work function layers 84 extends along sidewalls and an upper surface of the fin 64A, along a left sidewall of the fin 64B, and along a left portion of an upper surface of the fin 68B. The P-type work function layers 83 extends along sidewalls and an upper surface of the fin 64C, along a right sidewall of the fin 64B, and along a right portion of the upper surface of the fin 68B.

Figure 18:
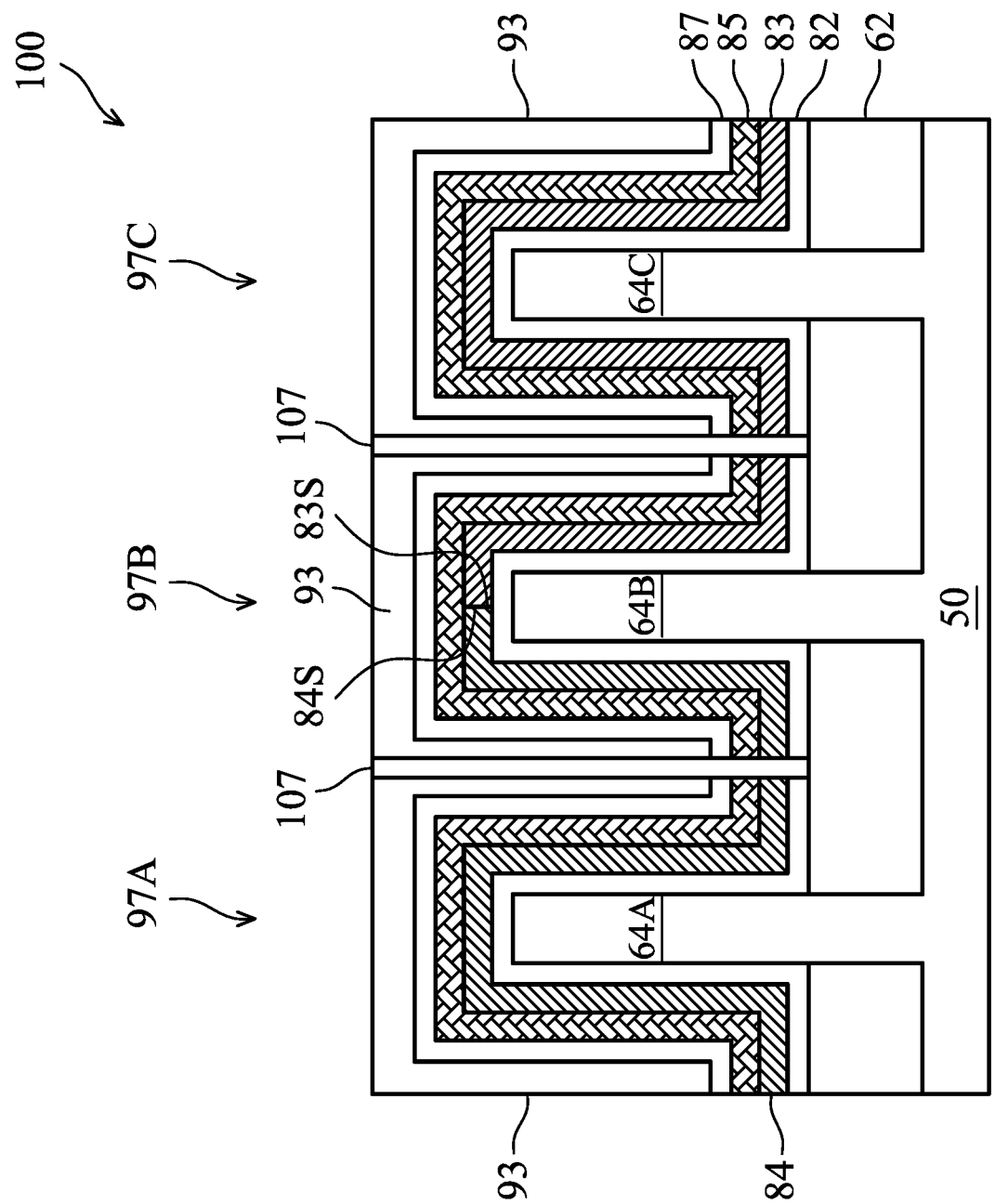

Next, in FIG. 18, an N-type work function layer 85 is conformally formed over and contacts (e.g., physically contacts) the P-type work function layers 84 and 83. Example N-type work function metals include Ti, Ag, TaAl, TaAlC, TiAlN, TaC, TaCN, TaSiN, Mn, Zr, other suitable N-type work function materials, or combinations thereof. In the illustrated embodiment, the N-type work function layer 85 is formed of an aluminum-containing material, such as aluminum, aluminum carbide, or aluminum nitride, and is formed of a suitable formation method such as PVD, CVD, ALD, or the like. A thickness of the N-type work function layer 85 may be between about 10 angstroms and about 30 angstroms, as an example.

Next, a glue layer 87 is formed conformally over the N-type work function layer 85. The glue layer 87 may act as an adhesive layer between the N-type work function layer 85 and a subsequently formed electrically conductive material 93. The glue layer 87 may be formed of a suitable material such as titanium, titanium nitride, or tantalum nitride using any suitable formation method. In some embodiments, the glue layer 87 is omitted.

Next, an electrically conductive material 93 is formed over the N-type work function layer 85, and over the glue layer 87 if formed. The electrically conductive material 93 (may also be referred to as a fill metal) fills the recess 69 (see, e.g., 69A, 69B, and 69C in FIG. 9) and forms the gate electrode of the metal gate. In an embodiment, the electrically conductive material 93 is tungsten, although other suitable electrically conductive material, such as cobalt, gold, copper, aluminum, combinations thereof, or the like, may also be used. A suitable formation method, such as plating, CVD, PVD, ALD, or the like, may be used to form the electrically conductive material 93.

In some embodiments, a cut-metal-gate process is performed to cut the electrically conductive material 93 and the various underlying layers (e.g., 87, 85, 84, 83, and 82) to form separate metal gates 97A, 97B, and 97C over the fins 64A, 64B, and 64C, respectively. For simplicity, the metal gates 97A, 97B, and 97C may be collectively referred to as metal gates 97, and each of the metal gates 97A, 97B, and 97C may be referred to as a metal gate 97. In an example cut-metal-gate process, openings (e.g., through holes) are formed between neighboring fins 64 that cut across the electrically conductive material 93 (e.g., in a top view) and extend from the electrically conductive material 93 to the STI regions 62 in the cross-sectional view of FIG. 18. A dielectric material(s) (e.g., silicon nitride, silicon oxide, or the like) is formed in the openings to form dielectric cut patterns 107 that cut the electrically conductive material 93 and the various underlying layers (e.g., 87, 85, 84, 83, and 82) to form separate metal gates 97A, 97B, and 97C.

In the example of FIG. 18, the metal gate 97A has the P-type work function layer 84 extending along sidewalls and an upper surface of the fin 64A, and the N-type work function layer 85 over the P-type work function layer 84. The metal gate 97C has the P-type work function layer 83 extending along sidewalls and an upper surface of the fin 64C, and the N-type work function layer 85 over the P-type work function layer 83. The metal gate 97B has the P-type work function layers 84/83 extending along and contacting the gate dielectric layer 82, and has the N-type work function layer 85 over the P-type work function layers 84/83. In particular, the metal gate 97B has the P-type work function layer 84 extending along a first sidewall (e.g., the left sidewall in FIG. 18) of the fin 64B and along a first portion (e.g., a left portion in FIG. 18) of the upper surface of the fin 64B. In addition, the metal gate 97B has the P-type work function layer 83 extending along a second sidewall (e.g., the right sidewall in FIG. 18) of the fin 64B and along a second portion (e.g., a right portion in FIG. 18) of the upper surface of the fin 64B. The various work function layers in a metal gate are collectively referred to as a work function layer stack. The metal gate 97B is referred to as having a hybrid work function layer stack, due to the mixture of the P-type work function layers 84/83.

The disclosed embodiments herein allow different metal gates (e.g., 97A, 97B, and 97C) to have different combinations of work function layers. The disclosed wet etch processes are highly selective, which allows specific work function layer(s) to be removed without attacking other layers in the metal gates. This allows flexible choices for the work function layers in the different metal gates, which in turns allows for different threshold voltages and performance for the different metal gates.

FIG. 19 illustrates a cross-sectional view of the metal gate 97A of FIG. 18 along cross-section D-D (see FIG. 7B). FIG. 20 illustrates a cross-sectional view of the metal gate 97B of FIG. 18 along cross-section E-E (see FIG. 7B). FIG. 21 illustrates a cross-sectional view of the metal gate 97C of FIG. 18 along cross-section F-F (see FIG. 7B).

FIG. 19 illustrates the various layers (e.g., 82, 84, 85, 87, and 93) of the metal gate 97A disposed in a gate trench (see, e.g., 69A, 69B, 69C in FIG. 9) and over the upper surface of the first ILD 90. The electrically conductive material 93 fills the remaining portions of the gate trench in FIG. 19. In some embodiments, when the gate trench is too narrow, the gate trench is completely filled after the glue layer 87 is formed, and therefore, the electrically conductive material 93 is formed over the upper surface of the glue layer 87. In other words, in some embodiments where the gate trench is too narrow, portions of the electrically conductive material 93 illustrated under the dashed line 87A (which is along the upper surface of the glue layer 87) in FIG. 19 are not formed, and instead, the glue layer 87 fills the center portion of the gate trench. Similar modifications to the metal gates due to the narrow gate trench may be possible for other metal gates (e.g., 97B, 97C), details are not repeated hereinafter.

FIG. 20 illustrates the various layers (e.g., 82, 83, 84, 85, 87, and 93) of the metal gate 97B disposed in a gate trench (see, e.g., 69A, 69B, 69C in FIG. 9) and over the upper surface of the first ILD 90. Note that the metal gate 97B has two different P-type work function layers 84 and 83 extending along and contacting the gate dielectric layer 82.

FIG. 21 illustrates the various layers (e.g., 82, 83, 85, 87, and 93) of the metal gate 97C disposed in a gate trench (see, e.g., 69A, 69B, 69C in FIG. 9) and over the upper surface of the first ILD 90. The P-type work function layer 83 of the metal gate 97C is different from the P-type work function layer 84 of the metal gate 97A.

FIGS. 22, 23, and 24 illustrate the cross-section views of the FinFET device 100 illustrated in FIGS. 19, 20, and 21, respectively, after additional processing. In particular, a planarization process, such as CMP, is performed to remove excess portions of the metal gates 97 that are disposed over the upper surface of the first ILD 90. Next, a second ILD 92 is formed over the first ILD 90, and contacts 102 (also referred to as contact plugs) are formed that electrically couple to underlying conductive features (e.g., source/drain regions 80, or metal gates 97). Details are discussed hereinafter.

Referring to FIGS. 22, 23, and 24, the second ILD 92 is formed over the first ILD 90. In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD.

Next, contact openings are formed through the second ILD 92 to expose the metal gates 97 (e.g., 97A, 97B, 97C). Contact openings are also formed through the first ILD 90 and the second ILD 92 to expose the source/drain regions 80. The contact openings may be formed using photolithography and etching.

After the contact openings are formed, silicide regions 95 are formed over the source/drain regions 80. In some embodiments, the silicide regions 95 are formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, the contacts 102 (e.g., 102A or 102B) are formed in the contact openings. Each of the contacts 102 includes a barrier layer 101, a seed layer 103, and an electrically conductive material 105, and is electrically coupled to the underlying conductive feature (e.g., metal gate 97, or silicide region 95), in the illustrated embodiment. The contacts 102A that are electrically coupled to the metal gates 97 may be referred to as gate contacts, and the contacts 102B that are electrically coupled to the silicide regions 95 may be referred to as source/drain contacts.

In some embodiments, the barrier layer 101 is formed conformally along sidewalls and bottoms of the contact openings. The barrier layer 101 may comprise an electrically conductive material such as titanium nitride, although other materials, such as tantalum nitride, titanium, tantalum, or the like, may alternatively be utilized. The barrier layer 101 may be formed using a CVD process, such as PECVD. However, other alternative processes, such as sputtering, metal organic chemical vapor deposition (MOCVD), or ALD, may alternatively be used.

Next, the seed layer 103 is formed conformally over the barrier layer 101. The seed layer 103 may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer 103 may comprise a titanium layer and a copper layer over the titanium layer.

Next, the electrically conductive material 105 is deposited over the seed layer 103, and fills the remaining portions of the contact openings. The electrically conductive material 105 may be made of a metal-containing material such as gold, aluminum, tungsten, cobalt, the like, combinations thereof, or multi-layers thereof, and may be formed by, e.g., electroplating, electroless plating, or other suitable method. After the formation of the electrically conductive material 105, a planarization process, such as a CMP, may be performed to remove the excess portions of the barrier layer 101, the seed layer 103, and the electrically conductive material 105, which excess portions are over the top surface of the second ILD 92. The resulting remaining portions of the barrier layer 101, the seed layer 103, and the electrically conductive material 105 thus form the contacts 102 of the resulting FinFET device 100.

Variations to the disclosed embodiments are possible and are fully intended to be included within the scope of the present disclosure. For example, in the example of FIG. 18, a sidewall 84S of the P-type work function layer 84 adjoins (e.g., physically contacts or connects) a sidewall 83S of the P-type work function layer 83 at the upper surface of the fin 64B. However, due to process variations and/or inaccuracy of the photolithography processes (e.g., used to form the patterned top photoresist 88), the location where the P-type work function layers 84/83 connect, and/or the shapes of the P-type work function layers 84/83 at the location where the P-type work function layers 84/83 connect, may differ from the example of FIG. 18 (and FIG. 20). Various alternative embodiments are discussed hereinafter.

Figure 25A:
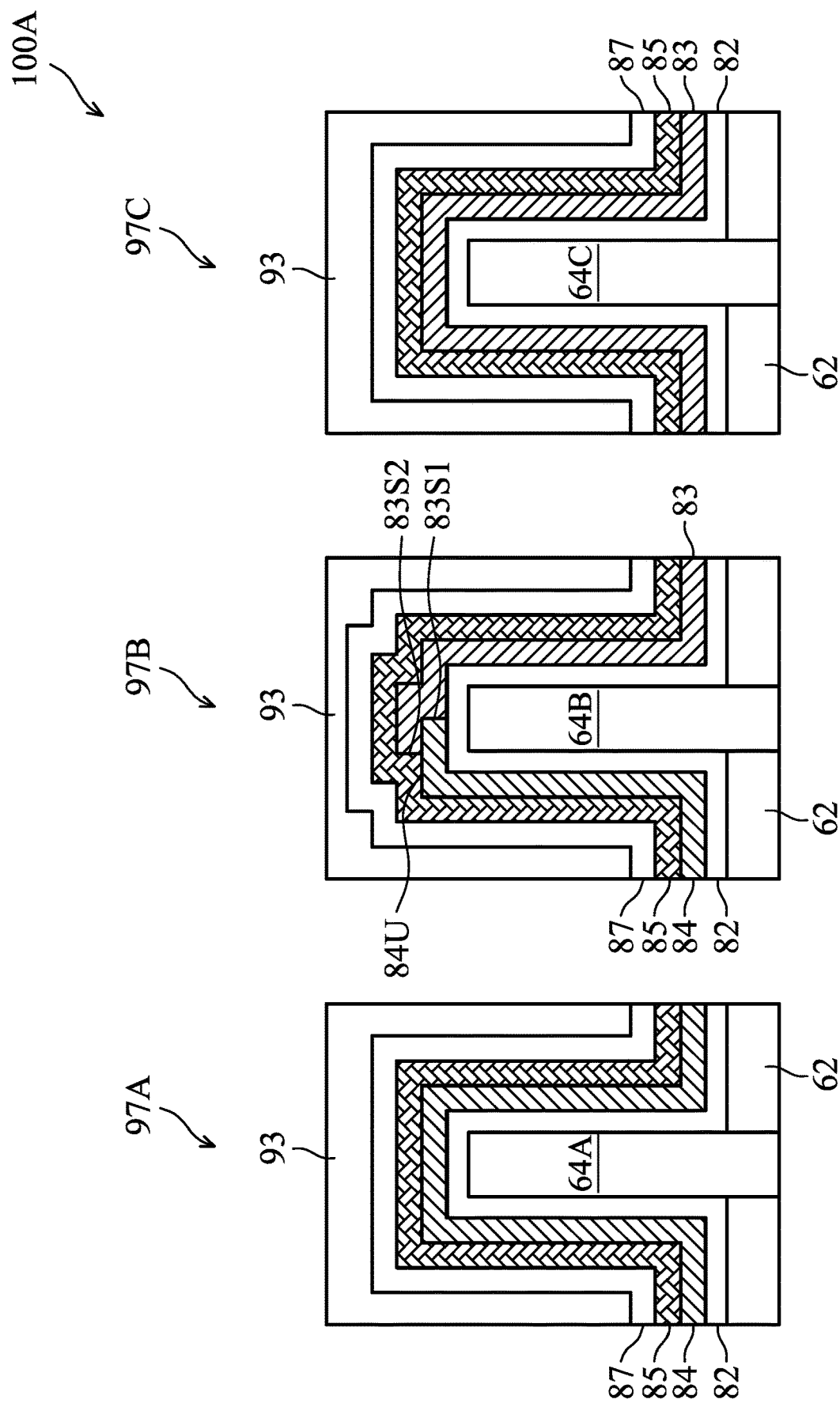
FIGS. 25A and 25B illustrate cross-sectional views of a semiconductor device at a stage of fabrication, in an embodiment.
Figure 25B:
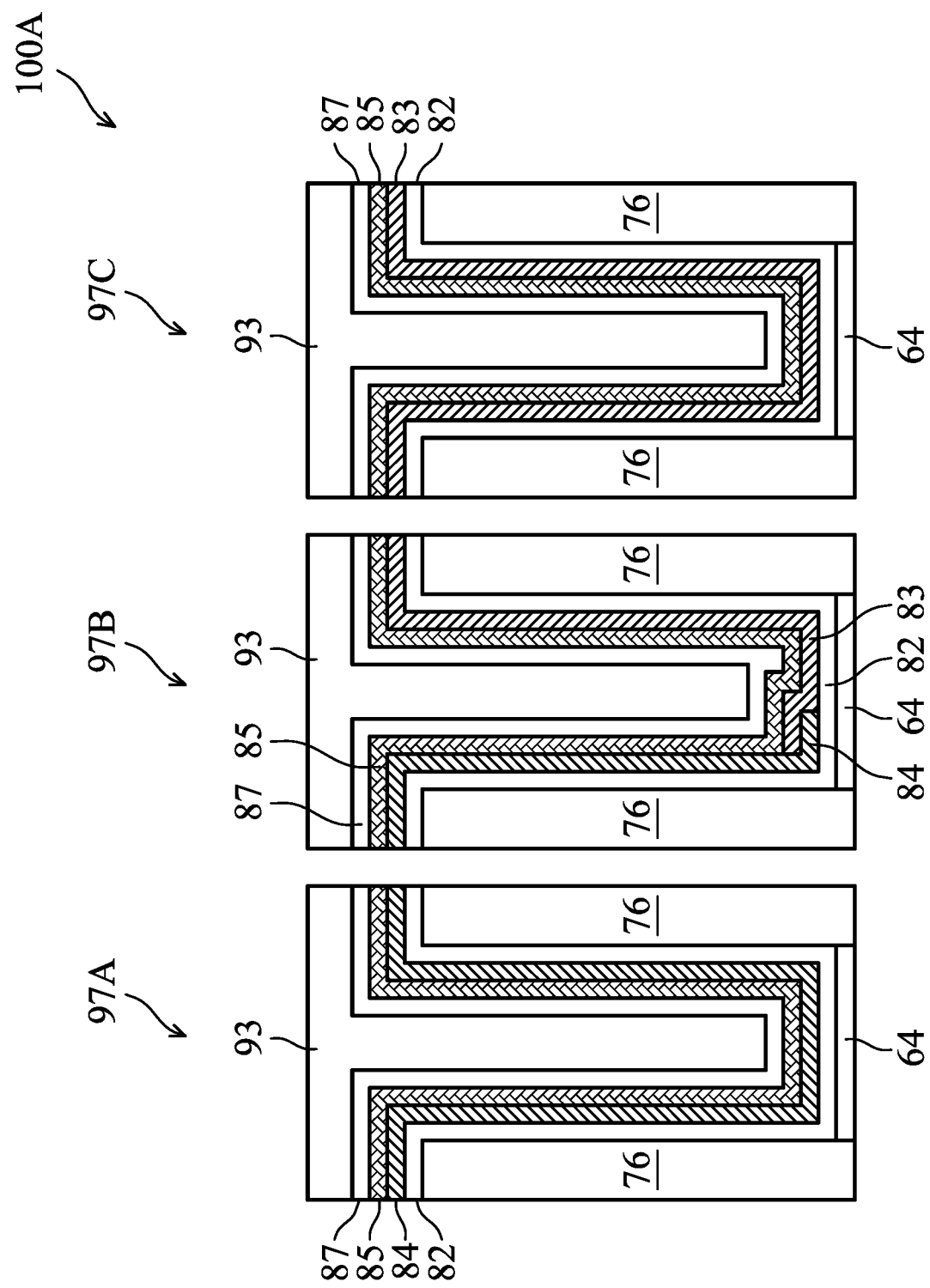

FIGS. 25A and 25B illustrate cross-sectional views of a FinFET device 100A at a stage of fabrication along different cross-sections, in an embodiment. For simplicity, only portions of the FinFET device 100A around the fins 64 are illustrated. In addition, details of certain features, such as the gate spacers 76, may be simplified. The FinFET device 100A illustrated in FIG. 25A is similar to the FinFET device 100 illustrated in FIG. 18. FIG. 25B illustrates the corresponding cross-sectional views of the gate trenches of the metal gates 97A, 97B, and 97C illustrated in FIG. 25A.

In the embodiment of FIGS. 25A and 25B, at the location where the P-type work function layers 84 and 83 adjoin, a portion of the P-type work function layer 83 extends over an upper surface 84U of the P-type work function layer 84. As a result, a first sidewall 83S1 of the P-type work function layer 83 physically contacts a sidewall of the P-type work function layer 84, and a second sidewall 83S2 of the P-type work function layer 83 is disposed above the upper surface 84U of the P-type work function layer 84.

Figure 26A:
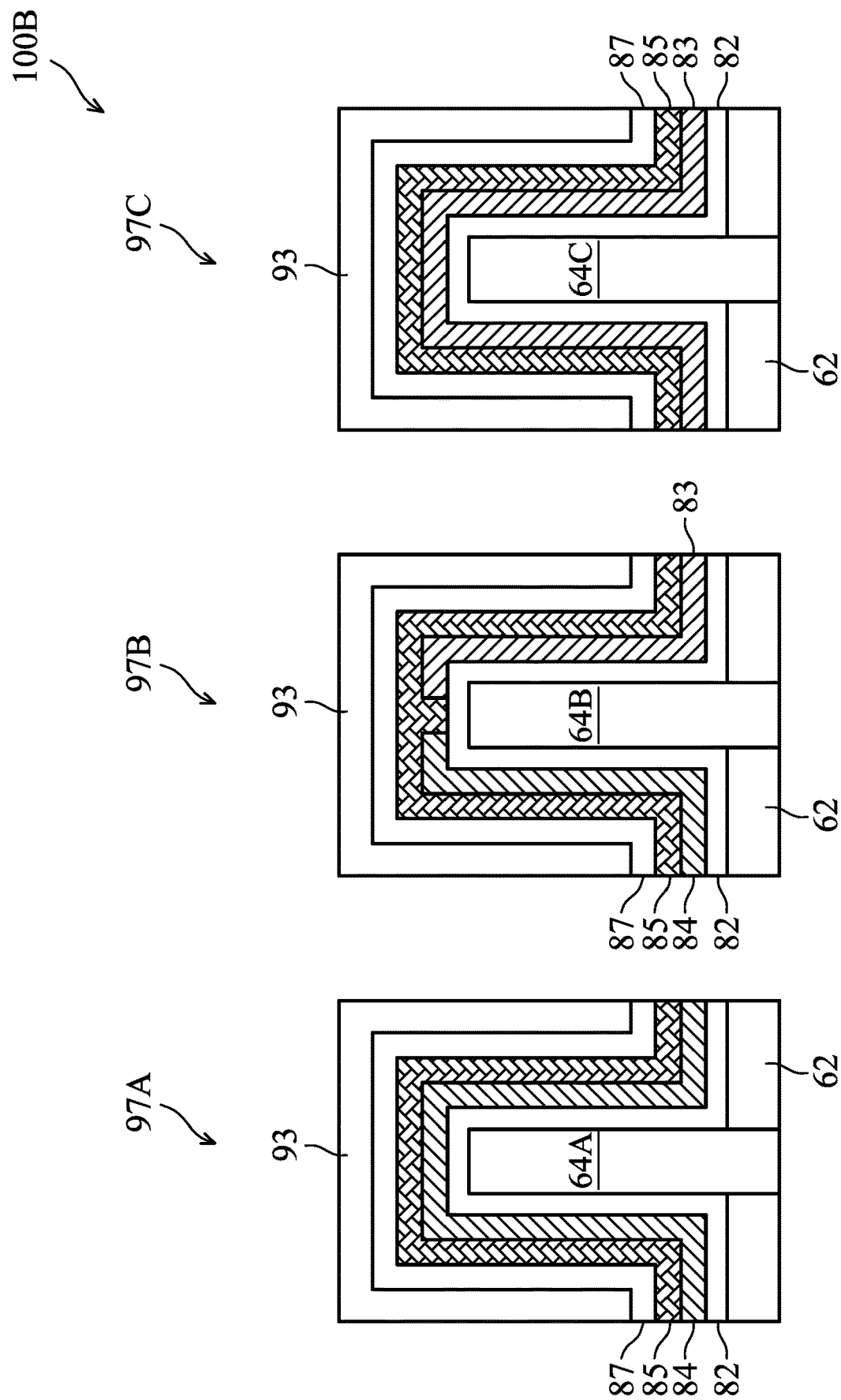

FIGS. 26A and 26B illustrate cross-sectional views of a FinFET device 100B at a stage of fabrication along different cross-sections, in an embodiment. The embodiment of FIGS. 26A and 26B is similar to that of FIGS. 25A and 25B. However, the P-type work function layers 83 and 84 do not connect with each other over the upper surface of the fin 64B, and there is a gap between the P-type work function layers 83 and 84. As a result, a portion of the N-type work function layer 85 fills the gap, and physically contacts the gate dielectric layer 82 and respective sidewalls of the P-type work function layers 83/84.

Figure 27A:
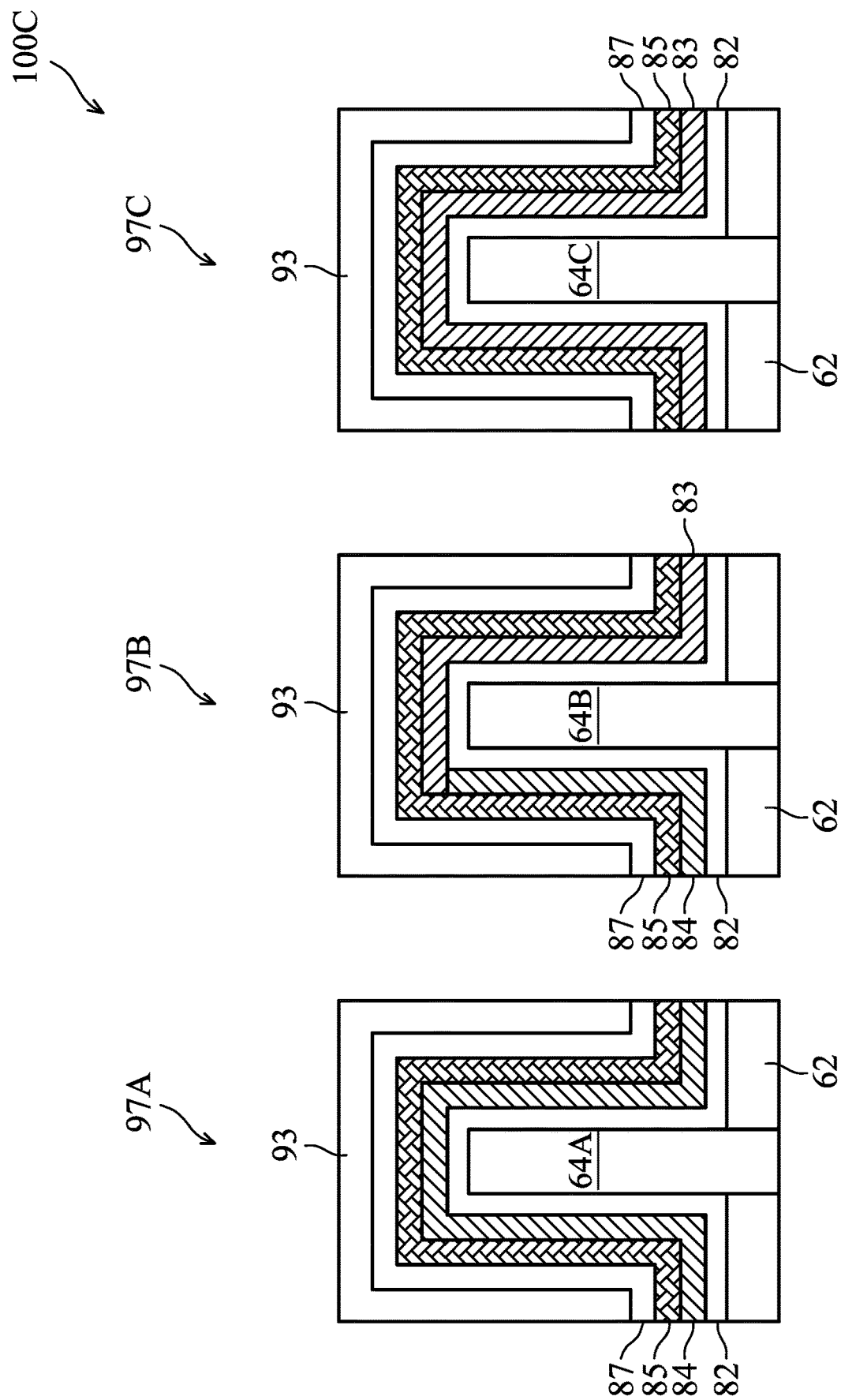
FIGS. 27A and 27B illustrate cross-sectional views of a semiconductor device at a stage of fabrication, in an embodiment.
Figure 27B:
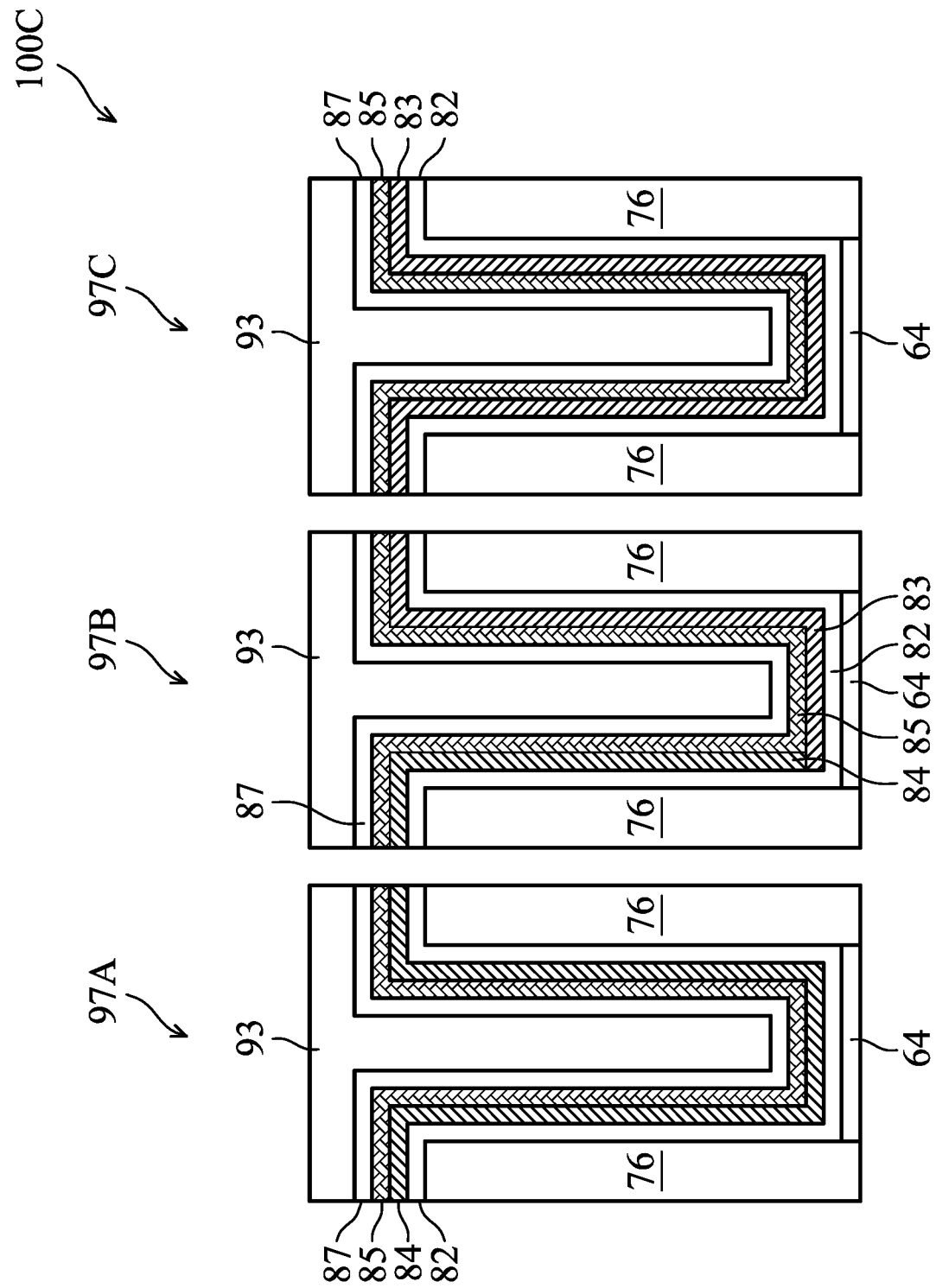

FIGS. 27A and 27B illustrate cross-sectional views of a FinFET device 100C at a stage of fabrication along different cross-sections, in an embodiment. The embodiment of FIGS. 27A and 27B is similar to that of FIGS. 25A and 25B.

However, as illustrated in FIG. 27A, the P-type work function layer 83 extends along a first sidewall (e.g., the right sidewall) and an upper surface of the fin 64B, and the P-type work function layer 84 extends along a second sidewall (e.g., the left sidewall) of the fin 64B but not along the upper surface of the fin 64B.

Figure 28A:
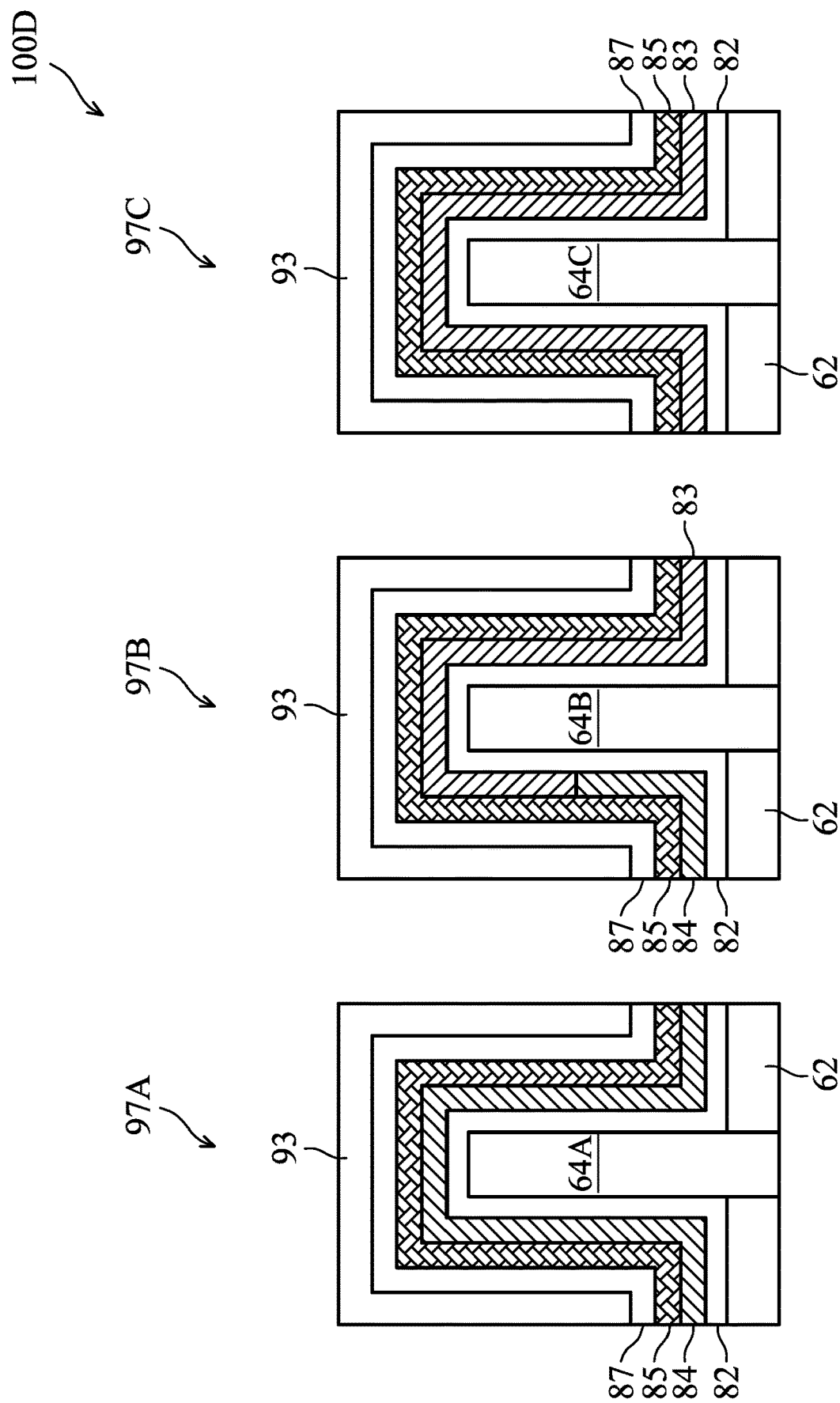
FIGS. 28A and 28B illustrate cross-sectional views of a semiconductor device at a stage of fabrication, in an embodiment.
Figure 28B:
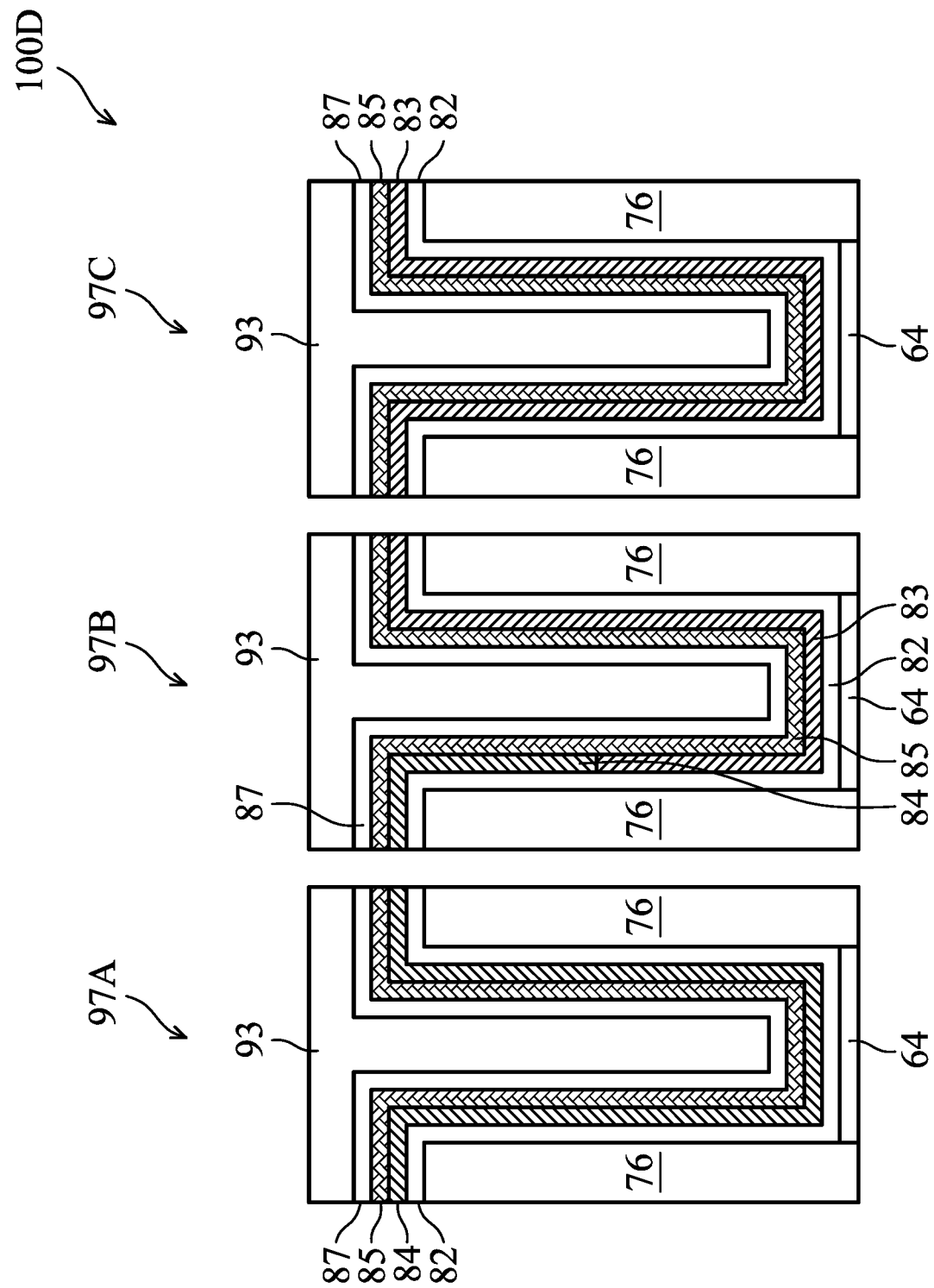

FIGS. 28A and 28B illustrate cross-sectional views of a FinFET device 100D at a stage of fabrication along different cross-sections, in an embodiment. The embodiment of FIGS. 28A and 28B is similar to that of FIGS. 25A and 25B. However, as illustrated in FIG. 28A, the P-type work function layer 83 extends along a first sidewall (e.g., the right sidewall), an upper surface, and an upper portion of a second sidewall (e.g., the left sidewall) of the fin 64B, and the P-type work function layer 84 extends along a lower portion of the second sidewall of the fin 64B but not along the upper surface of the fin 64B. Therefore, the P-type work function layer 84 adjoins the P-type work function layer 83 at a location proximate to the second sidewall of the fin 64B.

Figure 29A:
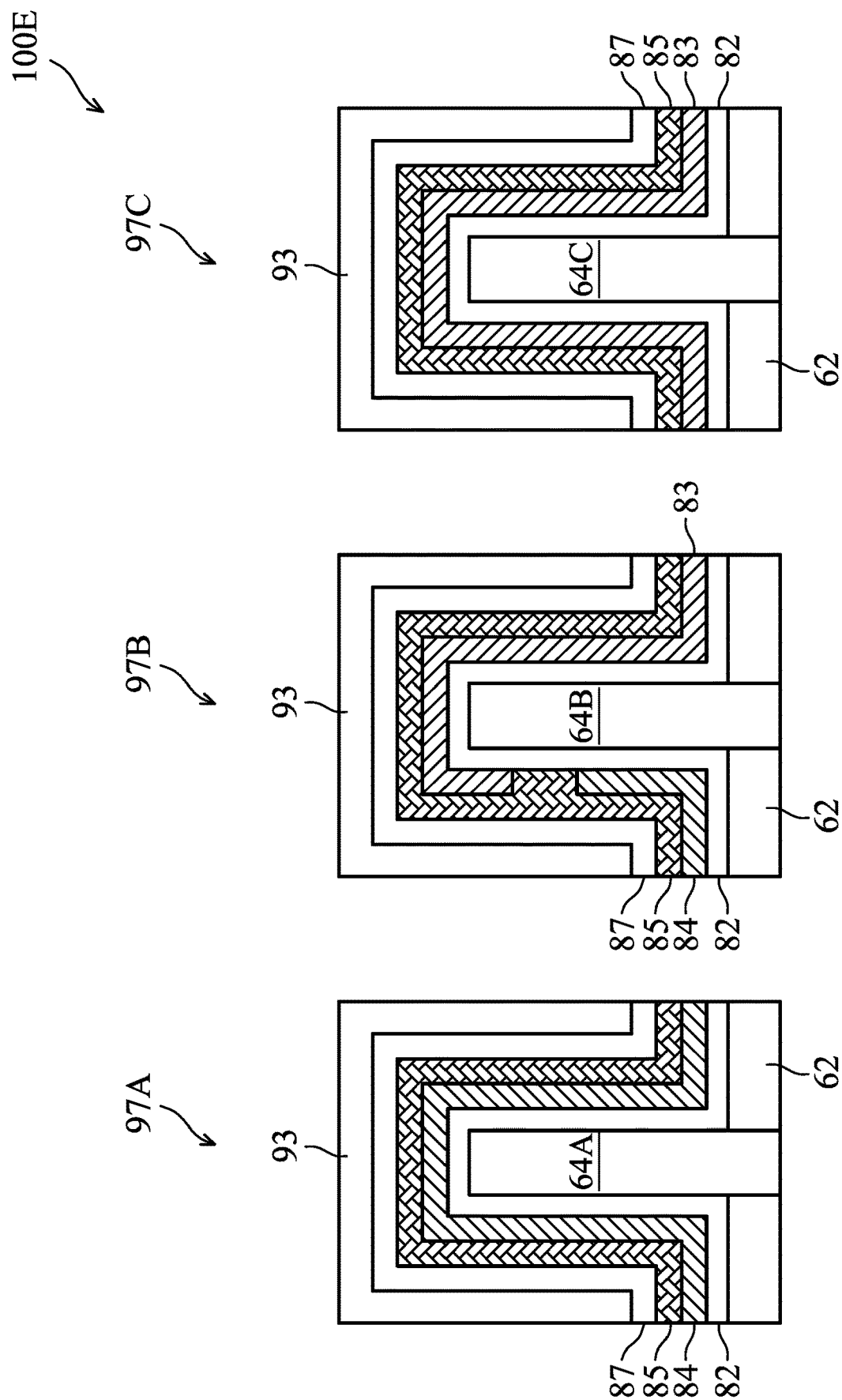
FIGS. 29A and 29B illustrate cross-sectional views of a semiconductor device at a stage of fabrication, in an embodiment.
Figure 29B:
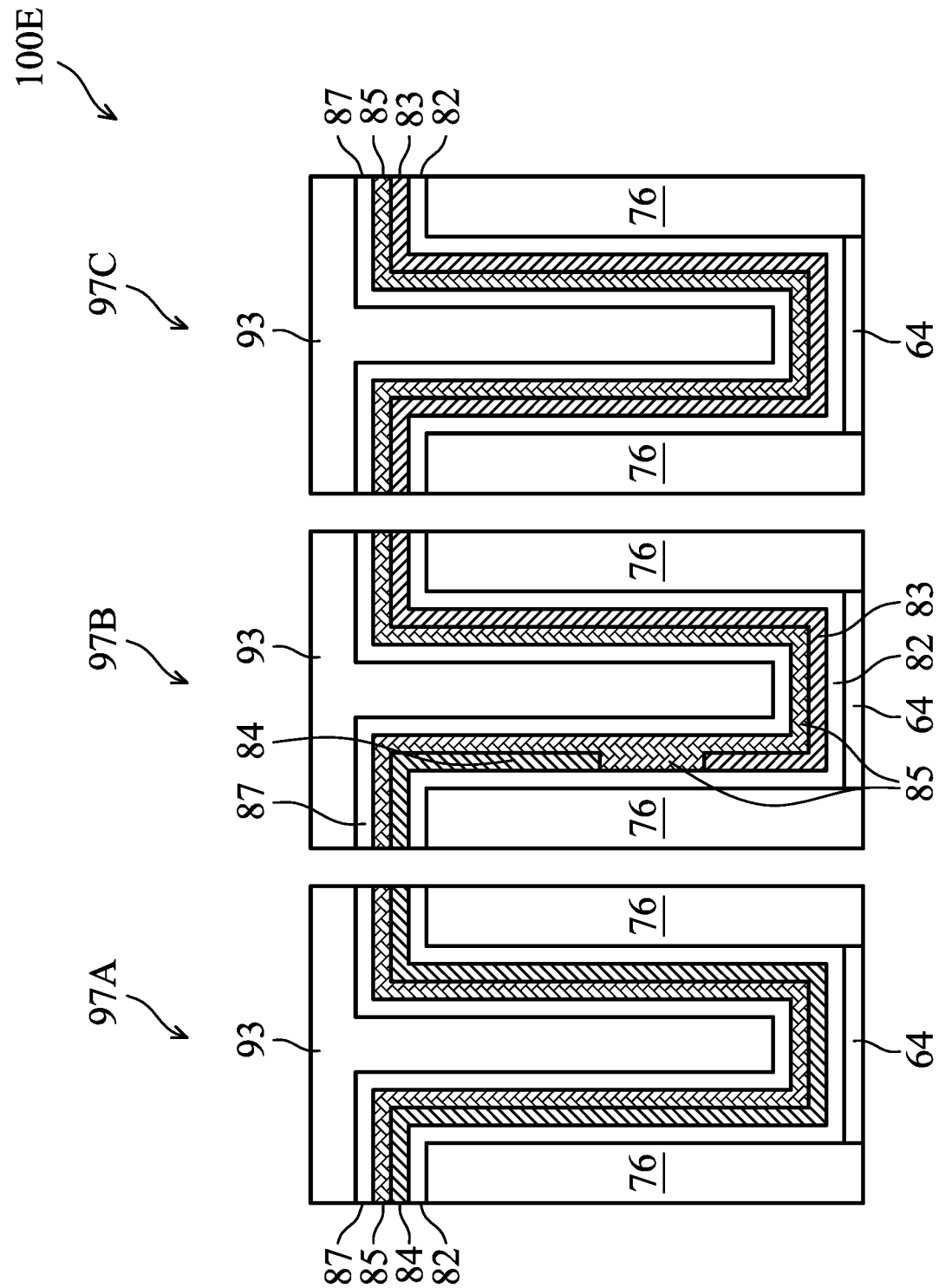

FIGS. 29A and 29B illustrate cross-sectional views of a FinFET device 100E at a stage of fabrication along different cross-sections, in an embodiment. The embodiment of FIGS. 29A and 29B is similar to that of FIGS. 28A and 28B. However, unlike the embodiment of FIGS. 28A and 28B, the P-type work function layer 84 does not adjoin the P-type work function layer 83 at a location proximate to the second sidewall of the fin 64B. Instead, there is a gap between the P-type work function layers 83 and 84, and as a result, the N-type work function layer 85 fills the gap at the location proximate to the second sidewall (e.g., the left sidewall in FIG. 29A) of the fin 64B.

Figure 30A:
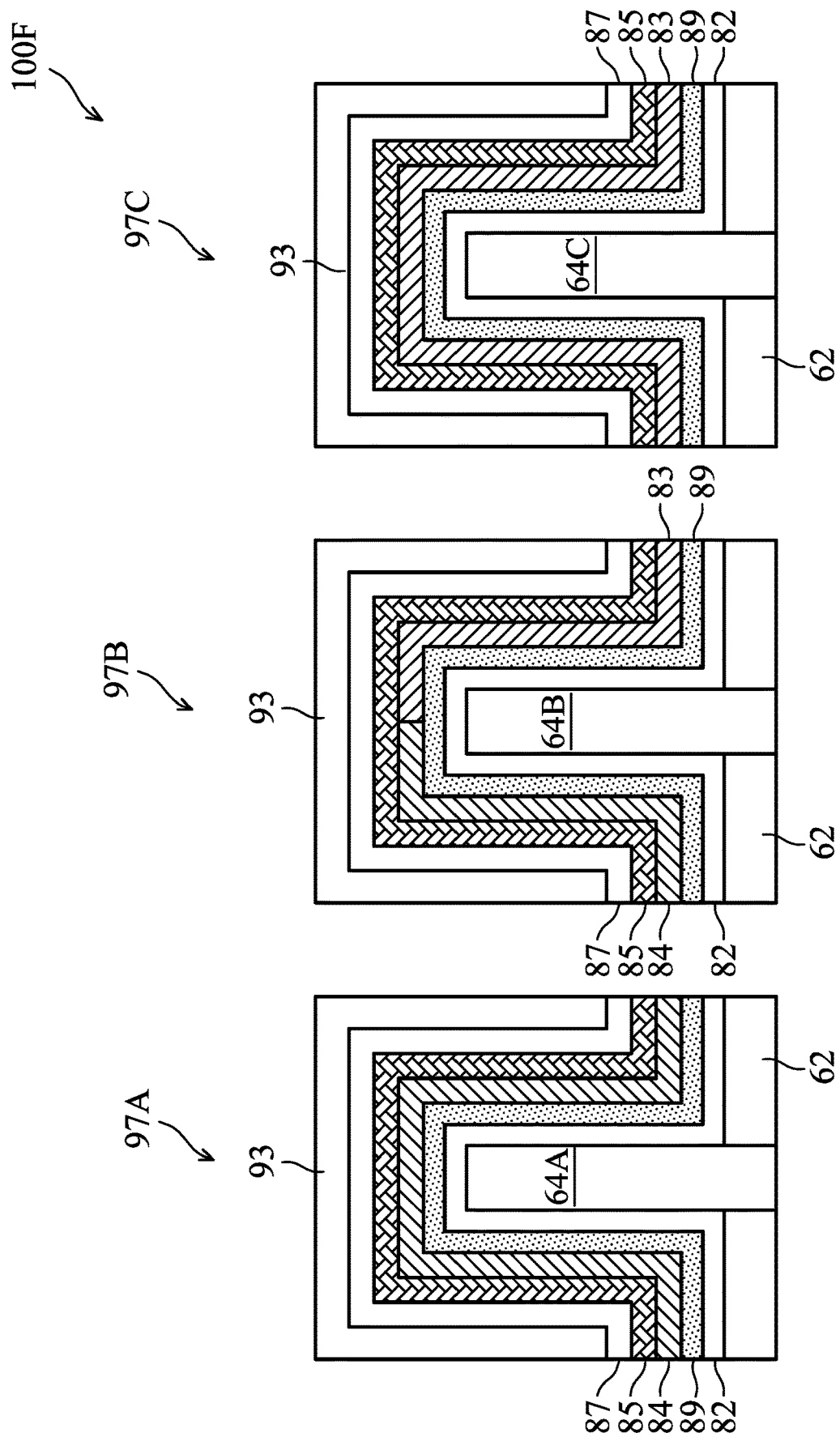
FIGS. 30A and 30B illustrate cross-sectional views of a semiconductor device at a stage of fabrication, in an embodiment.
Figure 30B:
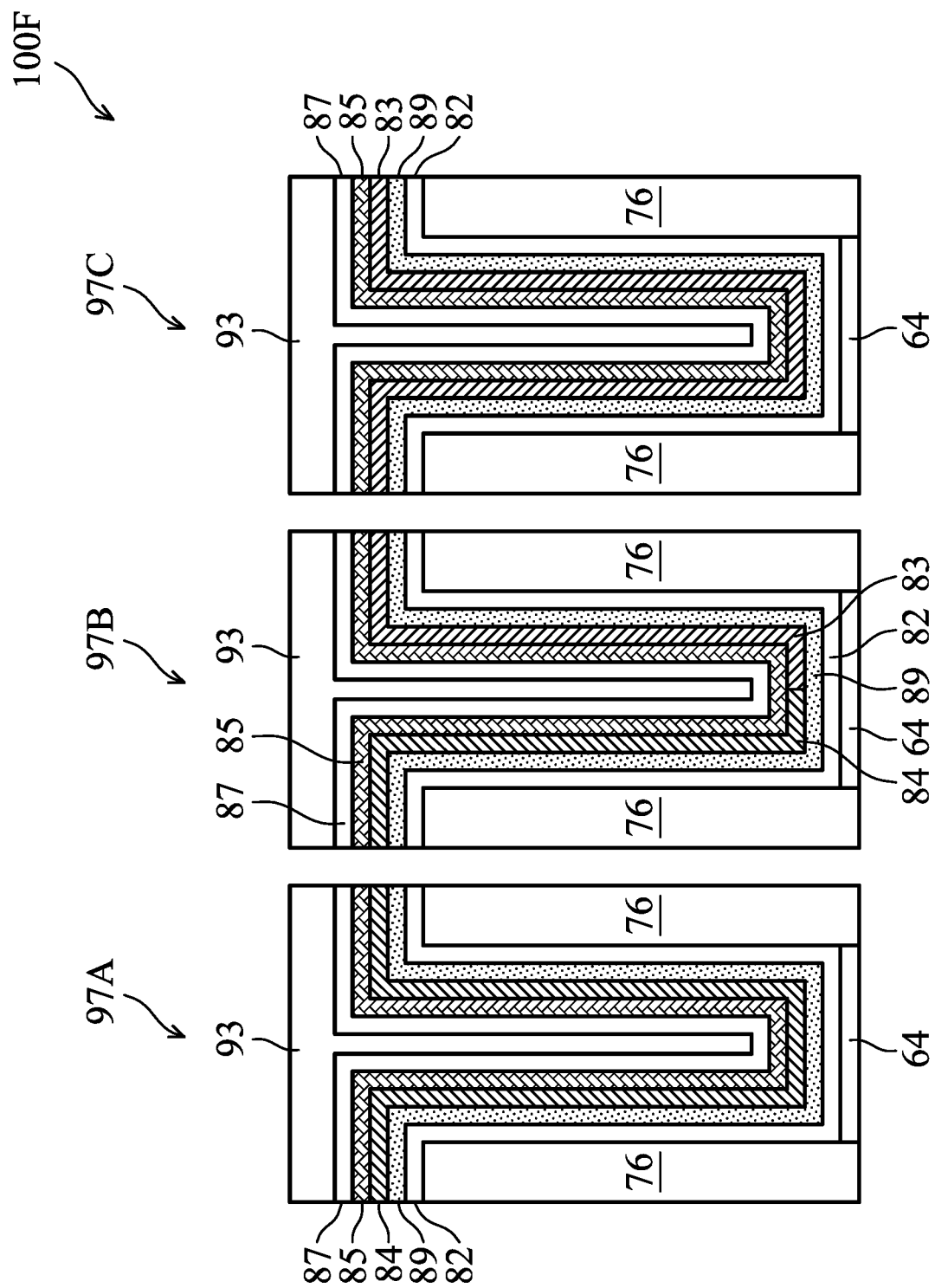

FIGS. 30A and 30B illustrate cross-sectional views of a FinFET device 100F at a stage of fabrication along different cross-sections, in an embodiment. The embodiment of FIG. 30A is similar to that of FIG. 18. FIG. 30B illustrates an embodiment cross-sectional view of the gate trench of the FinFET device of FIG. 30A. In FIGS. 30A and 30B, a layer 89 is formed conformally over the gate dielectric layer 82 before the P-type work function layers 84/83 are formed. In some embodiments, the layer 89 is a P-work function layer or a barrier layer, and is formed of a tantalum-containing material (e.g., tantalum or tantalum nitride) or a titanium-containing material (e.g., titanium nitride). In some embodiments, the layer 89 is an etch stop layer, and is formed of a silicon-based material such as silicon nitride or silicon oxide. A thickness of the layer 89 may be between about 10 angstroms and about 30 angstroms. The layer 89 may be formed using a suitable formation method such as CVD, PVD, ALD, or the like.

Figure 31A:
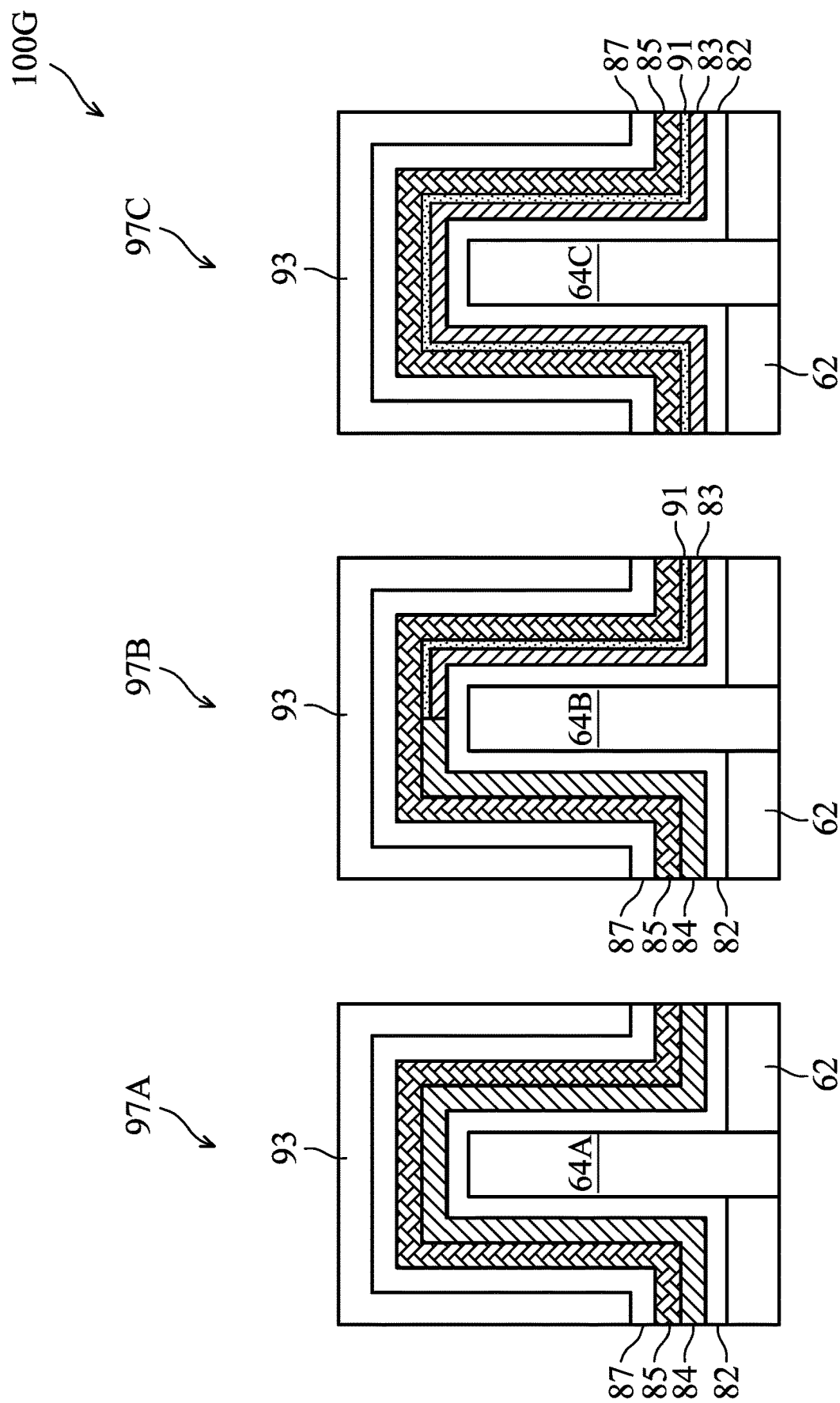
FIGS. 31A and 31B illustrate cross-sectional views of a semiconductor device at a stage of fabrication, in an embodiment.
Figure 31B:
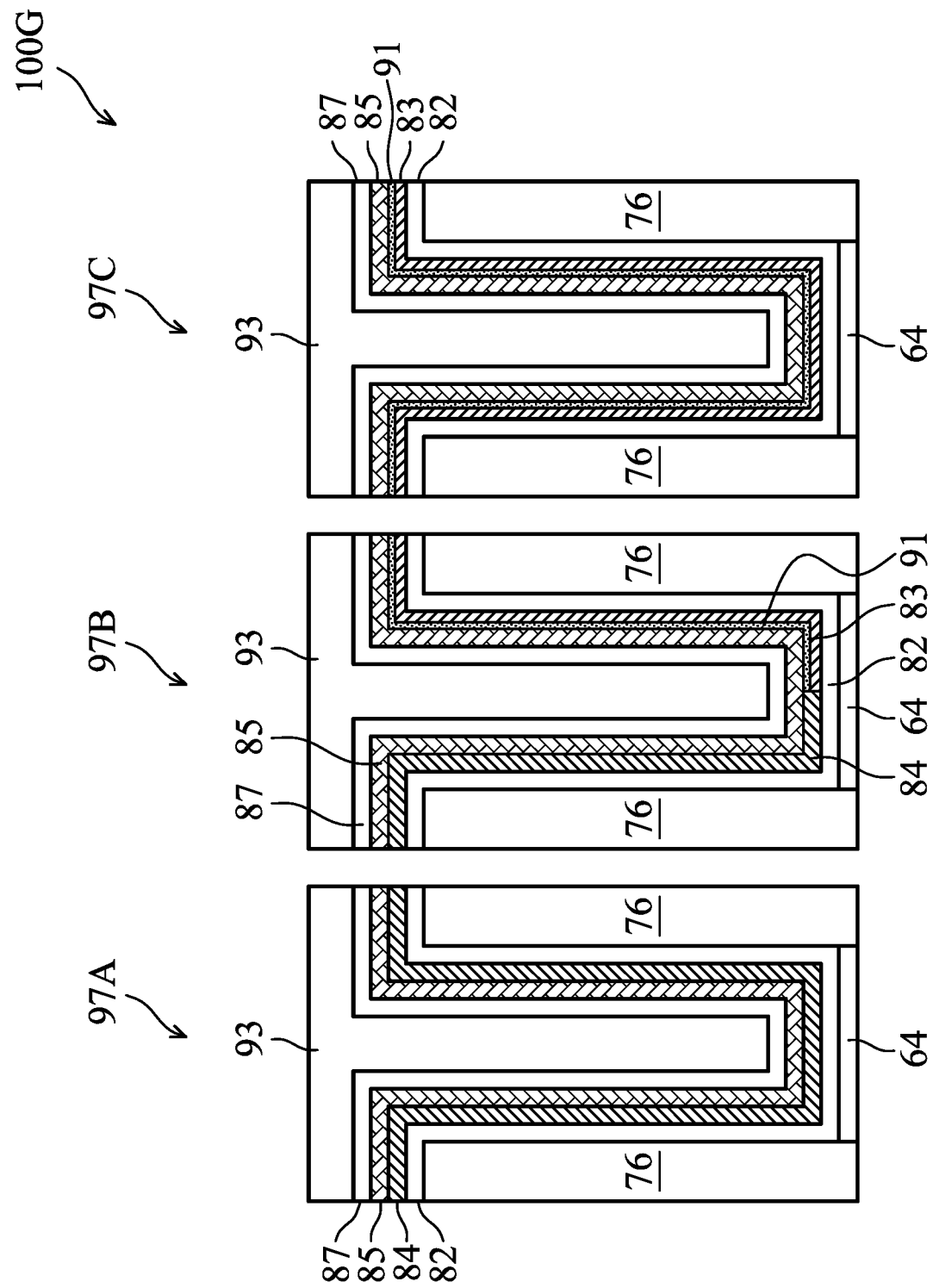

FIGS. 31A and 31B illustrate cross-sectional views of a FinFET device 100G at a stage of fabrication along different cross-sections, in an embodiment. The embodiment of FIG. 31A is similar to that of FIG. 18. FIG. 31B illustrates an embodiment cross-sectional view of the gate trench of the FinFET device of FIG. 31A. In FIGS. 31A and 31B, a capping layer 91 is formed directly over and contacting the P-type work function layer 83. Sidewalls of the capping layer 91 are vertically aligned with respectively sidewalls of the P-type work function layer 83. A first sidewall (e.g., left sidewall) of the capping layer 91 and a first sidewall (e.g., left sidewall) of the P-type work function layer 83 contact a respective sidewall of the P-type work function layer 84. The capping layer 91 may be formed of a silicon-containing material such as silicon nitride or silicon, and may be formed by a suitable method such as ALD. A thickness of the capping layer 91 is about 10 angstroms or less.

Figure 32A:
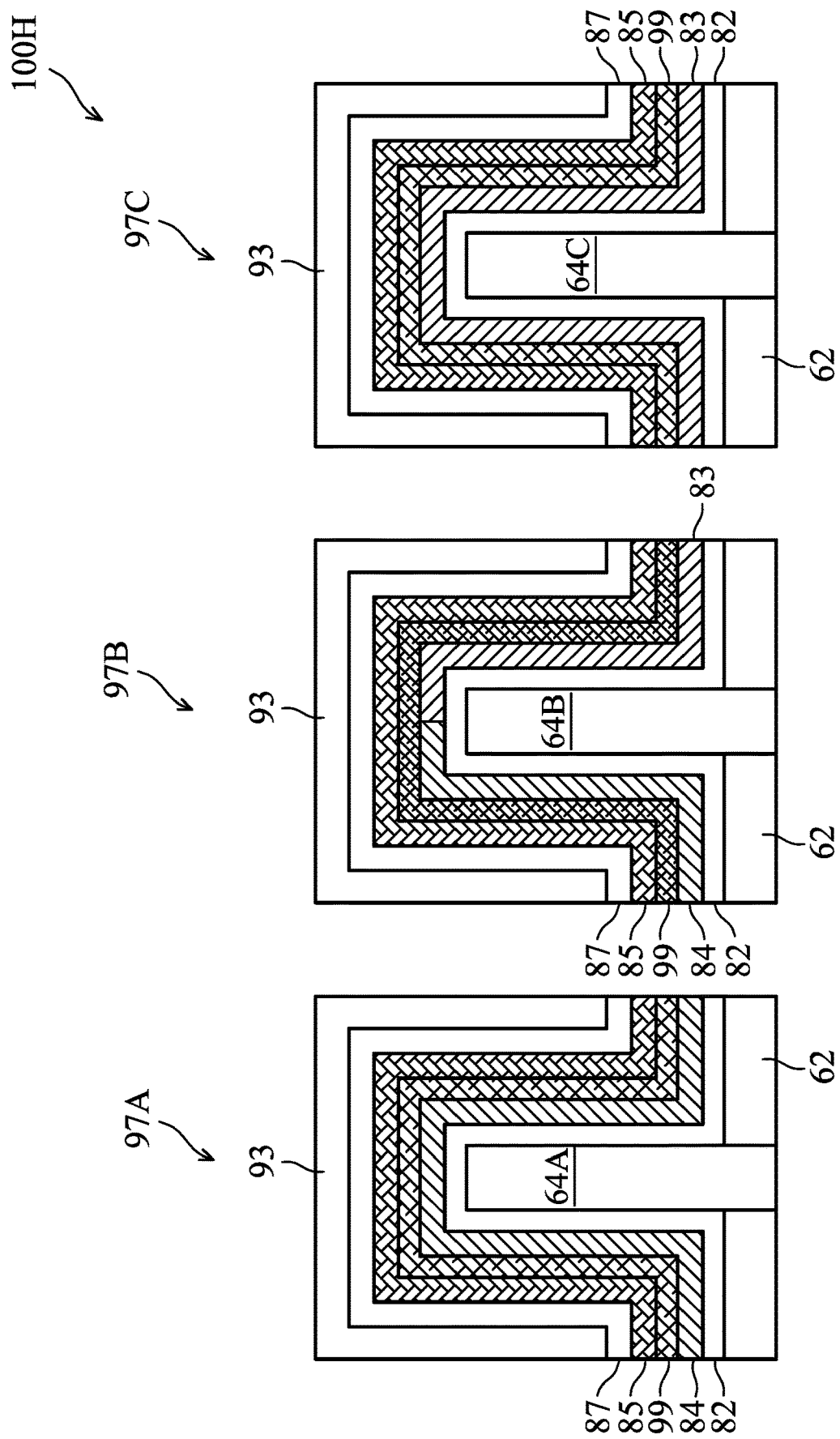
FIGS. 32A and 32B illustrate cross-sectional views of a semiconductor device at a stage of fabrication, in an embodiment.
Figure 32B:
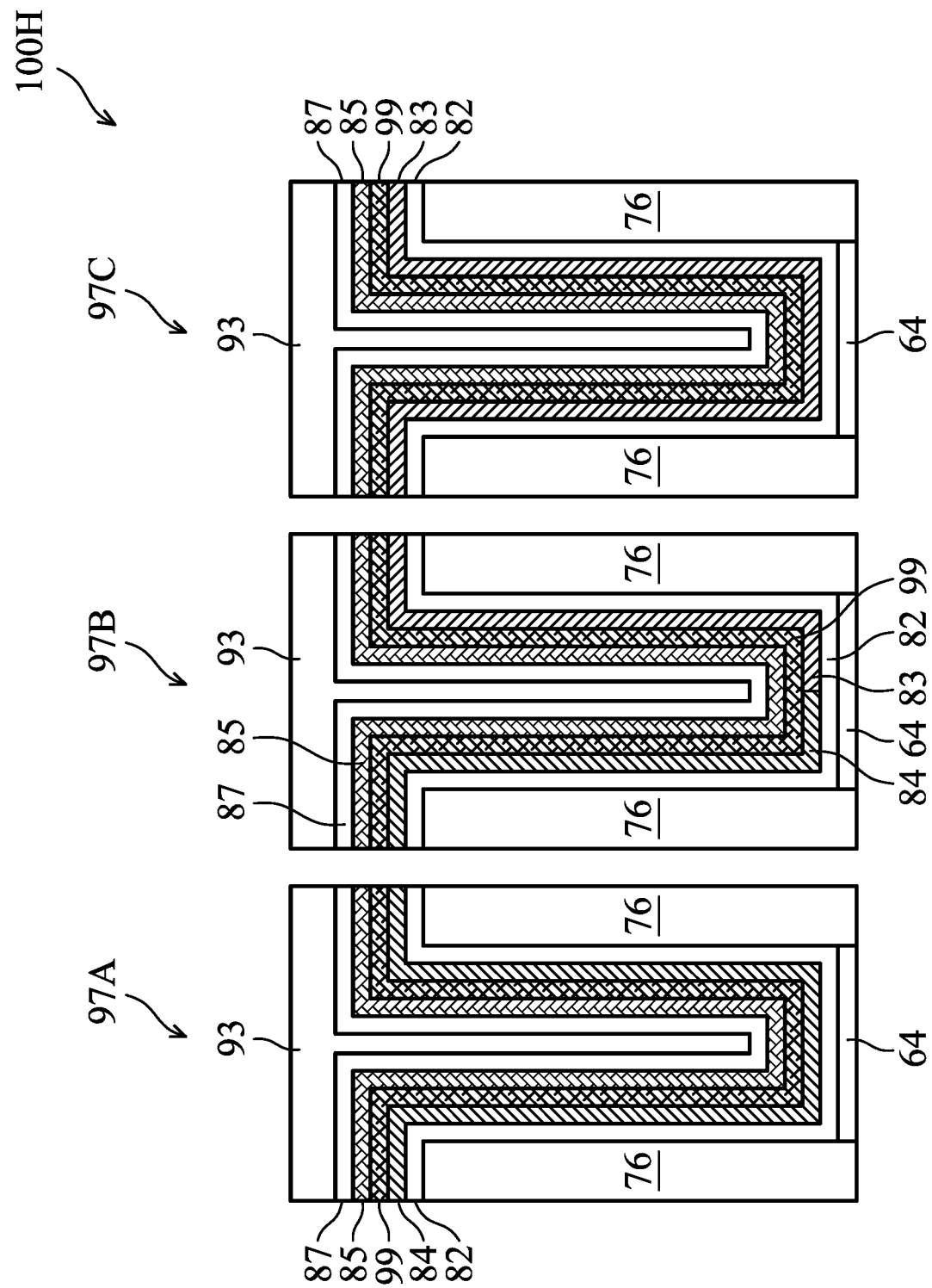

FIGS. 32A and 32B illustrate cross-sectional views of a FinFET device 100H at a stage of fabrication along different cross-sections, in an embodiment. The embodiment of FIG. 32A is similar to that of FIG. 18. FIG. 32B illustrates an embodiment cross-sectional view of the gate trench of the FinFET device of FIG. 32A. In FIGS. 32A and 32B, a P-type work function layer 99 is conformally formed over the P-type work function layers 83/84 before the N-type work function layer 85 is formed. The P-type work function layer 99 is formed of a titanium-containing material such as titanium or titanium nitride by a suitable formation method, such as CVD or ALD, in some embodiments. A thickness of the P-type work function layer 99 is between about 10 angstroms and about 30 angstroms.

FIGS. 33-46 illustrate various views of a FinFET device 200 at various stages of fabrication, in accordance with an embodiment. Each of the FIGS. 33-45 illustrates three cross-sectional views showing three gate trenches 69 (e.g., 69A, 69B, and 69C) and/or the metal gates 97 (e.g., 97A, 97B, and 97C) formed in the gate trenches, where the three cross-sectional views correspond to cross-sections of gate trenches in a same fin, such as along cross-sections D3-D3, D2-D2, and D-D in FIG. 7B in an embodiment. However, depending on the design of the FinFET device 200, the three cross-sectional views in each of FIGS. 33-45 may alternatively correspond to cross-sections of gate trenches in different fins (e.g., 64A, 64B, and 64C), such as along cross-sections D-D, E-E, and F-F in FIG. 7B. The discussion below uses the example where the three cross-sectional views correspond to cross-sections of gate trenches in a same fin (e.g., 64A) along cross-sections D3-D3, D2-D2, and D-D. Note that for simplicity, only portions of the FinFET device 200 around the gate trenches are illustrated, and certain features (e.g., the gate spacers 76) are simplified in the figures. FIG. 46 illustrates the cross-sectional views of the metal gates 97 in FIG. 45, but along cross-section B-B.

Figure 33:
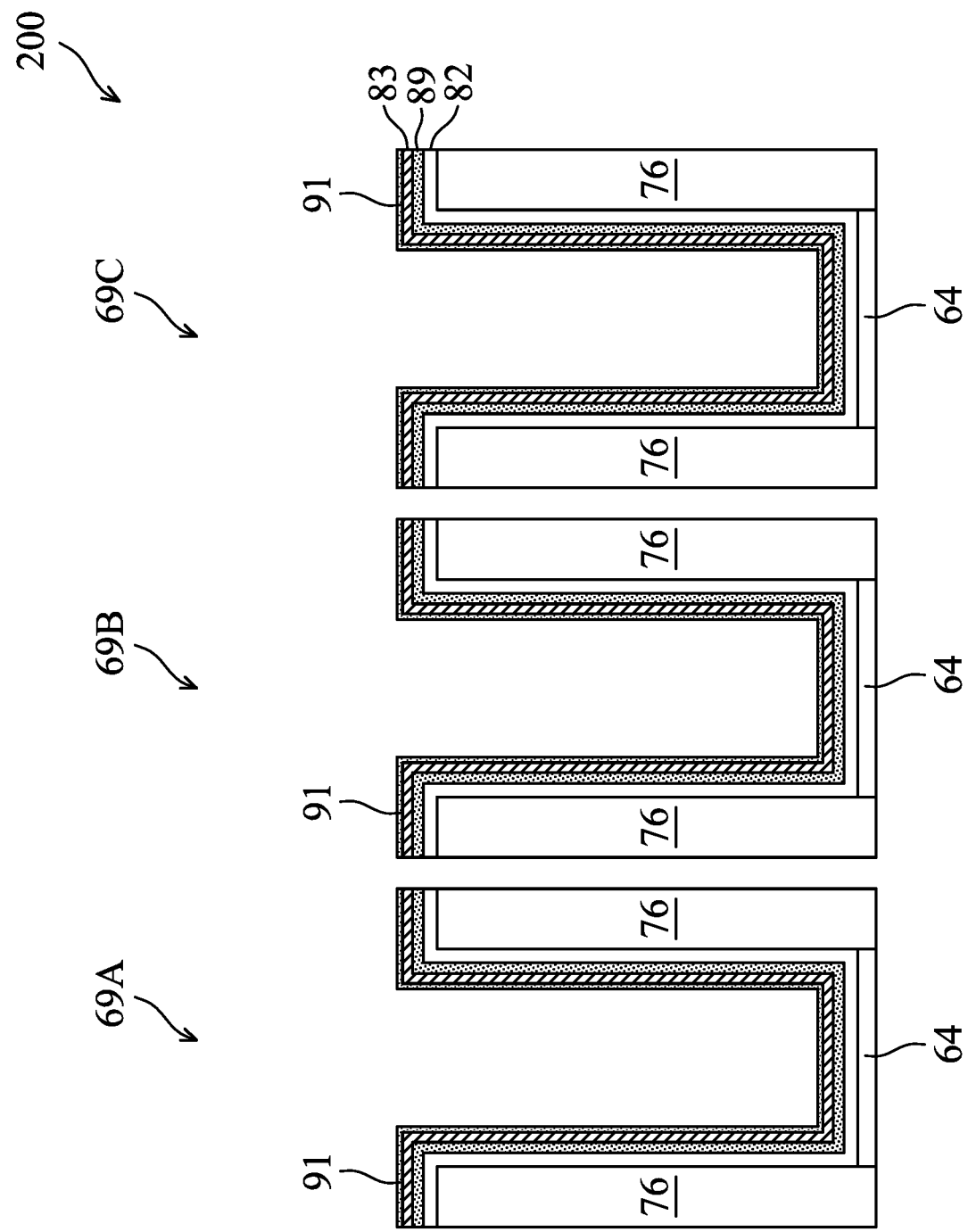
FIGS. 33-46 illustrate various views of a FinFET device at various stages of fabrication, in accordance with an embodiment.

Referring now to FIG. 33, gate trenches 69A, 69B, and 69C are formed in the fin 64 between respective gate spacers 76. The gate trenches 69A, 69B, and 69C may be formed following the same or similar processing illustrated in, e.g., FIGS. 2-6, 7A, 8, and 9. Next, the gate dielectric layer 82, the layer 89, the P-type work function layer 83, and the capping layer 91 are successive formed (e.g., conformally formed) in the gate trenches 69A, 69B, and 69C, over the upper surface of the gate spacers 76, and over the upper surface of the first ILD 90 (not illustrated in FIG. 33, see e.g., FIG. 9). The materials and the formation methods of the various layers (e.g., 82, 89, 83, and 91) are the same or similar to those discussed above, thus details are not repeated.

Figure 34:
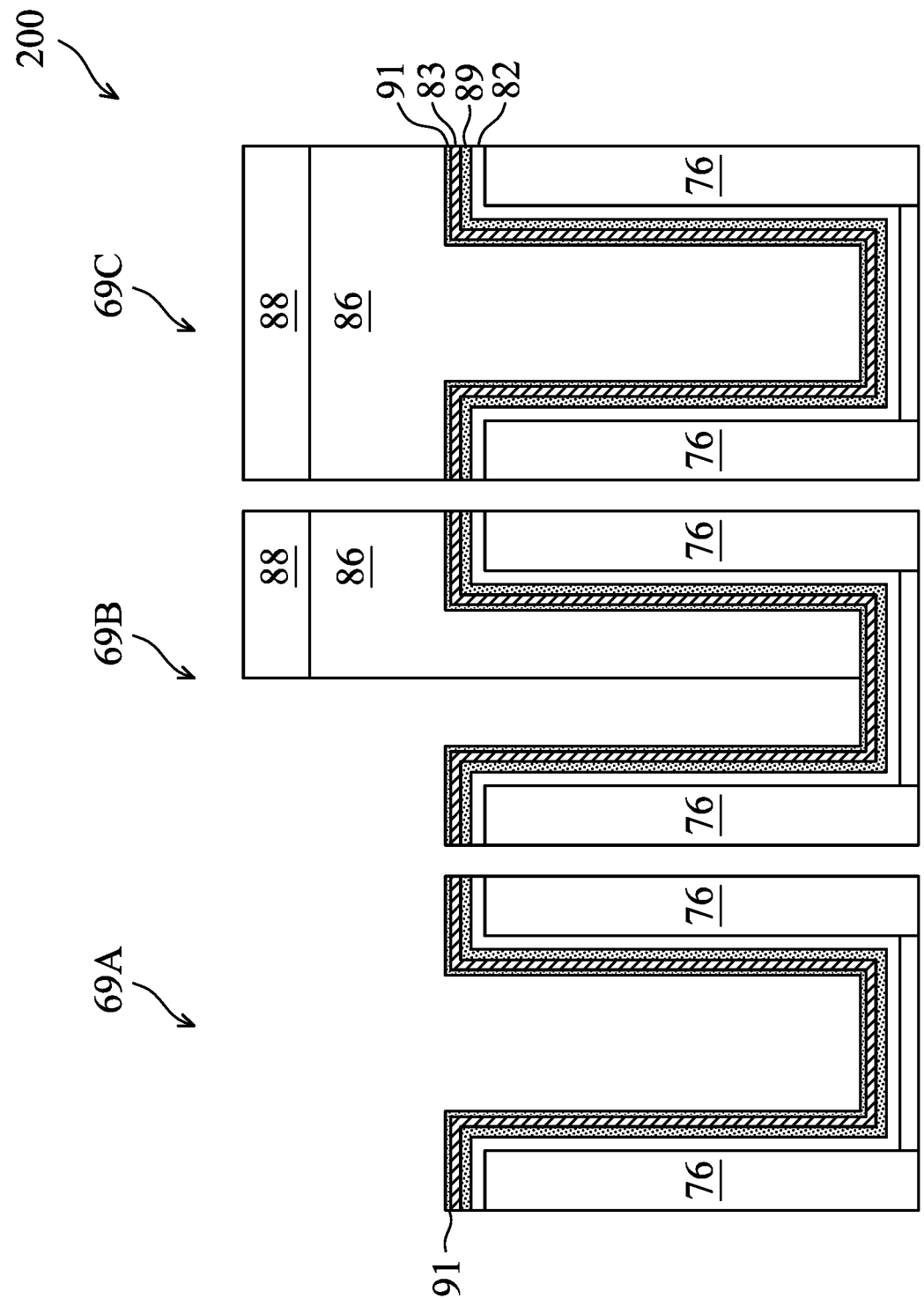

Next, in FIG. 34, the photoresist, which includes the BARC layer 86 and the top photoresist 88 are formed over the FinFET device 200 of FIG. 33. After being formed, the top photoresist 88 is patterned, and the pattern of the top photoresist 88 is transferred to the BARC layer 86 by an anisotropic etching process, such as a plasma etching process. After the anisotropic etching process, portions of the capping layer 91 (e.g., portions in the gate trench 69A, and portions along a left sidewall and a left bottom portion of the gate trench 69B) are exposed.

Figure 35:
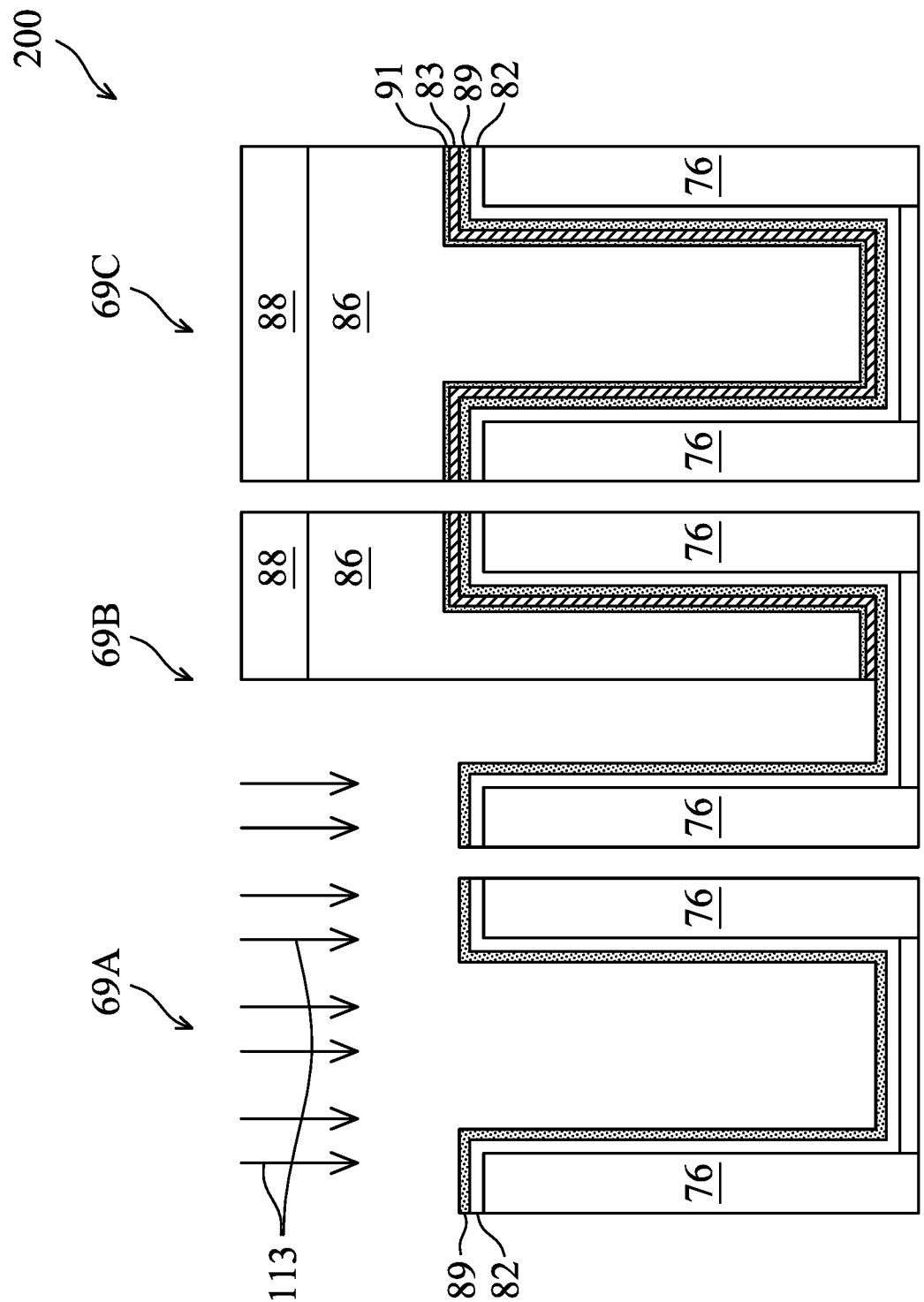

Next, in FIG. 35, a wet etch process 113 is performed to selectively remove the exposed portions of the capping layer 91 and portions of the P-type work function layer 83 directly under the exposed portion of the capping layer 91. In some embodiments, the wet etch process 113 uses the etching chemical W2, details of which are discussed above, thus are not repeated here. Due to the etching selectivity of the etching process, the wet etch process 113 removes portions of the capping layer 91 and portions of the P-type work function layer 83 without substantially attacking the underlying layer 89.

Figure 36:
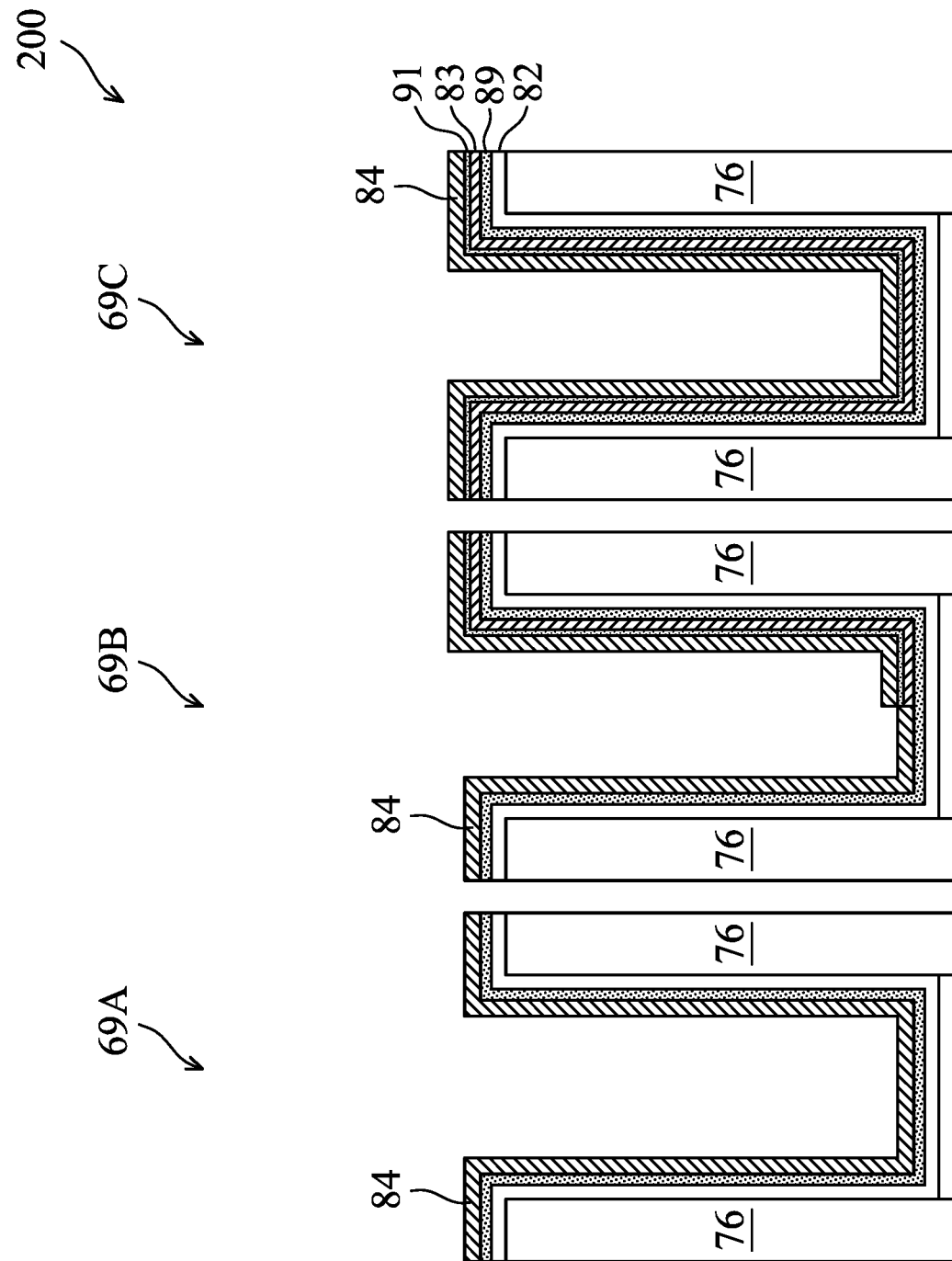

Next, in FIG. 36, the photoresist (e.g., 86, 88) is removed, and the P-type work function layer 84 is conformally formed in the gate trenches 69A, 69B, and 69C. The P-type work function layer 84 physically contacts the upper surface of the layer 89 and the upper surface of the capping layer 91, as illustrated in FIG. 36.

Figure 37:
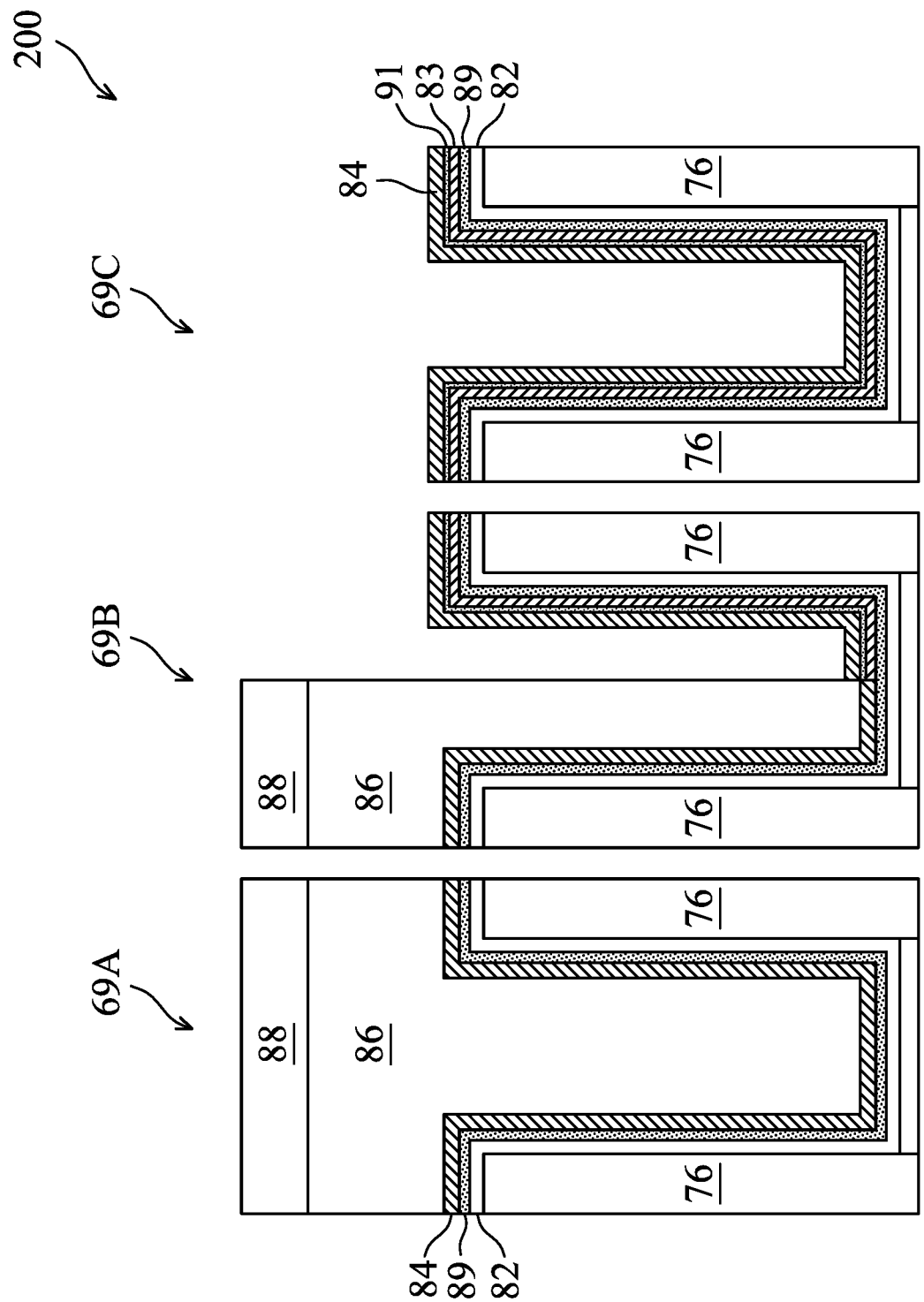

Next, in FIG. 37, a patterned photoresist, which includes the BARC layer 86 and the top photoresist 88 are formed over the FinFET device 200 of FIG. 36. The top photoresist 88 may be patterned using photolithography and etching techniques. Next, the pattern of the top photoresist 88 is transferred to the BARC layer 86 by an anisotropic etching process, such as a plasma etching process. After the anisotropic etching process, portions of the P-type work function layer 84 disposed over the capping layer 91 are exposed.

Figure 38:
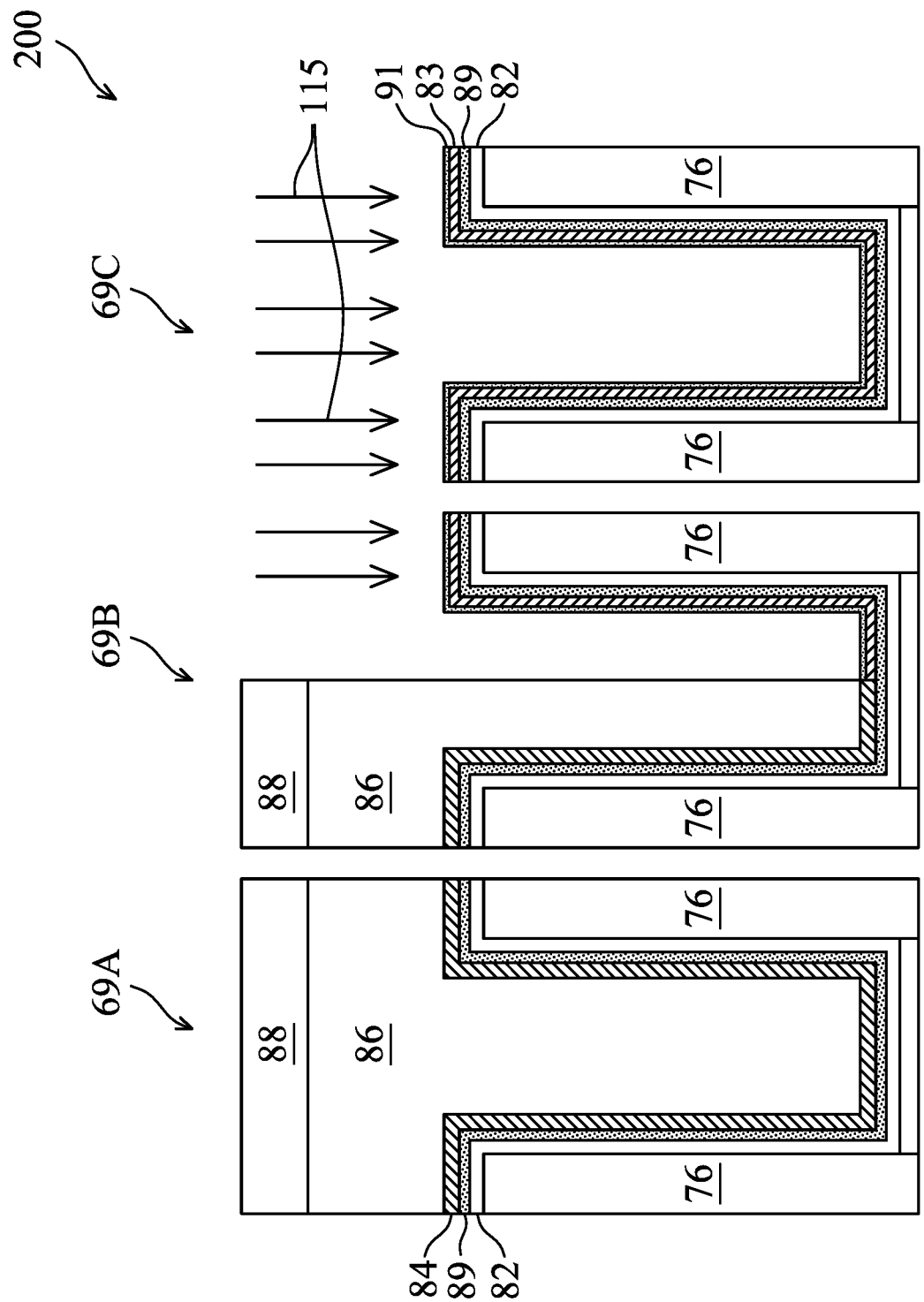

Next, in FIG. 38, a wet etch process 115 is performed to selectively remove the exposed portions of the P-type work function layer 84. In some embodiments, the wet etch process 115 uses the etching chemical W1, details of which are discussed above, thus are not repeated here. Due to the etching selectivity of the etching process, the wet etch process 115 removes the exposed portions of the P-type work function layer 84 without substantially attacking the underlying capping layer 91.

Figure 39:
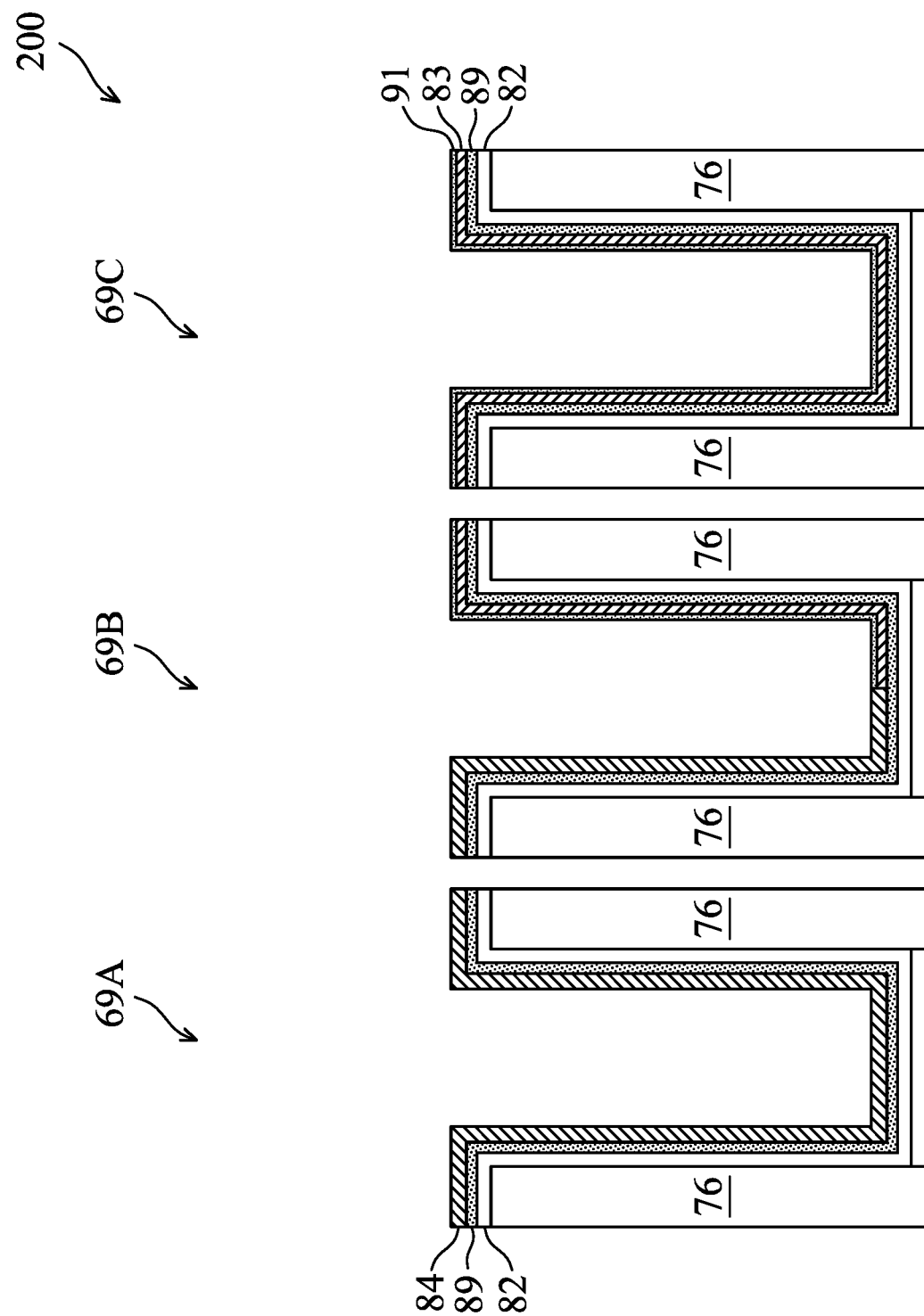

Next, in FIG. 39, the photoresist (e.g., 86, 88) is removed using a suitable method, such as ashing, etching, CMP, the like, or combinations thereof. After the photoresist is removed, the P-type work function layer 84 and the capping layer 91 are exposed.

Figure 40:
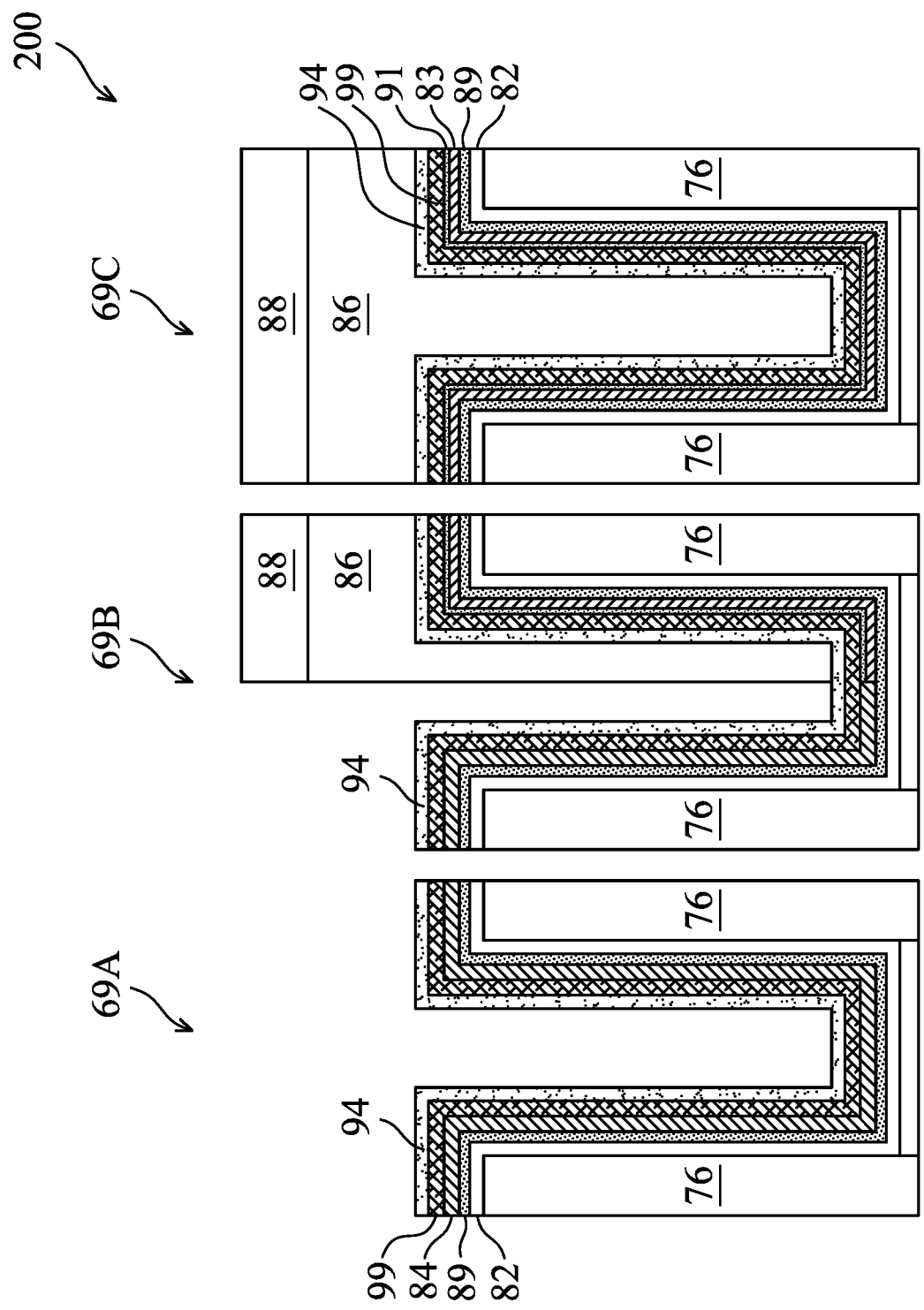

Next, in FIG. 40, the P-type work function layer 99 and an N-type work function layer 94 are formed (e.g., conformally) successively in the gate trenches 69 over (e.g., in physical contact with) the P-type work function layer 84 and over the capping layer 91. The N-type work function layer 94 is formed of an aluminum-containing materials such as, aluminum, aluminum carbide, or aluminum nitride, and is formed by a suitable method such as CVD, PVD, ALD, the like, or combinations thereof, in some embodiments. Note that compared with the N-type work function layer 85, the ratio (e.g., atomic ratio) of aluminum (Al) in the N-type work function layer 94 is different from that of the N-type work function layer 85, which allows for tuning of threshold voltages for different transistors of the FinFET device 200 formed.

After the N-type work function layer 94 is formed, a patterned photoresist, which includes the BARC layer 86 and the top photoresist 88, is formed over the N-type work function layer 94. Next, the pattern of the top photoresist 88 is transferred to the BARC layer 86 by an anisotropic etching process, such as a plasma etching process. After the anisotropic etching process, portions of the N-type work function layer 94 (e.g., portions in the gate trenches 69A, and portions along a left sidewall and a left bottom portion of the gate trench 69B) are exposed.

Figure 41:
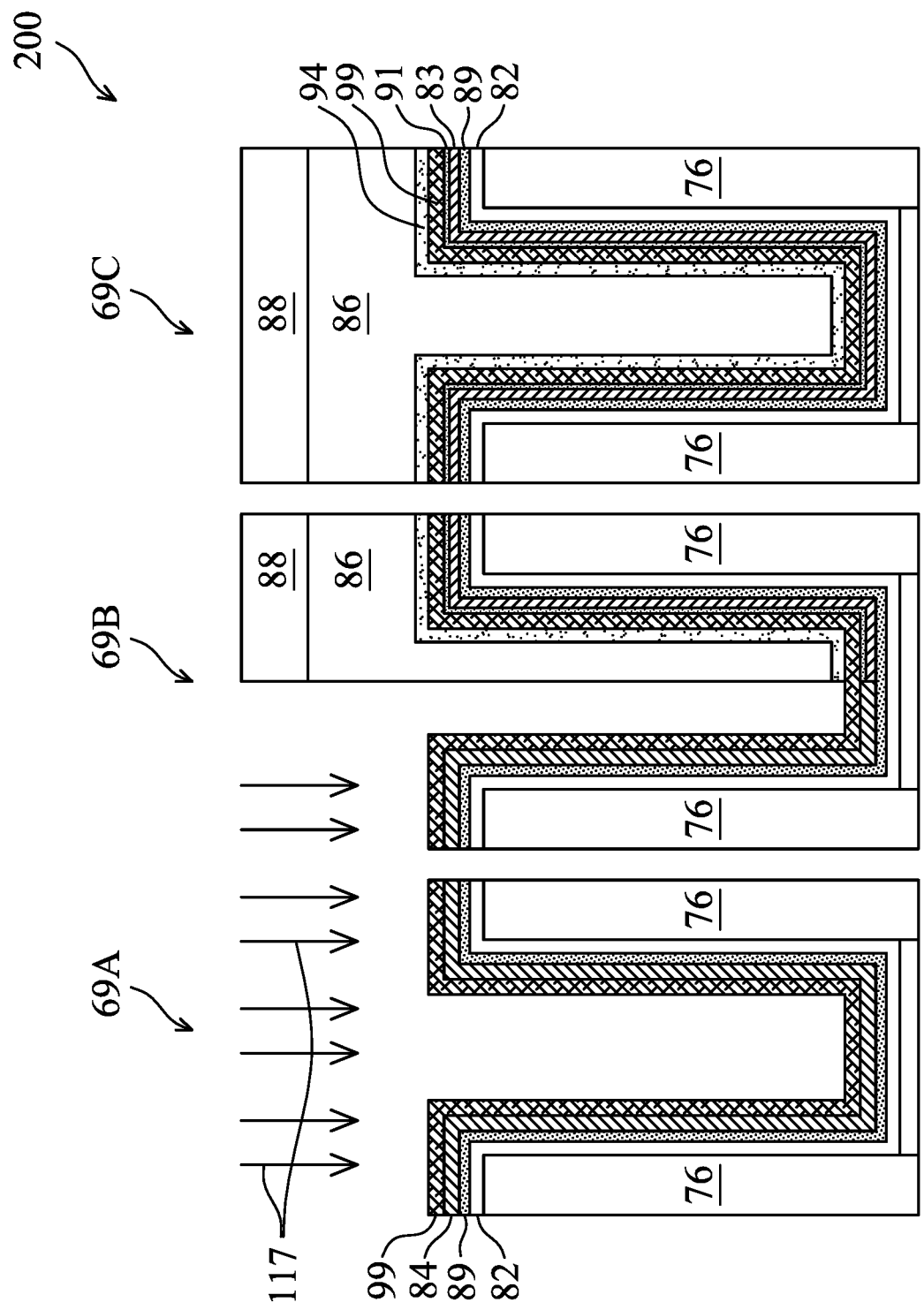

Next, in FIG. 41, a wet etch process 117 is performed to selectively remove the exposed portions of the N-type work function layer 94. In some embodiments, the wet etch process 117 uses a fourth etching chemical W4 that is selective to the N-type work function layer 94. In some embodiments, the fourth etching chemical W4 includes an etchant and an oxidizer. In an embodiment, the etchant is an acid, such as hydrogen chloride (HCl), phosphoric acid ($H_3PO_4$), hydrogen carbonate, or the like. The oxidizer used in the fourth etching chemical W4 may be, e.g., ozone ($O_3$). In some embodiments, the etchant (e.g., an acid) and the oxidizer are mixed in an aqueous solution, such as in DIW, to form the fourth etching chemical W4. A concentration (e.g., volume concentration) of the etchant and the oxidizer in the fourth etching chemical W4 is higher than about 1%, such as between about 1% and about 10%. The wet etching process 117 may be performed at room temperature, and for a duration between about 1 minute and about 5 minutes. Due to the etching selectivity of the wet etching process 117, the exposed portions of the N-type work function layer 94 are removed without substantially attacking the underlying P-type work function layer 99.

Figure 42:
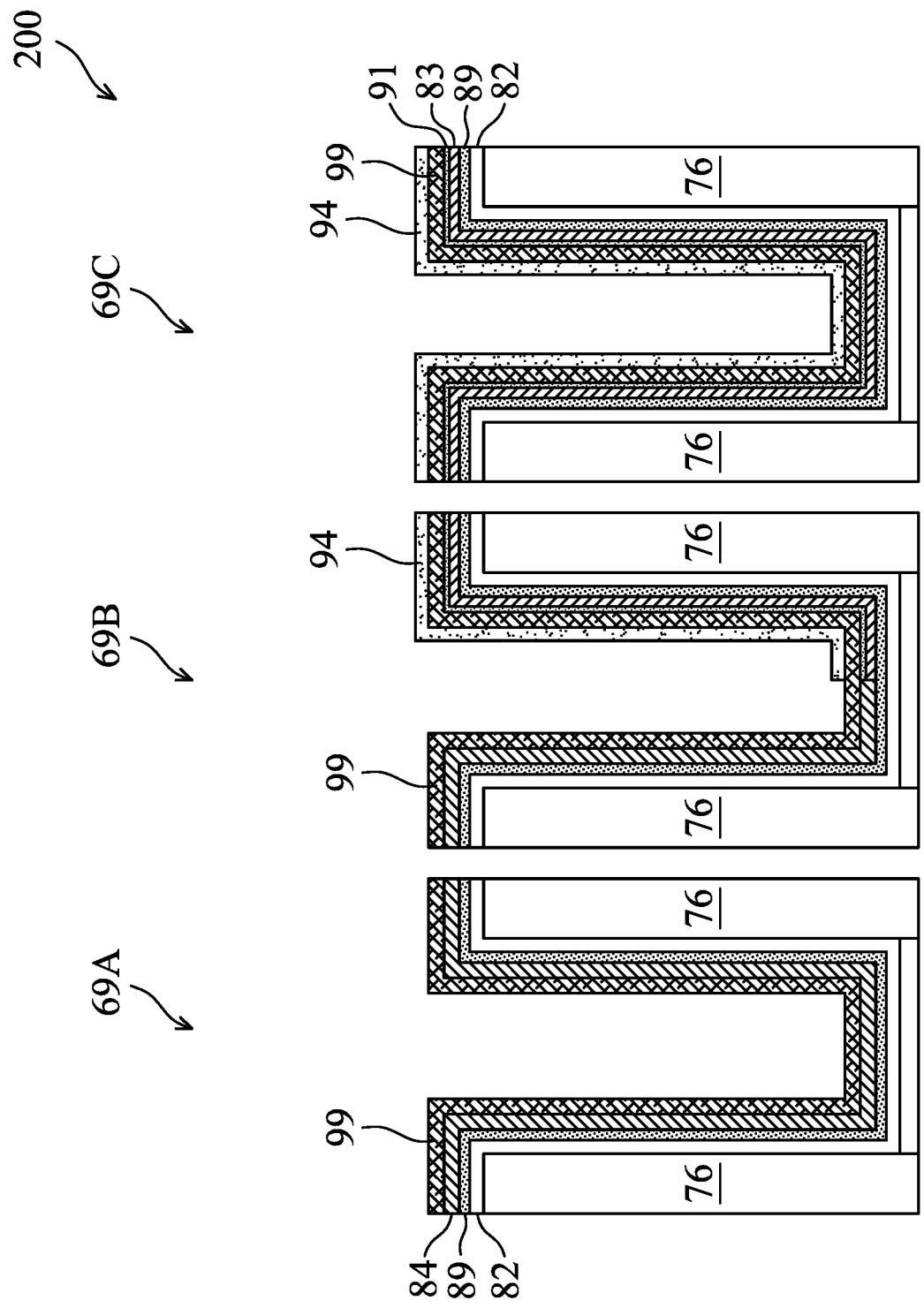

Next, in FIG. 42, the photoresist (e.g., 86, 88) is removed using a suitable method, such as ashing, etching, CMP, the like, or combinations thereof. After the photoresist is removed, the P-type work function layer 99 and the N-type work function layer 94 are exposed.

Figure 43:
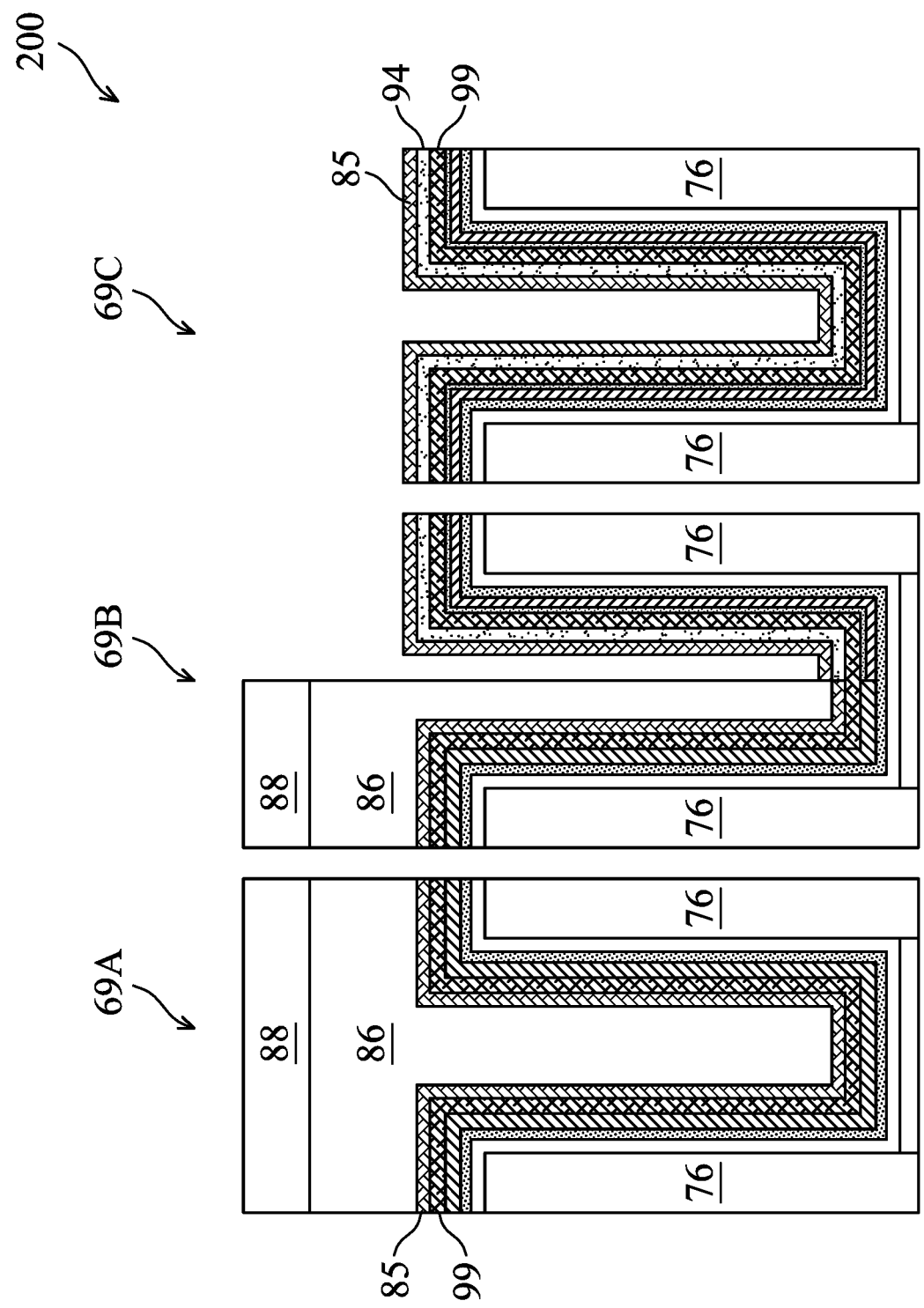

Next, in FIG. 43, the N-type work function layer 85 is conformally formed in the gate trenches 69, e.g., over and contacting the P-type work function layer 99 and the N-type work function layer 94. Next, a patterned photoresist, which includes the BARC layer 86 and the top photoresist 88, is formed over the N-type work function layer 85. The top photoresist 88 may be patterned using photolithography and etching techniques. The pattern of the top photoresist 88 is then transferred to the BARC layer 86 by an anisotropic etching process, such as a plasma etching process. After the anisotropic etching process, portions of the N-type work function layer 85 disposed over the N-type work function layer 94 are exposed.

Figure 44:
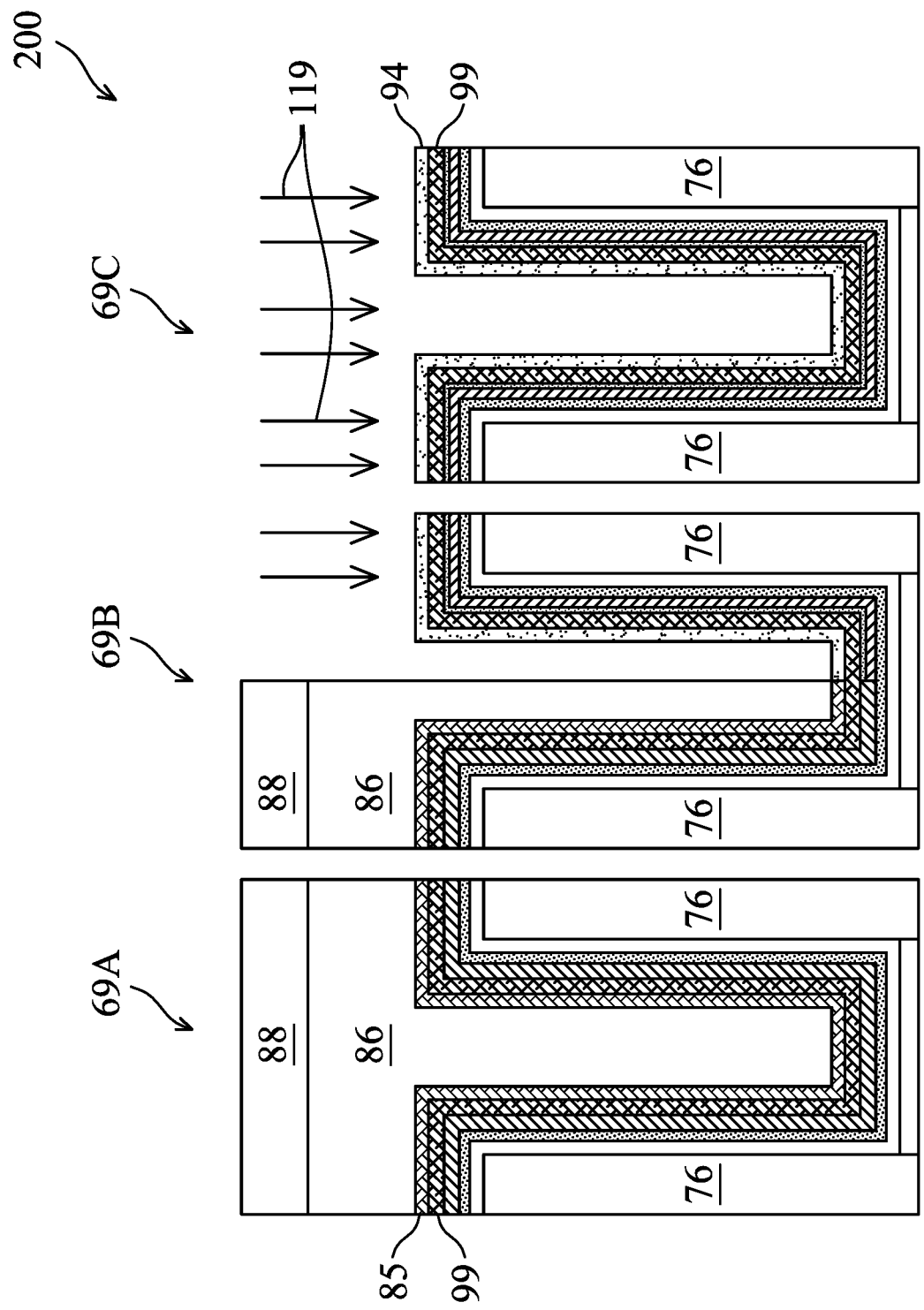

Next, in FIG. 44, a wet etch process 119 is performed to selectively remove the exposed portions of the N-type work function layer 85. In some embodiments, the wet etch process 119 uses a third etching chemical W3 that is selective to the N-type work function layer 85. In some embodiments, the third etching chemical W3 includes an etchant and an oxidizer. In an embodiment, the etchant is an acid, such as hydrogen chloride (HCl), phosphoric acid ($H_3PO_4$), or the like. In another embodiment, the etchant is a base, such as ammonium hydroxide ($NH_4OH$). The oxidizer used in the third etching chemical W3 may be, e.g., hydrogen peroxide ($H_2O_2$). In some embodiments, the etchant (e.g., a base, or an acid) and the oxidizer are mixed in an aqueous solution, such as in DIW, to form the third etching chemical W3. A concentration (e.g., volume concentration) of the etchant and the oxidizer in the third etching chemical W3 is higher than about 1%, such as between about 1% and about 10%. The wet etching process 119 may be performed at a temperature between about 40° C. and about 70° C., and for a duration between about 1 minute and about 5 minutes. Due to the etching selectivity of the wet etching process 119, the exposed portions of the N-type work function layer 85 are removed without substantially attacking the underlying N-type work function layer 94.

Figure 45:
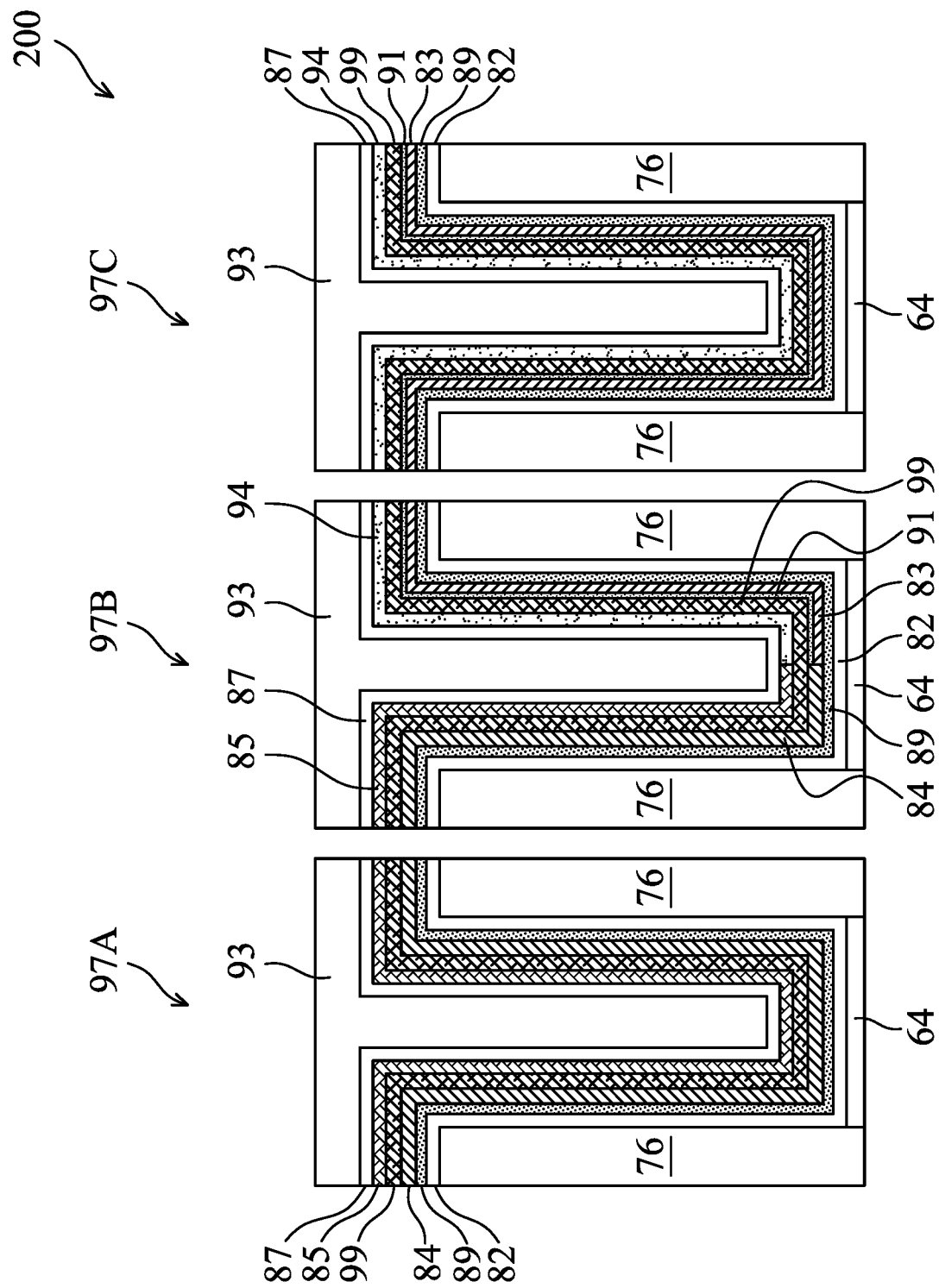
Figure 46:
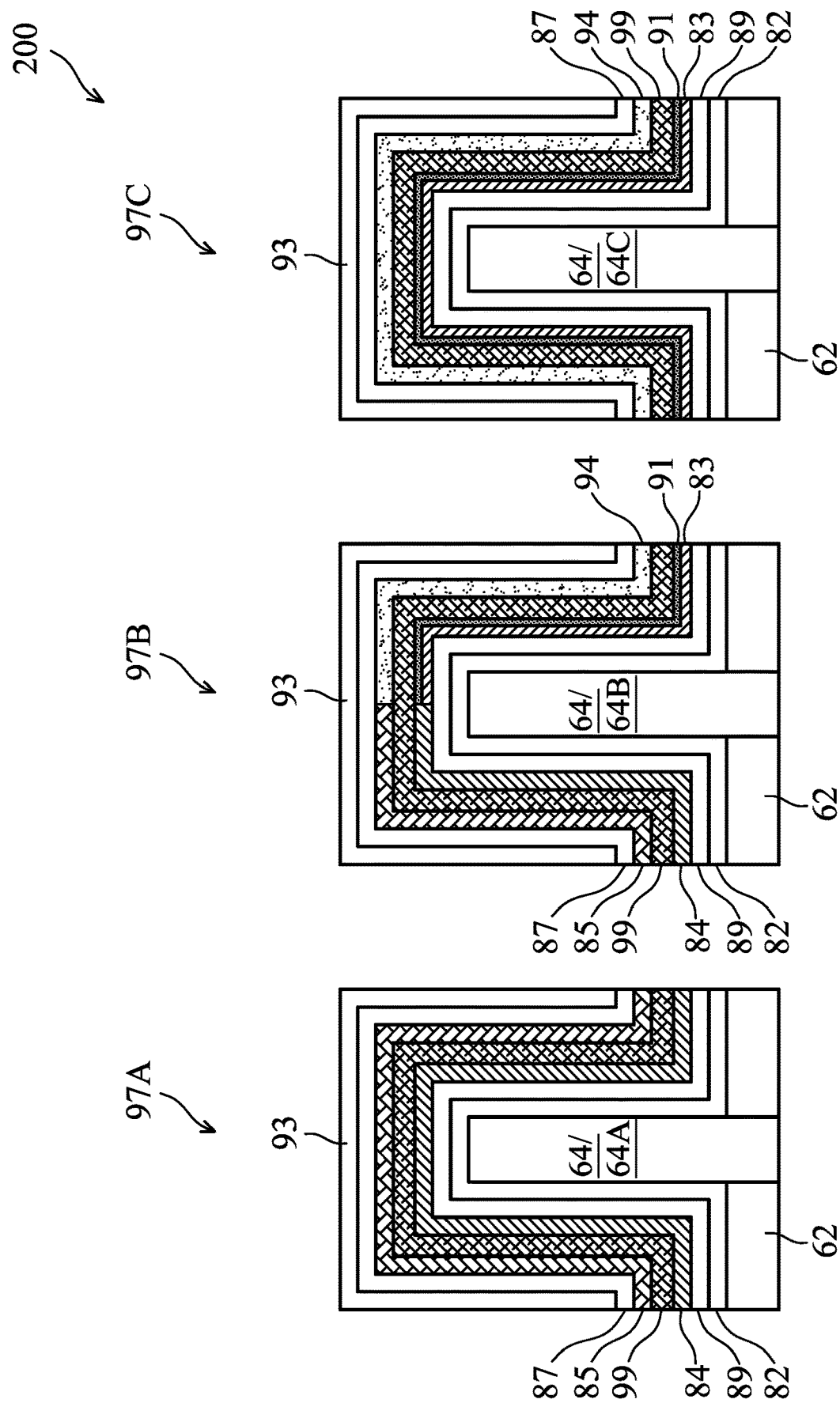

Next, in FIG. 45, the photoresist (e.g., 86, 88) is removed. The glue layer 87 is conformally formed in the gate trenches 69. Next, the electrically conductive material 93 is formed to fill the remaining portions of the gate trenches 69. Various layers in the gate trenches 69A, 69B, and 69C form the metal gate 97A, 97B, and 97C, respectively.

FIG. 46 illustrates the cross-sectional views of the metal gates 97A, 97B, and 97C in FIG. 45, but along cross-section B-B. As illustrated in FIGS. 45 and 46, the metal gates 97A, 97B, and 97C have different structures (e.g., different work function layers). For example, the metal gate 97A has a first work function layer stack which includes the P-type work function layer 89, the P-type work function layer 84, the P-type work function layer 99, and the N-type work function layer 85. The metal gate 97C has a second work function layer stack which includes the P-type work function layer 89, the P-type work function layer 83 (with the capping layer 91 on top), the P-type work function layer 99, and the N-type work function layer 94. The metal gate 97B has a third work function layer stack which is a mixture of the first work function layer stack and the second work function layer stack. In particular, a first half (e.g., the left half) of the third work function layer stack is the same as the first work function layer stack, and a second half (e.g., the right half) of the third work function layer stack is the same as the second work function layer stack. Therefore, the metal gate 97B is also referred to as having a hybrid work function layer stack. Additional processing may be performed after the processing illustrated in FIGS. 45 and 46, such as forming the second ILD 92 and forming contact plugs 102. Details are not discussed herein.

Variations to the disclose embodiments are possible and are fully intended to be included within the scope of the disclosure. For example, the number of fins and/or the number of gate structures in the FinFET device may be changed from the illustrated examples without departing from the spirit of the disclosure. As another example, although the gate trenches 69 (e.g., 69A, 69B, 69C) are illustrated as being disposed in a same fin along a same cross-section, each of the gate trenches 69 may be disposed in a different fin and along a different cross-section, depending on the design of the FinFET device. As yet another example, the P-type work function layers in the different embodiment FinFET devices may be changed to N-type work function layers, and vice versa, to form FinFET device with different work function layer stacks.

Figure 47:
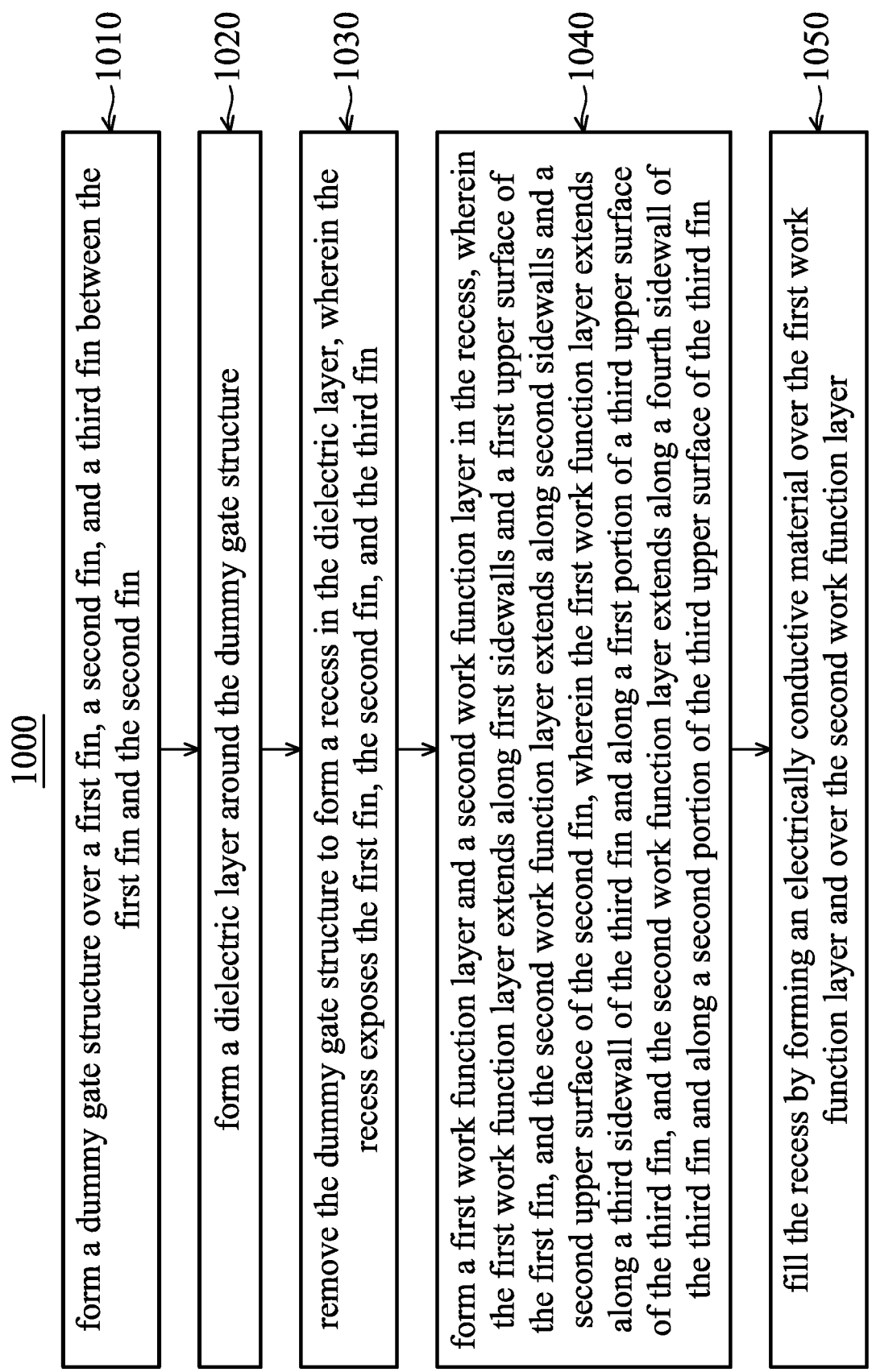
FIG. 47 illustrates a flow chart of method of making a semiconductor device, in accordance with some embodiments.

FIG. 47 illustrates a flow chart of a method of fabricating a semiconductor structure, in accordance with some embodiments. It should be understood that the embodiment method shown in FIG. 47 is merely an example of many possible embodiment methods. One of ordinary skill in the art would recognize many variations, alternatives, and modifications. For example, various steps as illustrated in FIG. 47 may be added, removed, replaced, rearranged and repeated Referring to FIG. 47, at step 1010, a dummy gate structure is formed over a first fin, a second fin, and a third fin between the first fin and the second fin. At step 1020, a dielectric layer is formed around the dummy gate structure. At step 1030, the dummy gate structure is removed to form a recess in the dielectric layer, wherein the recess exposes the first fin, the second fin, and the third fin. At step 1040, a first work function layer and a second work function layer are formed in the recess, wherein the first work function layer extends along first sidewalls and a first upper surface of the first fin, and the second work function layer extends along second sidewalls and a second upper surface of the second fin, wherein the first work function layer extends along a third sidewall of the third fin and along a first portion of a third upper surface of the third fin, and the second work function layer extends along a fourth sidewall of the third fin and along a second portion of the third upper surface of the third fin. At step 1050, the recess is filled by forming an electrically conductive material over the first work function layer and over the second work function layer.

Embodiments may achieve advantages. The various wet etch processes and the etching chemicals (e.g., W1, W2, W3, and W4) disclosed herein achieve precise control and excellent etch selectivity for the etching processes. For example, the wet etch process 81 (see FIG. 12) selectively removes exposed P-type work function layer 84 without attacking the underlying gate dielectric layer 82, and the wet etch process 111 (see FIG. 16) selectively removes exposed P-type work function layer 83 without attacking the underlying P-type work function layer 84. This allows the work function metals of each metal gate to be formed and tuned independently. The increased flexibility in choosing the materials of the work function layers, together with the choice of different thicknesses for the different layers, allows semiconductor device with different threshold voltages (for different transistors) to be formed. The disclosed methods also allow for the removal and deposition of different layers in narrow gate trenches, which is important for advanced processing nodes since the size of the gate trenches are shrinking in advanced processing nodes. Furthermore, the disclosed methods allow for formation of three different work function layers using two work function metals, which is illustrated by, e.g., FIG. 17, where the fin 68B has a mixture of two different work function metals (e.g., 84, 83) to form a hybrid work function metal.

In an embodiment, a method of forming a semiconductor device includes forming a dummy gate structure over a first fin, a second fin, and a third fin between the first fin and the second fin; forming a dielectric layer around the dummy gate structure; removing the dummy gate structure to form a recess in the dielectric layer, wherein the recess exposes the first fin, the second fin, and the third fin; forming a first work function layer and a second work function layer in the recess, wherein the first work function layer extends along first sidewalls and a first upper surface of the first fin, and the second work function layer extends along second sidewalls and a second upper surface of the second fin, wherein the first work function layer extends along a third sidewall of the third fin and along a first portion of a third upper surface of the third fin, and the second work function layer extends along a fourth sidewall of the third fin and along a second portion of the third upper surface of the third fin; and filling the recess by forming an electrically conductive material over the first work function layer and over the second work function layer. In an embodiment, the first work function layer and the second work function layer are N-type work function layers or P-type work function layers, wherein the first work function layer and the second work function layer are formed of different materials. In an embodiment, the method further includes, before filling the recess, forming a third work function layer in the recess over the first work function layer and over the second work function layer. In an embodiment, the third work function layer is a different type of work function layer from the first work function layer and the second work function layer. In an embodiment, the first work function layer, the second work function layer, and the third work function layer are of a same type of work function layer. In an embodiment, the method further includes, before forming the first work function layer and the second work function layer, conformally forming a layer in the recess over the first fin, the second fin, and the third fin, wherein the first work function layer extends along and contacts an upper surface of the layer, wherein the second work function layer extends along and contacts the upper surface of the layer. In an embodiment, the layer is a gate dielectric layer. In an embodiment, the layer is a third work function layer. In an embodiment, the first work function layer, the second work function layer, and the third work function layer are of a same N-type or P-type work function layer, wherein at least the first work function layer and the second work function layer are formed of different materials. In an embodiment, wherein forming the first work function layer and the second work function layer includes: forming the first work function layer in the recess over the first fin, the second fin, and the third fin; forming a first patterned mask layer over the first work function layer, the first patterned mask layer exposing first portions of the first work function layer that are disposed over the second fin and over the second portion of the third upper surface of the third fin; selectively removing the exposed first portions of the first work function layer using a first etching process; and removing the first patterned mask layer after the first etching process. In an embodiment, the first etching process is a first wet etch process. In an embodiment, forming the first work function layer and the second work function layer further includes: after removing the first patterned mask layer, forming the second work function layer in the recess over the first fin, the second fin, and the third fin; forming a second patterned mask layer over the second work function layer, the second patterned mask layer exposing second portions of the second work function layer that are disposed over the first fin and over the first portion of the third upper surface of the third fin; selectively removing the exposed second portions of the second work function layer using a second etching process; and removing the second patterned mask layer after the second etching process. In an embodiment, the second etching process is a second wet etch process.

In an embodiment, a method of forming a semiconductor device includes forming a fin protruding above a substrate; forming dummy gate structures over the fin; surrounding the dummy gate structures with a dielectric layer; and replacing the dummy gate structures with metal gates, wherein the replacing includes: removing the dummy gate structures to form a first gate trench, a second gate trench, and a third gate trench in the dielectric layer, wherein the third gate trench is between the first gate trench and the second gate trench; forming a first work function layer along sidewalls and a bottom of the first gate trench, and along a first sidewall and a first region of a bottom of the third gate trench; forming a second work function layer along sidewalls and a bottom of the second gate trench, and along a second sidewall and a second region of the bottom of the third gate trench, wherein the first work function layer and the second work function layer are of a same type of work function layer; forming a third work function layer in the first gate trench, the second gate trench, and the third gate trench, wherein the third work function layer extends along the first work function layer and the second work function layer; and filling the first gate trench, the second gate trench, and the third gate trench with an electrically conductive material. In an embodiment, the replacing further includes, before the first work function layer and the second work function layer are formed, forming another layer in the first gate trench, the second gate trench, and the third gate trench, wherein the first work function layer and the second work function layer extend along and contact the another layer. In an embodiment, the replacing further includes forming a capping layer on the first work function layer but not on the second work function layer, wherein the capping layer is formed between the first work function layer and the third work function layer. In an embodiment, the method further includes: forming a fourth work function layer and a fifth work function layer over the third work function layer, wherein the third work function layer is between the first work function layer and the fourth work function layer, and between the second work function layer and the fifth work function layer.

In an embodiment, a semiconductor device includes: a first fin, a second fin, and a third fin protruding above a substrate, wherein the third fin is between the first fin and the second fin; a gate dielectric layer over the first fin, the second fin, and the third fin; a first work function layer over and contacting the gate dielectric layer, wherein the first work function layer extends along first sidewalls and a first upper surface of the first fin; a second work function layer over and contacting the gate dielectric layer, wherein the second work function layer extends along second sidewalls and a second upper surface of the second fin, wherein the first work function layer and the second work function layer comprise different materials; and a first gate electrode over the first fin, a second gate electrode over the second fin, and a third gate electrode over the third fin. In an embodiment, the first work function layer extends along a first sidewall of the third fin, and the second work function layer extends along a second sidewall of the third fin opposing the first sidewall of the third fin. In an embodiment, the first work function layer extends along a first portion of an upper surface of the third fin, and the second work function layer extends along a second portion of the upper surface of the third fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first fin, a second fin, and a third fin protruding above a substrate, wherein the third fin is between the first fin and the second fin;
   a gate dielectric layer over the first fin, the second fin, and the third fin;
   a first work function layer over the gate dielectric layer, wherein the first work function layer extends along first sidewalls and a first upper surface of the first fin, and extends along a first sidewall of the third fin and a first portion of an upper surface of the third fin;
   a second work function layer over the gate dielectric layer, wherein the first work function layer and the second work function layer contact and extend along the gate dielectric layer, wherein the second work function layer extends along second sidewalls and a second upper surface of the second fin, and extends along a second opposing sidewall of the third fin and a second portion of the upper surface of the third fin, wherein a first sidewall of the first work function layer contacts and extends along a second sidewall of the second work function layer, wherein the first work function layer and the second work function layer comprise different materials; and
   a first gate electrode over the first fin, a second gate electrode over the second fin, and a third gate electrode over the third fin.

2. The semiconductor device of the claim 1, wherein the first work function layer and the second work function layer are of a same N-type work function layer or of a same P-type work function layer.

3. The semiconductor device of the claim 2, further comprising a barrier layer contacting and extending along the gate dielectric layer, wherein the barrier layer is between the gate dielectric layer and the first work function layer, and is between the gate dielectric layer and the second work function layer.

4. The semiconductor device of the claim 2, further comprising a third work function layer over the first work function layer and over the second work function layer.

5. The semiconductor device of the claim 4, wherein the third work function layer is a different type of work function layer from the first work function layer and the second work function layer.

6. The semiconductor device of the claim 2, further comprising a capping layer contacting and extending along an upper surface of the second work function layer, wherein an upper surface of the first work function layer is exposed by the capping layer.

7. The semiconductor device of the claim 6, wherein the capping layer is a silicon-containing material.

8. The semiconductor device of the claim 6, wherein the first sidewall of the first work function layer contacts and extends along a third sidewall of the capping layer.

9. The semiconductor device of the claim 8, wherein a first thickness of the first work function layer is the same as a sum of a second thickness of the second work function layer and a third thickness of the capping layer.

10. A semiconductor device comprising:
a first fin, a second fin, and a third fin extending parallel to each other, wherein the third fin is between the first fin and the second fin;
isolation regions between the first fin and the third fin, and between the second fin and the third fin;
a gate dielectric layer over the first fin, the second fin, and the third fin;
a first work function layer over the gate dielectric layer, wherein the first work function layer extends along first sidewalls and a first upper surface of the first fin, and extends along a first sidewall of the third fin and an upper surface of the third fin;
a second work function layer over the gate dielectric layer, wherein the second work function layer extends along second sidewalls and a second upper surface of the second fin, and extends along a second sidewall of the third fin and the upper surface of the third fin, wherein the first work function layer and the second work function layer are disposed side-by-side on the upper surface of the third fin and are in contact with each other, wherein the first work function layer and the second work function layer comprise different materials;
a gate electrode material over the first fin, the second fin, and the third fin; and
a capping layer between the second work function layer and the gate electrode material, wherein the capping layer covers a second upper surface of the second work function layer and exposes a first upper surface of the first work function layer.

11. The semiconductor device of claim 10, wherein a first sidewall of the first work function layer contacts and extends along a second sidewall of the second work function layer and a third sidewall of the capping layer.

12. The semiconductor device of claim 11, wherein an upper surface of the capping layer distal from the isolation regions is level with the first upper surface of the first work function layer.

13. The semiconductor device of claim 10, wherein the capping layer is a silicon layer.

14. The semiconductor device of claim 10, further comprising a third work function layer over the capping layer and over the first work function layer, wherein the first work function layer and the second work function layer are of a same P-type or N-type work function material, and the third work function layer is of a different type of work function material from the first work function layer.

15. The semiconductor device of the claim 10, wherein the first work function layer and the second work function layer contact and extend along the gate dielectric layer.

16. A semiconductor device comprising:
a first fin, a second fin, and a third fin extending parallel to each other, wherein the third fin is between the first fin and the second fin;
isolation regions on opposing sides of the third fin, wherein the first fin, the second fin, and the third fin extend above the isolation regions;
a first gate structure over the first fin, wherein the first gate structure comprises a gate dielectric material over the first fin, a first work function material over the gate dielectric material, and a conductive material over the first work function material;
a second gate structure over the second fin, wherein the second gate structure comprises the gate dielectric material over the second fin, a second work function material over the gate dielectric material, and the conductive material over the second work function material; and
a third gate structure over the third fin, wherein the third gate structure comprises the gate dielectric material over the third fin, the first work function material over the gate dielectric material along a first sidewall and an upper surface of the third fin, the second work function material over the gate dielectric material along a second opposing sidewall and the upper surface of the third fin, and the conductive material over the first work function material and over the second work function material, wherein a first sidewall of the first work function material contacts and extends along a second sidewall of the second work function material, wherein the third gate structure further comprises a capping layer contacting and extending along the second work function material, wherein there is no capping layer between the first work function material and the conductive material.

17. The semiconductor device of claim 16, wherein the first sidewall of the first work function material contacts and extends along a sidewall of the capping layer.

18. The semiconductor device of claim 16, wherein the first gate structure further comprises a third work function material between the first work function material and the conductive material, wherein the second gate structure further comprises the third work function material between the second work function material and the conductive material, wherein the third gate structure further comprises the third work function material between the first work function material and the conductive material, and between the capping layer and the conductive material.

19. The semiconductor device of the claim 16, wherein the first work function material and the second work function material contact and extend along the gate dielectric material.

20. The semiconductor device of the claim 16, wherein the capping layer is a layer of silicon.

* * * * *